(12) United States Patent
Hosotani et al.

(10) Patent No.: US 6,958,932 B2
(45) Date of Patent: Oct. 25, 2005

(54) SEMICONDUCTOR INTEGRATED CIRCUIT DEVICE AND METHOD OF MANUFACTURING THE SAME

(75) Inventors: Keiji Hosotani, Tokyo (JP); Yoshiaki Asao, Yokohama (JP); Yoshiaki Saito, Kawasaki (JP); Minoru Amano, Kawasaki (JP); Shigeki Takahashi, Yokohama (JP); Tatsuya Kishi, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 10/199,176

(22) Filed: Jul. 22, 2002

(65) Prior Publication Data
US 2003/0137028 A1 Jul. 24, 2003

(30) Foreign Application Priority Data

Jan. 22, 2002 (JP) .................... 2002-012640
Jun. 25, 2002 (JP) .................... 2002-183983

(51) Int. Cl.[7] ............................................ G11C 17/14
(52) U.S. Cl. .................... 365/171; 365/158; 257/295
(58) Field of Search ................ 365/171, 158, 365/161, 173; 257/295

(56) References Cited

U.S. PATENT DOCUMENTS

| 5,956,267 | A | | 9/1999 | Hurst et al. | |
| 6,174,737 | B1 | * | 1/2001 | Durlam et al. | 438/3 |
| 6,211,090 | B1 | * | 4/2001 | Durlam et al. | 438/692 |
| 6,737,691 | B2 | * | 5/2004 | Asao | 257/295 |
| 6,740,948 | B2 | * | 5/2004 | Sharma et al. | 257/422 |
| 6,759,297 | B1 | * | 7/2004 | Dvorsky et al. | 438/257 |
| 6,770,491 | B2 | * | 8/2004 | Tuttle | 438/3 |
| 6,780,653 | B2 | * | 8/2004 | Nejad et al. | 438/3 |
| 6,780,655 | B2 | * | 8/2004 | Mattson | 438/3 |
| 6,781,174 | B2 | * | 8/2004 | Nejad et al. | 257/295 |
| 6,794,696 | B2 | * | 9/2004 | Fukuzumi | 257/295 |

FOREIGN PATENT DOCUMENTS

| JP | 2001-236781 | 8/2001 |
| JP | 2001-266567 | 9/2001 |
| KR | 2001-0062464 | 7/2001 |

* cited by examiner

*Primary Examiner*—Laura M Schillinger
(74) *Attorney, Agent, or Firm*—Oblon, Spivak, McClelland, Maier & Neustadt, P.C.

(57) ABSTRACT

A semiconductor integrated circuit device includes a cell transistor; a bit line provided above the cell transistor; a magnetoresistive element provided above the bit line, a first end portion of the magnetoresistive element being electrically connected to the bit line; an intracell local interconnection provided above the magnetoresistive element, the intracell local interconnection coupling one of source and drain regions of the cell transistor to a second end portion of the magnetoresistive element; and a write word line provided above the intracell local interconnection, a portion between the write word line and the intracell local interconnection being filled with an insulator alone.

19 Claims, 73 Drawing Sheets

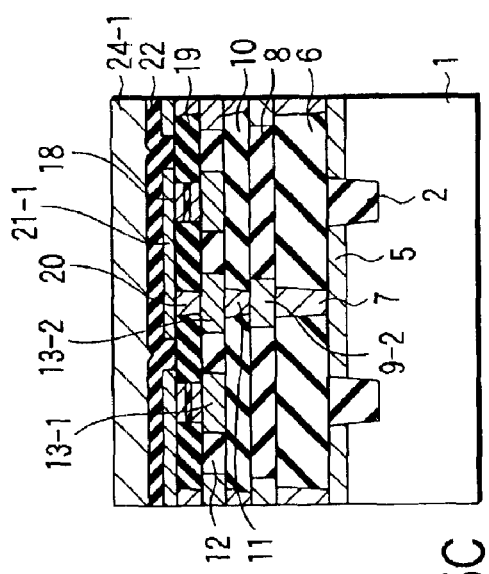
FIG. 15C
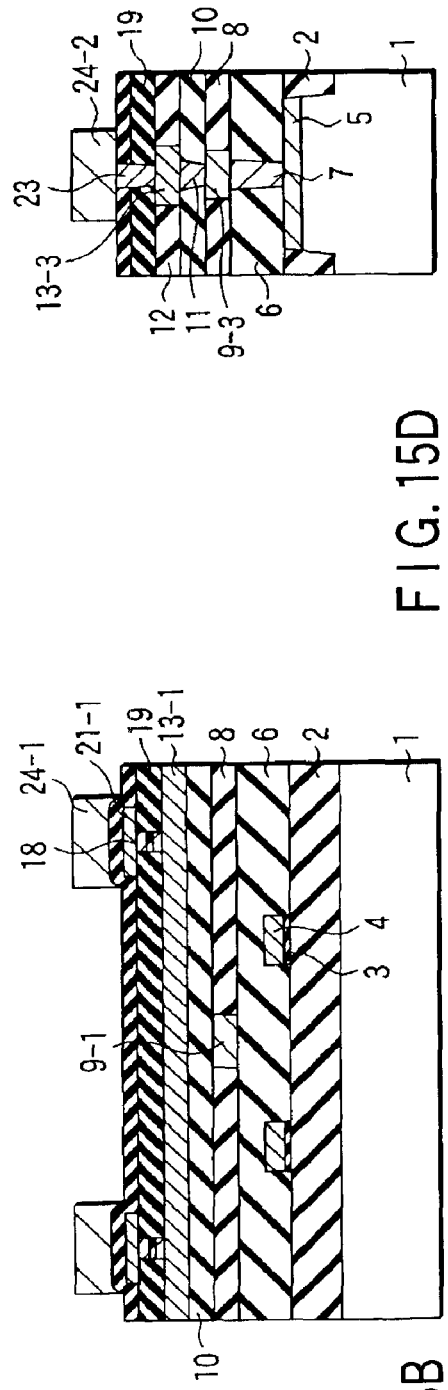
FIG. 15D
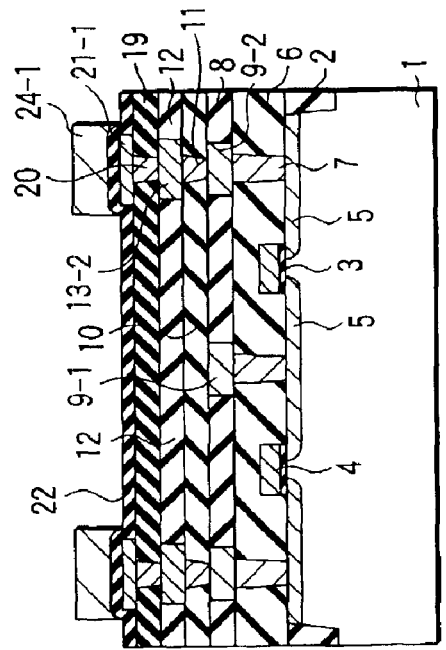
FIG. 15A
FIG. 15B

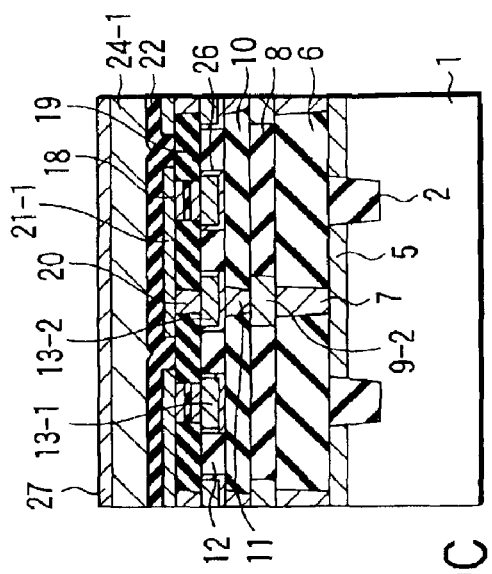
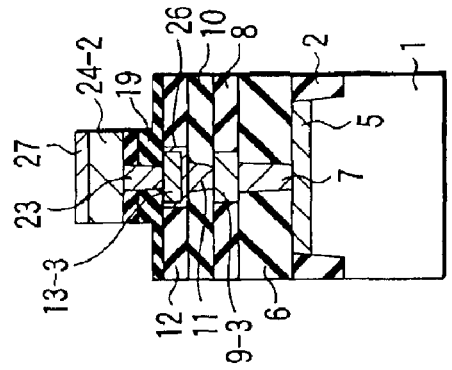
FIG. 29C
FIG. 29D
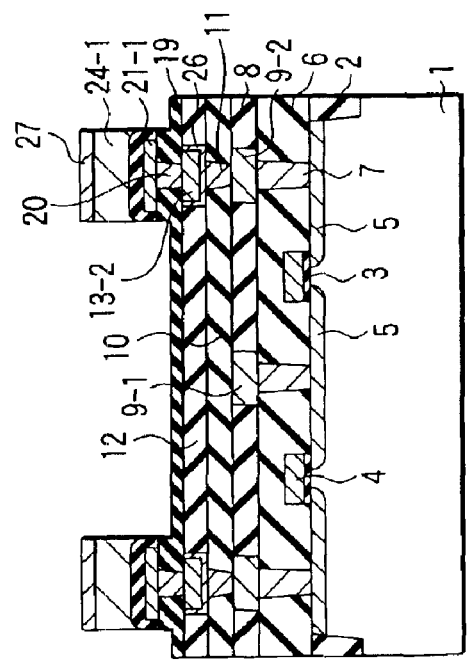
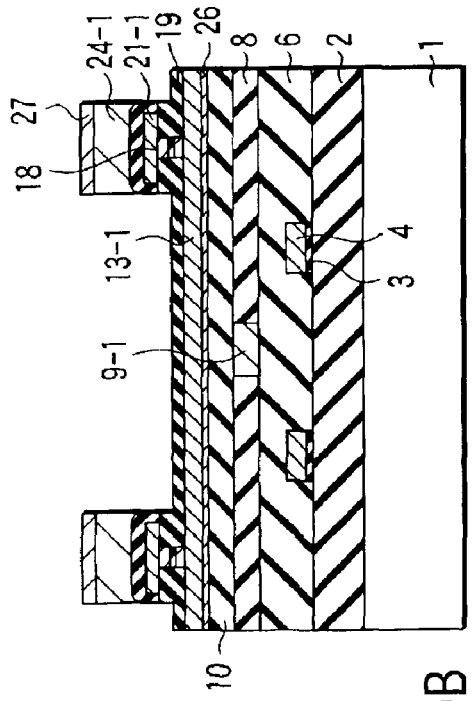
FIG. 29A
FIG. 29B

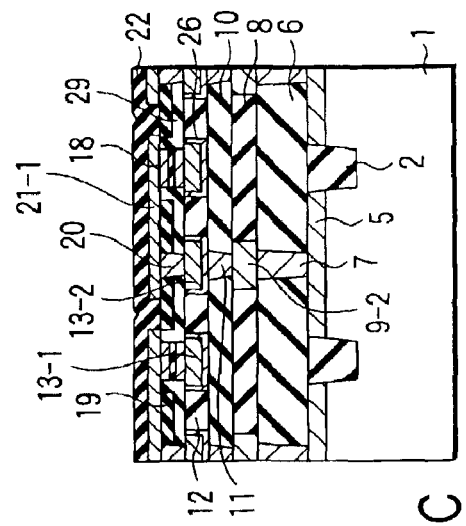
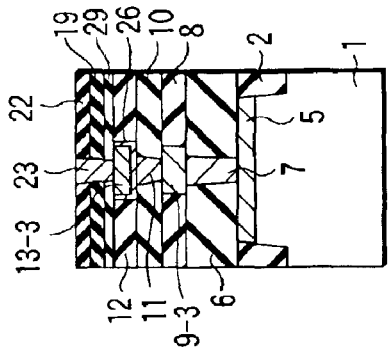
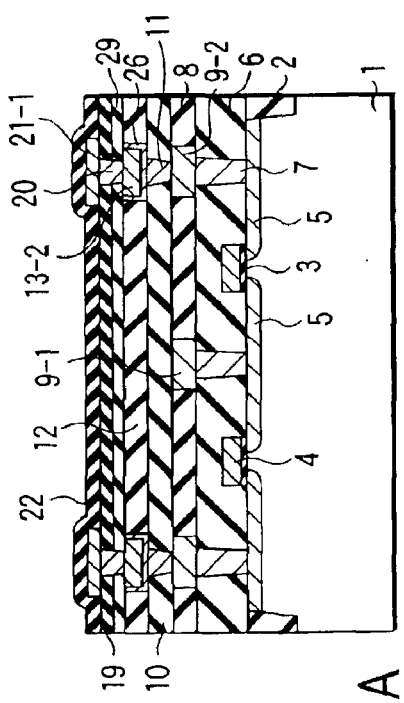
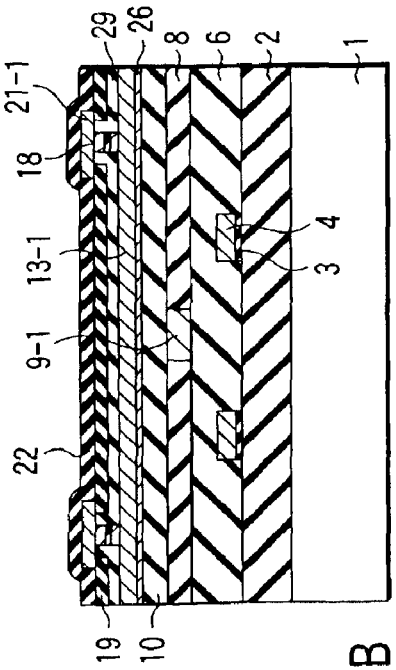
FIG. 37A
FIG. 37B
FIG. 37C
FIG. 37D

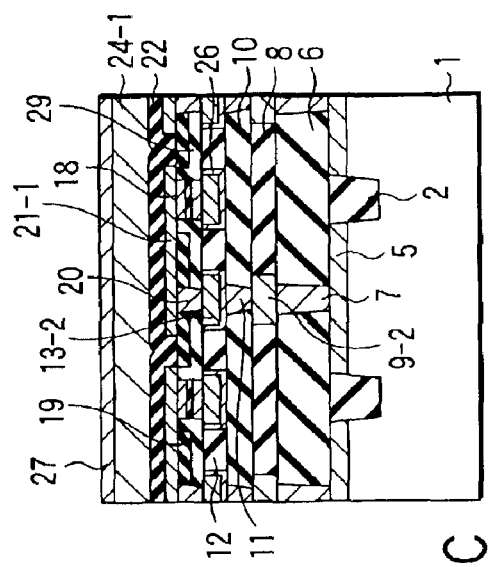
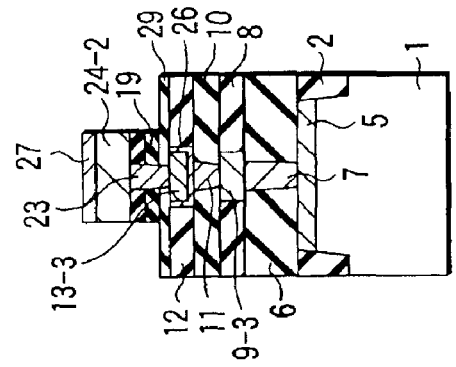
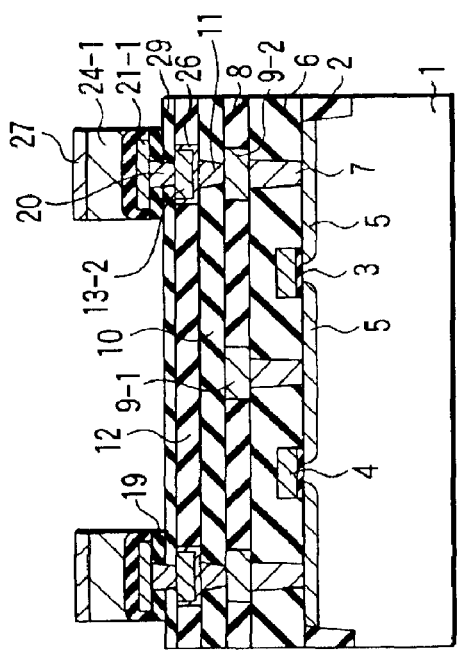
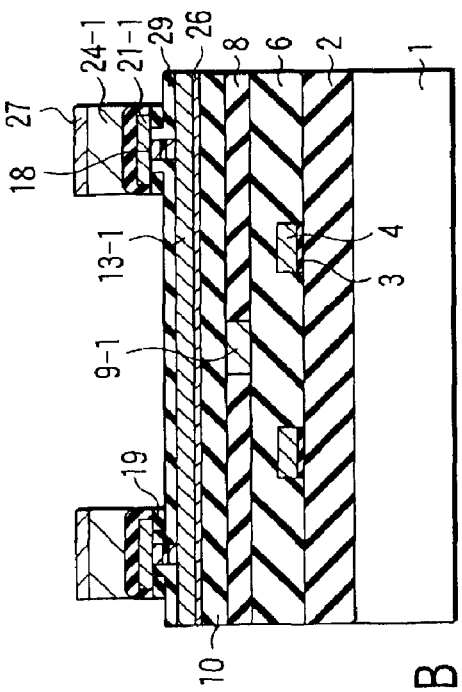
FIG. 39A
FIG. 39B
FIG. 39C
FIG. 39D

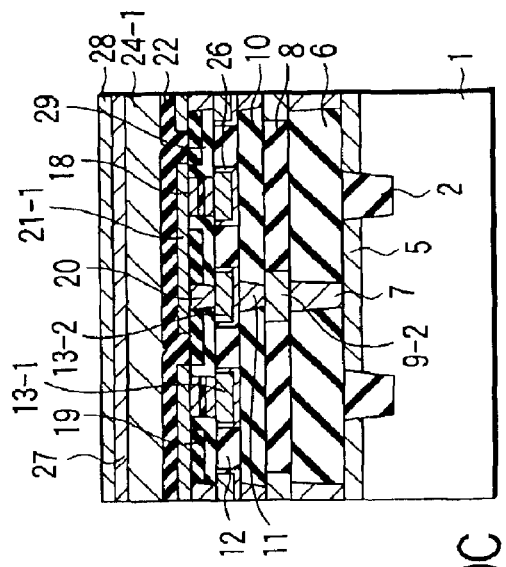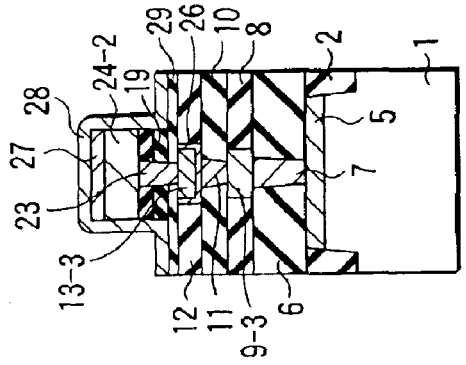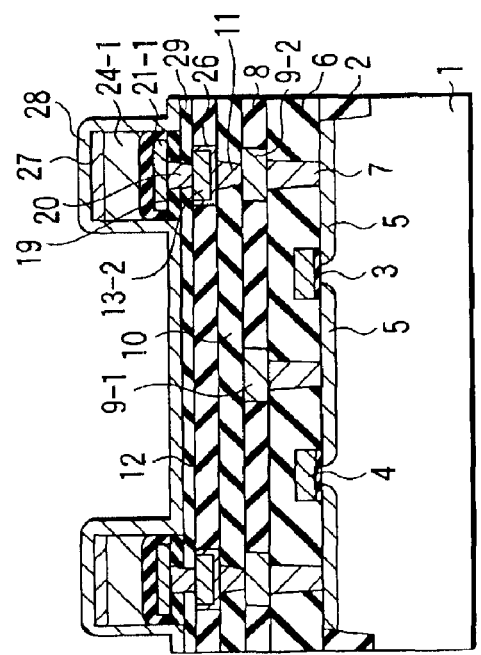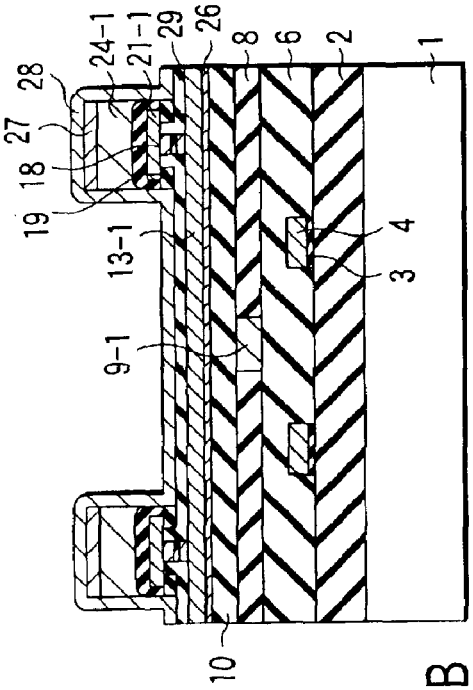
FIG. 40A
FIG. 40B
FIG. 40C
FIG. 40D

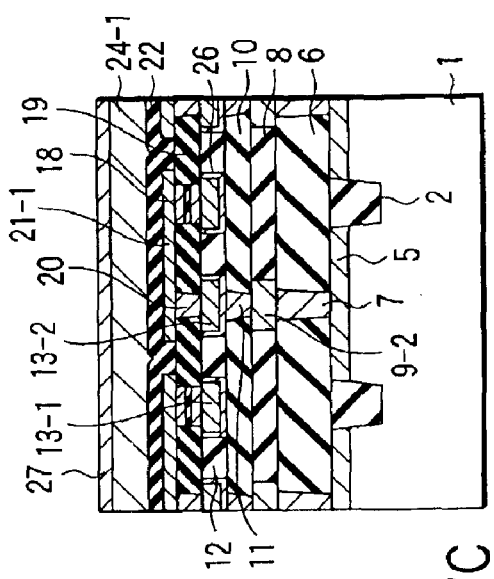
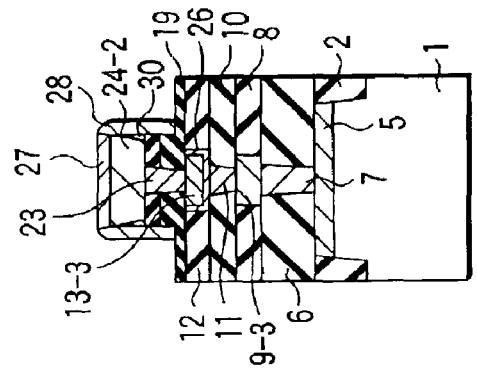
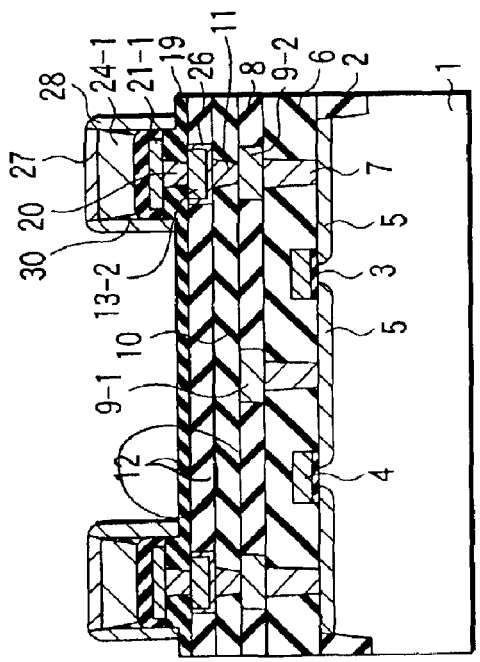
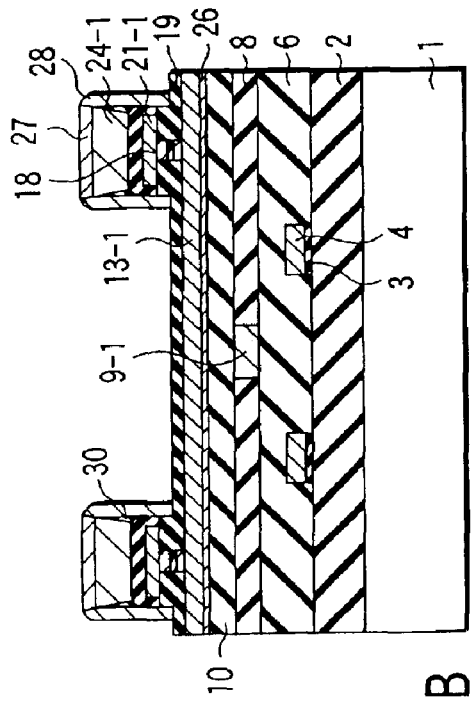
FIG. 47A
FIG. 47B
FIG. 47C
FIG. 47D

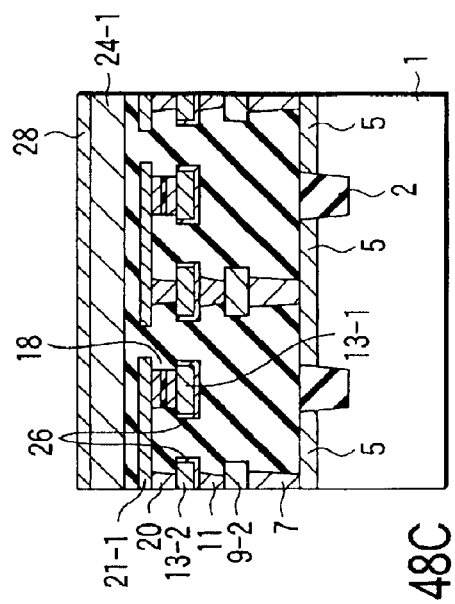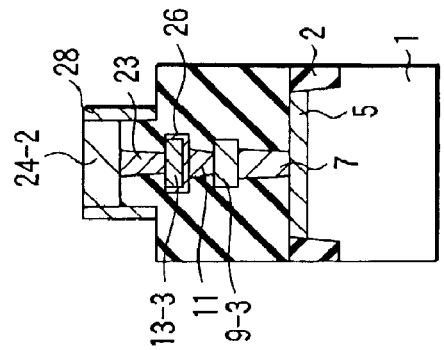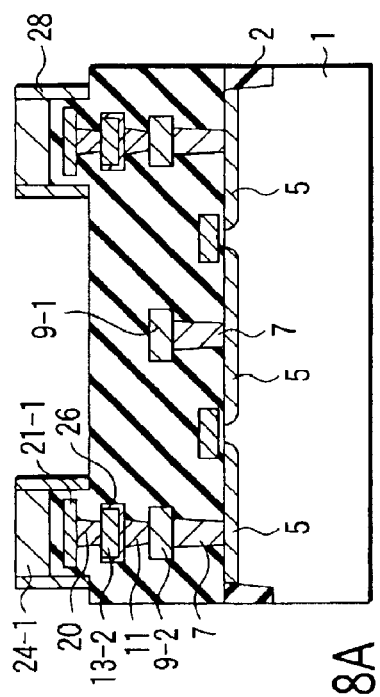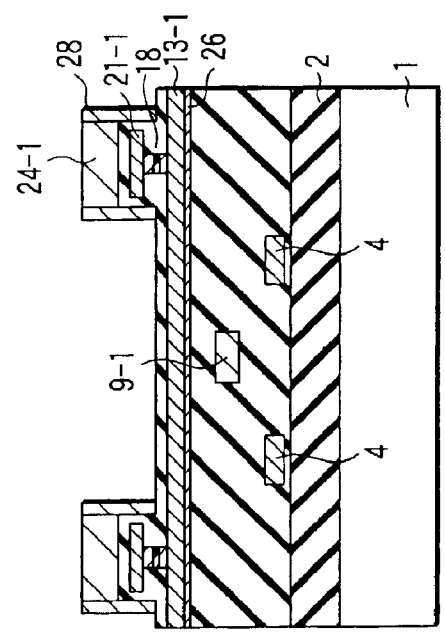
FIG. 48A
FIG. 48B
FIG. 48C
FIG. 48D

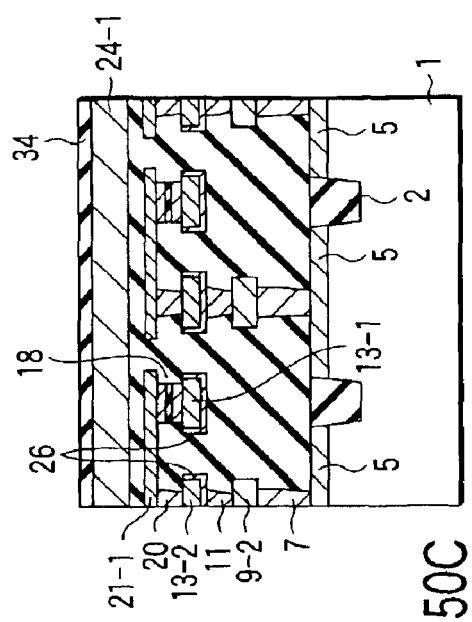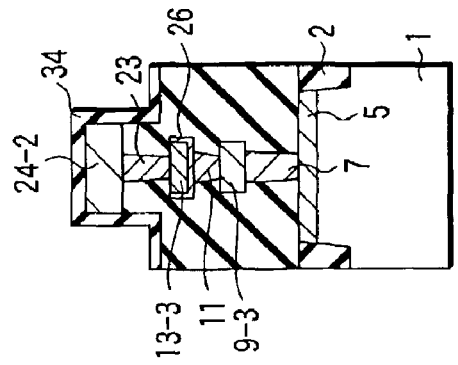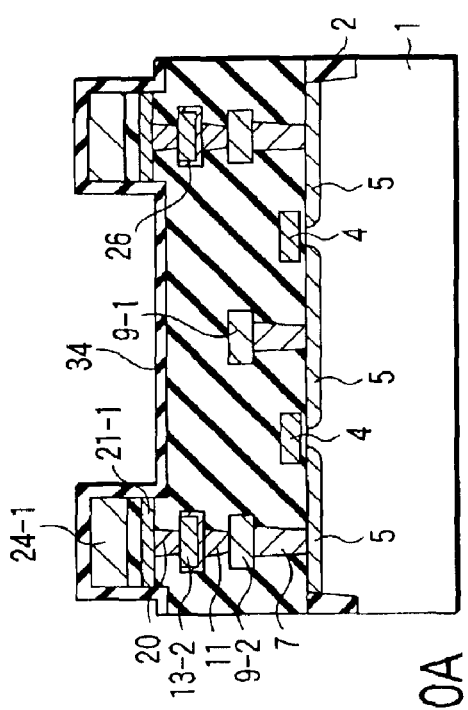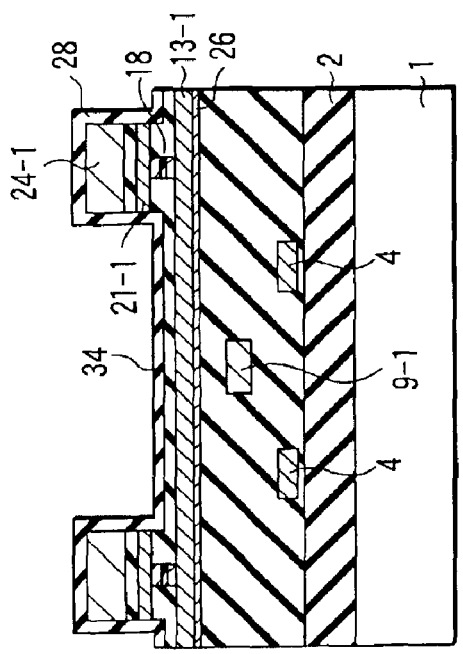
F I G. 50A
F I G. 50B
F I G. 50C
F I G. 50D

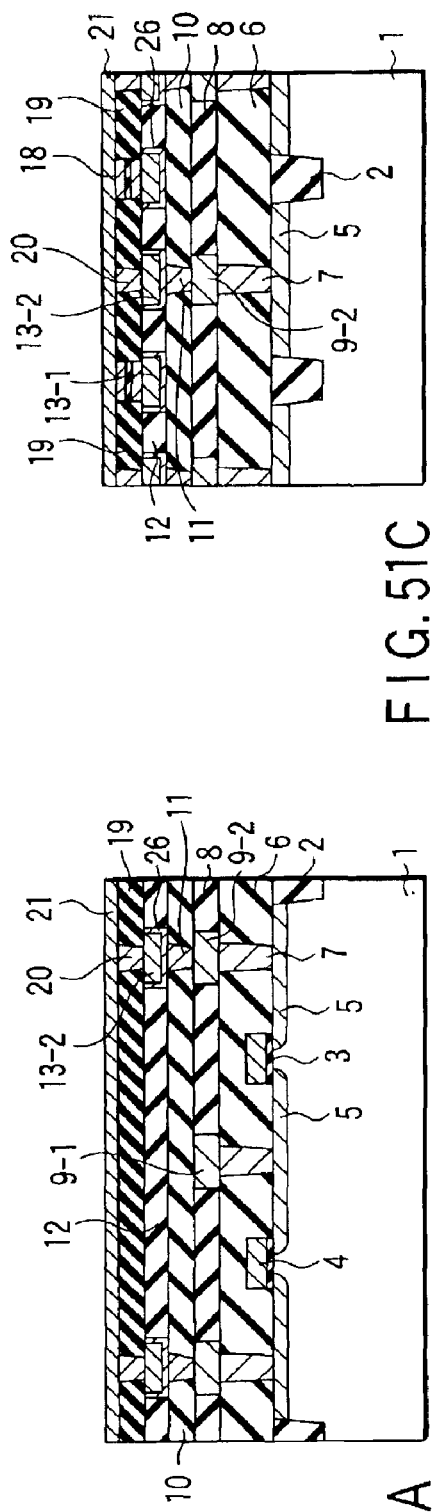
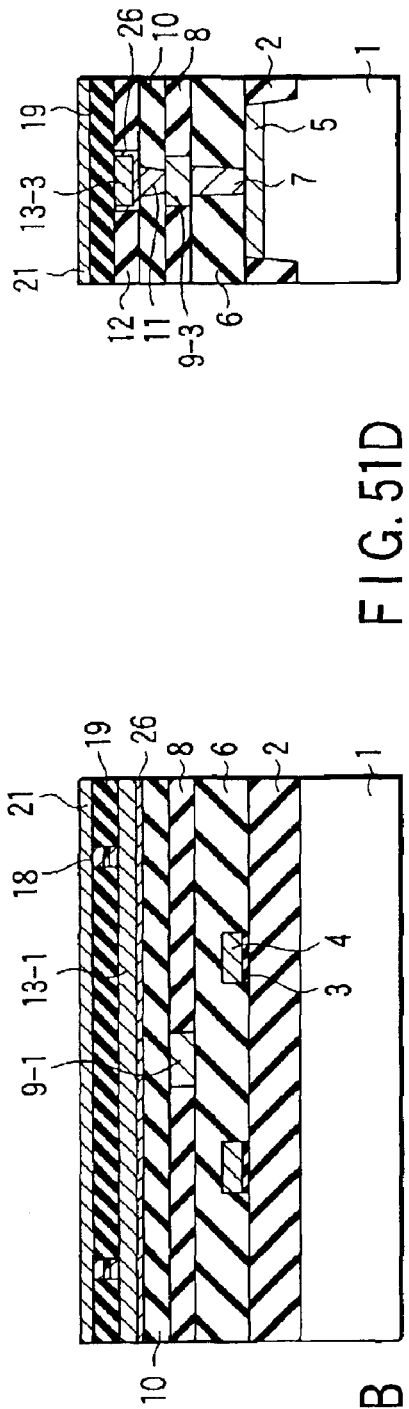
FIG. 51A
FIG. 51B
FIG. 51C
FIG. 51D

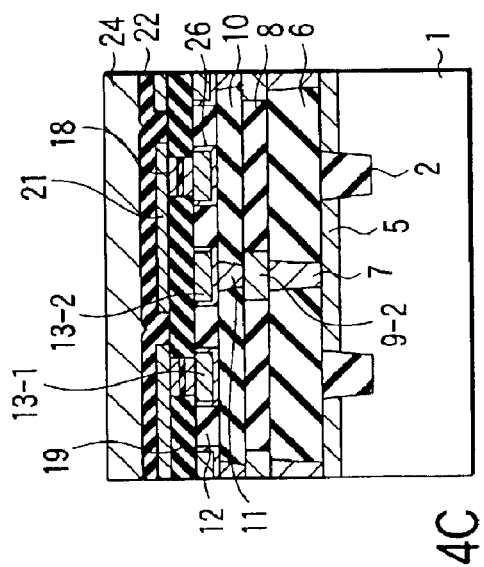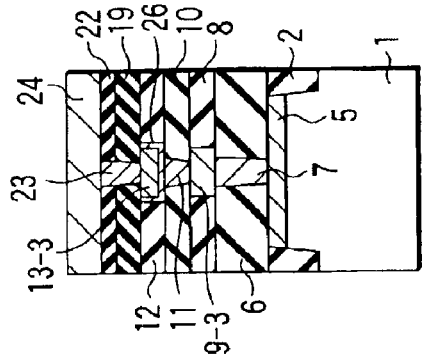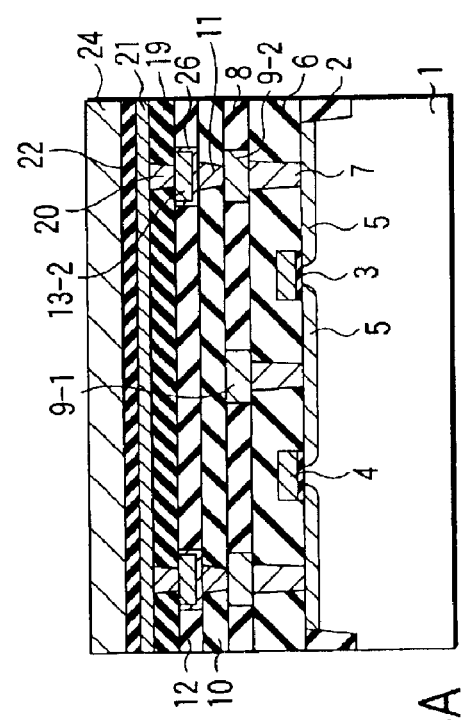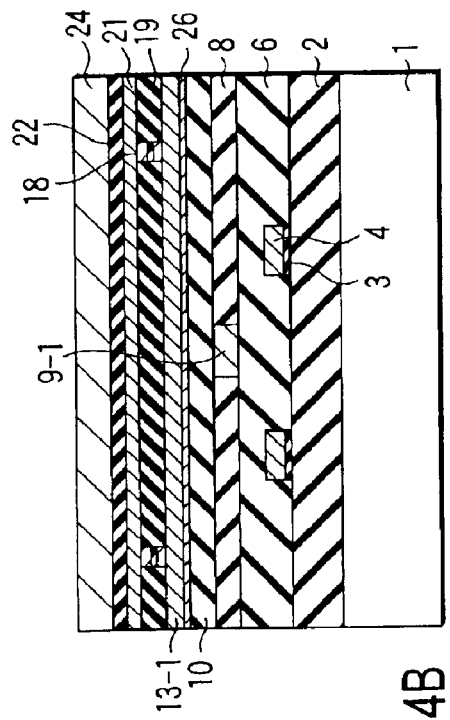
FIG. 54A
FIG. 54B
FIG. 54C
FIG. 54D

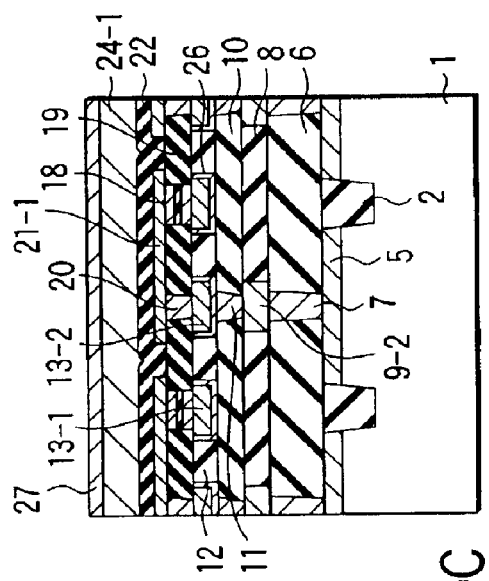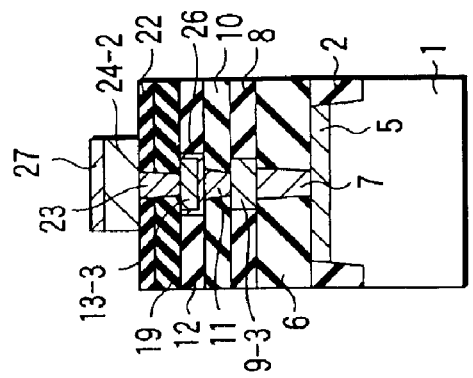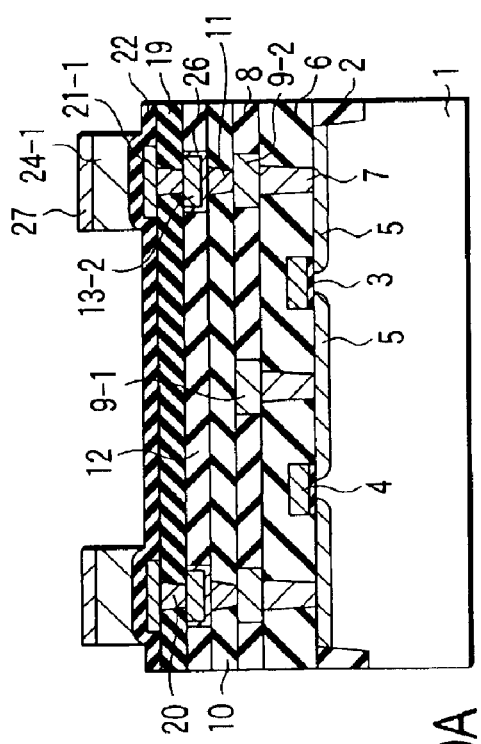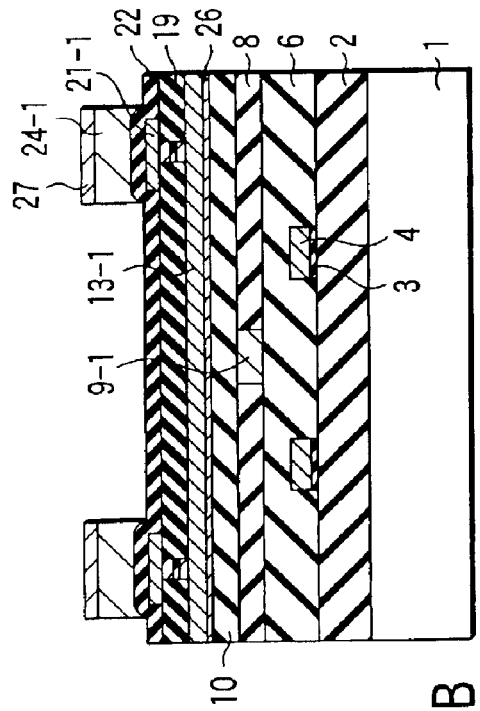
FIG. 60A
FIG. 60B
FIG. 60C
FIG. 60D

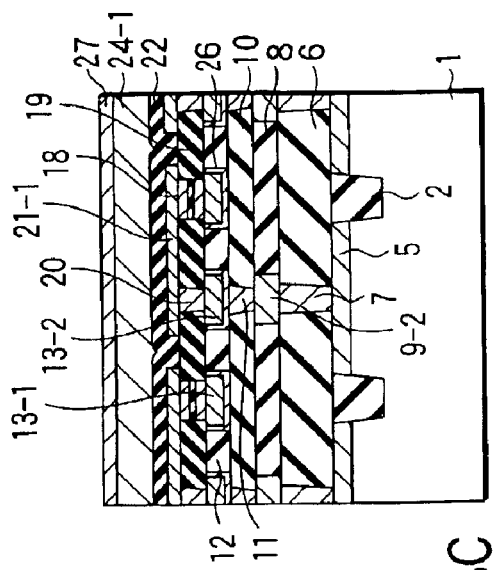
F I G. 68C
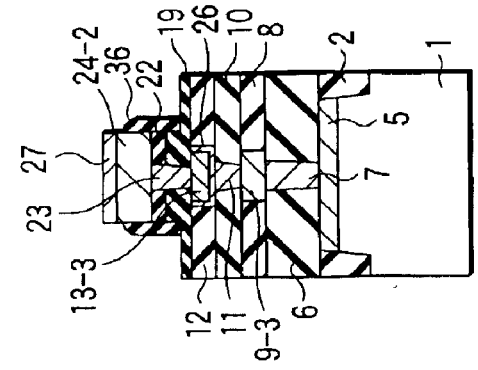
F I G. 68D
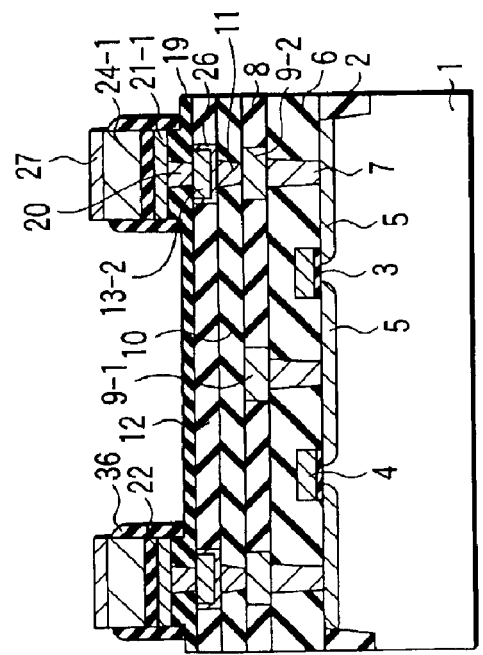
F I G. 68A
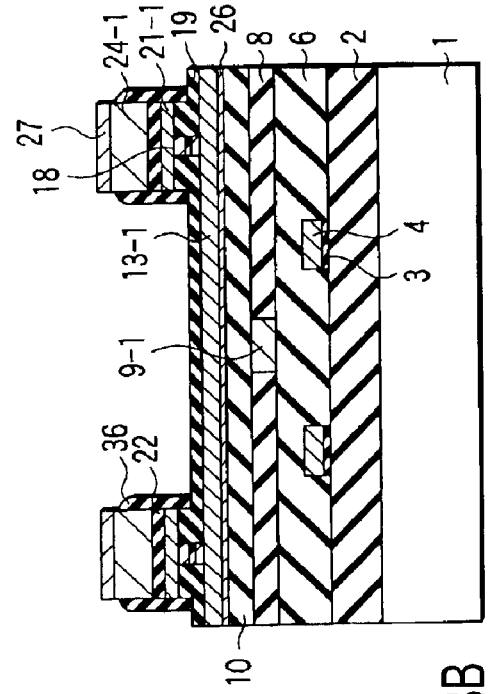
F I G. 68B

SEMICONDUCTOR INTEGRATED CIRCUIT DEVICE AND METHOD OF MANUFACTURING THE SAME

CROSS-REFERENCE TO RELATED APPLICATIONS

This application is based upon and claims the benefit of priority from the prior Japanese Patent Applications No. 2002-12640, filed Jan. 22, 2002, and No. 2002-183983, filed Jun. 25, 2002, the entire contents of both of which are incorporated herein by reference.

BACKGROUND OF THE INVENTION

1. Field of the Invention

The present invention relates to a semiconductor integrated circuit device and a method of manufacturing the same and, more particularly, to a semiconductor integrated circuit device having a memory cell including a magnetoresistive element and a method of manufacturing the same.

2. Description of the Related Art

FIG. 73 is a sectional view showing a typical magnetic random access memory.

As shown in FIG. 73, a memory cell of a magnetic random access memory has a cell transistor and an MTJ (Magnetic Tunnel Junction) element 118 connected between a bit line 113-1 and one of source and drain regions 105 of the cell transistor. The other of the source and drain regions 105 of the cell transistor is connected to a source line 109-1 through a contact 107. A gate electrode 104 functions as a read word line.

The MTJ element 118 is connected to one of the source and drain regions 105 through an intracell local interconnection 121-1, contact 120, intracell via 113-2, contact 111, intracell via 109-2, and contact 107.

Conventionally, the MTJ element 118 is formed on the intracell local interconnection 121-1. A write word line 124-1 is formed under the intracell local interconnection 121-1. The bit line 113-1 is formed on the MTJ element 118.

However, the typical magnetic random access memory has some problems to be described below.

FIG. 74 is a sectional view for explaining the first problem of the typical magnetic random access memory.

As shown in FIG. 74, the write word line 124-1 is formed under the intracell local interconnection 121-1. For this reason, a thickness t1 of the intracell local interconnection 121-1 and a thickness t2 of a dielectric interlayer that insulates the intracell local interconnection 121-1 and write word line 124-1 from each other are present between the MTJ element 118 and the write word line 124-1. Hence, a distance D between the MTJ element 118 and the write word line 124-1 is large. When the distance D is large, it is difficult to efficiently apply the magnetic field from the write word line 124-1 to the MTJ element 118. This makes it hard to, e.g., write data.

To reduce the distance D, for example, the intracell local interconnection 121-1 is thinned. However, it is difficult to thin the intracell local interconnection 121-1 due to the following reason.

FIGS. 75A, 75B, and 75C are sectional views for explaining the second problem of the typical magnetic random access memory.

As shown in FIG. 75A, to form an MTJ element, a magnetic tunnel junction is formed from a ferromagnetic layer 114, insulating layer 115, and ferromagnetic layer 116. Then, a mask layer 117 corresponding to the formation pattern of the MTJ element is formed.

Next, as shown in FIG. 75B, the magnetic tunnel junction is etched using the mask layer 117 as a mask. At this time, a metal layer 121 that forms an intracell local interconnection functions as, e.g., an etching stopper. In this etching, if the metal layer 121 is thin, it may vanish, as shown in FIG. 75C. When the metal layer 121 vanishes, the intracell local interconnection cannot be formed.

Due to, e.g., the above reason, the intracell local interconnection 121-1 is hard to thin.

Even if the metal layer 121 does not vanish, it is etched, as shown in FIG. 75B. For this reason, the thickness of the metal layer 121 varies. The etching amount of the metal layer 121 is not always uniform in, e.g., the chip or wafer. Hence, the thickness of the metal layer 121 varies in a wide range. The wide-ranging variation in thickness of the metal layer 121 causes, e.g., a variation in resistance value of the intracell local interconnection 121-1.

If the resistance value of the intracell local interconnection 121-1 varies, the resistance value of a resistor 200 between the bit line 113-1 and the cell transistor also varies, as shown in the equivalent circuit diagram shown in FIG. 76. Such a variation in resistance value may influence, e.g., the reliability related to a data read.

BRIEF SUMMARY OF THE INVENTION

A semiconductor integrated circuit device according to an aspect of the present invention comprises: a cell transistor; a bit line provided above the cell transistor a magnetoresistive element provided above the bit line, an under end portion of the magnetoresistive element being electrically connected to the bit line; an intracell local interconnection provided above the magnetoresistive element, the intracell local interconnection coupling one of source and drain regions of the cell transistor to a top end portion of the magnetoresistive element; and a write word line provided above the intracell local interconnection, the write word line applying a magnetic field to the magnetoresistive element under the intracell local connection.

BRIEF DESCRIPTION OF THE SEVERAL VIEWS OF THE DRAWING

FIGS. 15A, 15B, 15C, and 15D are sectional views showing the method of manufacturing the magnetic random access memory according to the first embodiment of the present invention;

FIGS. 29A, 29B, 29C, and 29D are sectional views showing the first method of manufacturing the magnetic random access memory according to the second embodiment of the present invention;

FIGS. 37A, 37B, 37C, and 37D are sectional views showing the second method of manufacturing the magnetic random access memory according to the second embodiment of the present invention;

FIGS. 39A, 39B, 39C, and 39D are sectional views showing the second method of manufacturing the magnetic random access memory according to the second embodiment of the present invention;

FIGS. 40A, 40B, 40C, and 40D are sectional views showing the second method of manufacturing the magnetic random access memory according to the second embodiment of the present invention;

FIGS. 47A, 47B, 47C, and 47D are sectional views showing the third method of manufacturing the magnetic random access memory according to the second embodiment of the present invention;

FIGS. 48A, 48B, 48C, and 48D are sectional views showing a modification to the magnetic random access memory according to the second embodiment of the present invention;

FIG. 50A is a sectional view taken along a line A—A in FIG. 49;

FIG. 50B is a sectional view taken along a line B—B in FIG. 49;

FIG. 50C is a sectional view taken along a line C—C in FIG. 49;

FIG. 50D is a sectional view of the substrate contact portion of a peripheral circuit;

FIGS. 51A, 51B, 51C, and 51D are sectional views showing a method of manufacturing the magnetic random access memory according to the third embodiment of the present invention;

FIGS. 54A, 54B, 54C, and 54D are sectional views showing the method of manufacturing the magnetic random access memory according to the third embodiment of the present invention;

FIGS. 60A, 60B, 60C, and 60D are sectional views showing the method of manufacturing the magnetic random access memory according to the fourth embodiment of the present invention;

FIGS. 68A, 68B, 68C, and 68D are sectional views showing the method of manufacturing the magnetic random access memory according to the fifth embodiment of the present invention;

DETAILED DESCRIPTION OF THE INVENTION

Figure 1:
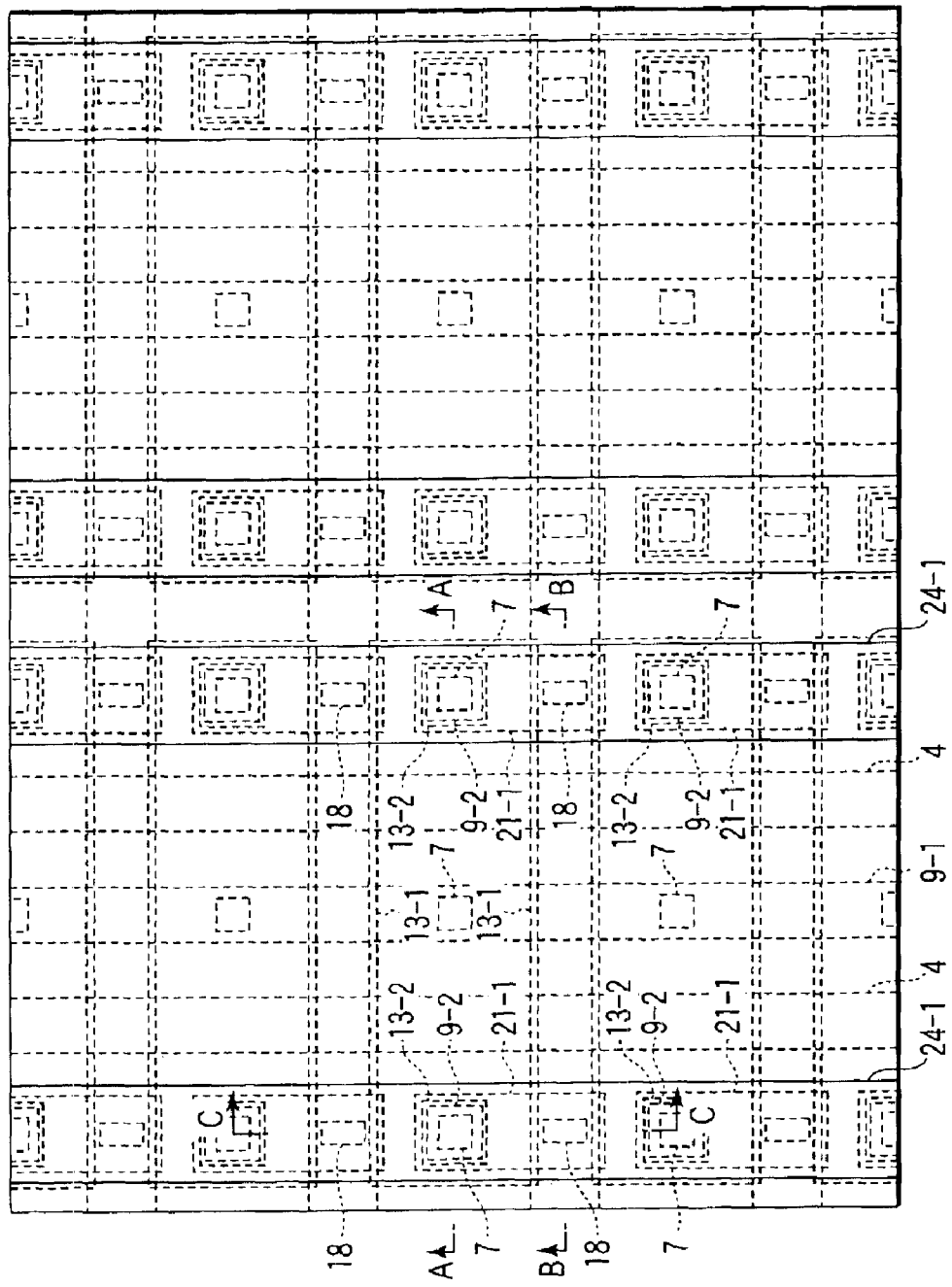
FIG. 1 is a plan view showing the planar pattern of a magnetic random access memory according to a first embodiment of the present invention.

The embodiments of the present invention will be described below with reference to the accompanying drawing. In this description, the same reference numerals denote the same parts throughout the drawing.

(First Embodiment)

Figure 2C:
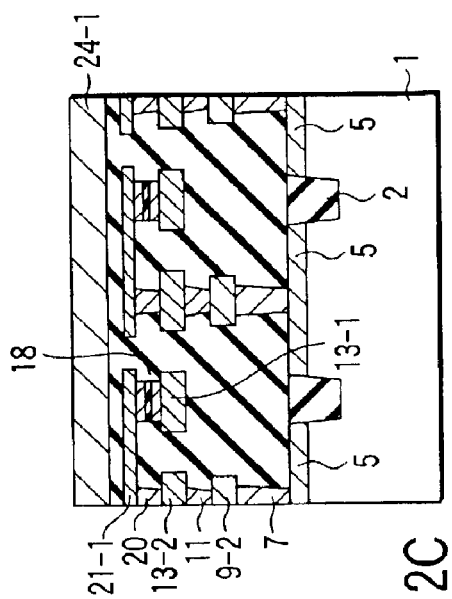
FIG. 2C is a sectional view taken along a line C—C in FIG. 1.
Figure 2D:
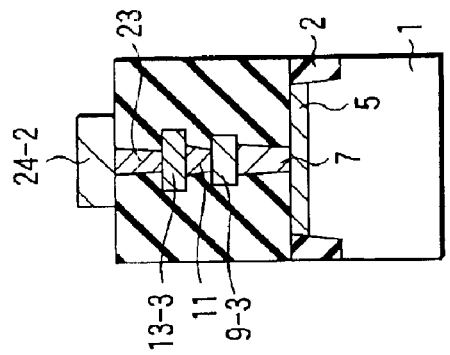
FIG. 2D is a sectional view of the substrate contact portion of a peripheral circuit.
Figure 2A:
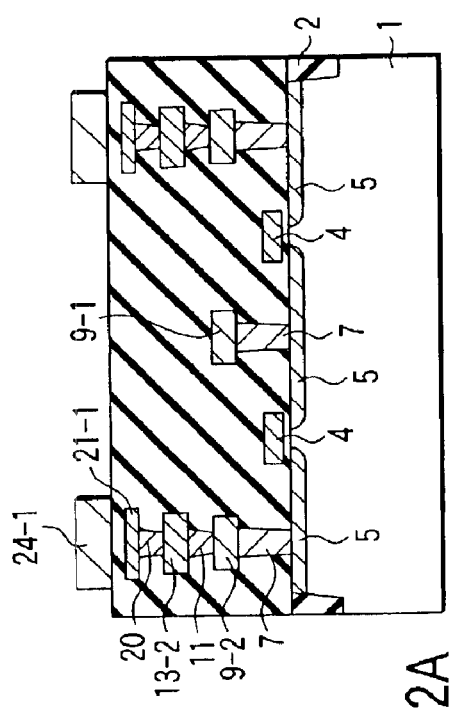
FIG. 2A is a sectional view taken along a line A—A in FIG. 1.
Figure 2B:
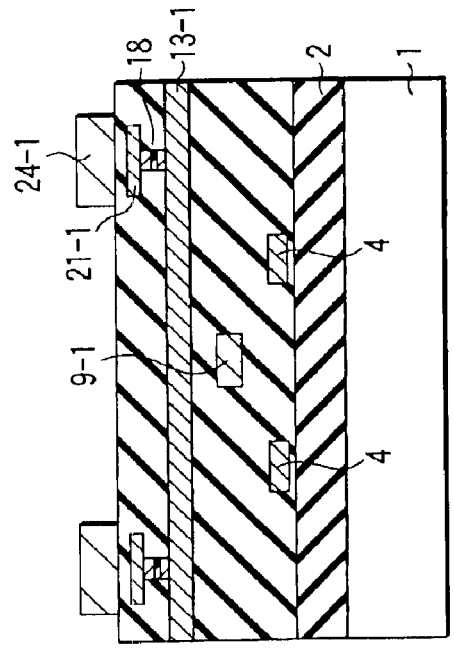
FIG. 2B is a sectional view taken along a line B—B in FIG. 1.
Figure 3A:
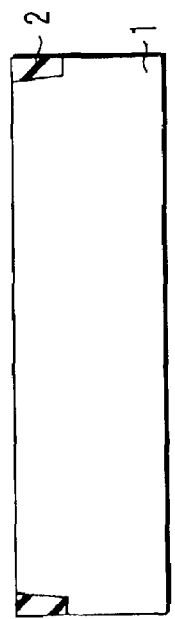
FIGS. 3A, 3B, 3C, and 3D are sectional views showing a method of manufacturing the magnetic random access memory according to the first embodiment of the present invention.
Figure 3B:
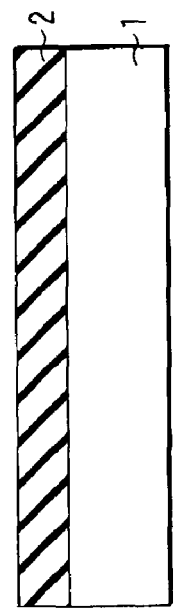
Figure 3C:
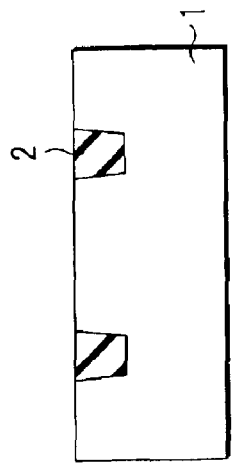
Figure 3D:
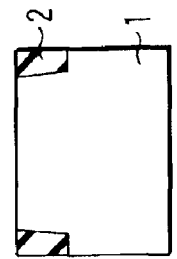
Figure 4A:
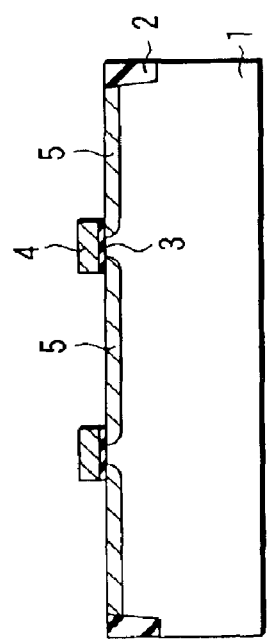
FIGS. 4A, 4B, 4C, and 4D are sectional views showing the method of manufacturing the magnetic random access memory according to the first embodiment of the present invention.
Figure 4C:
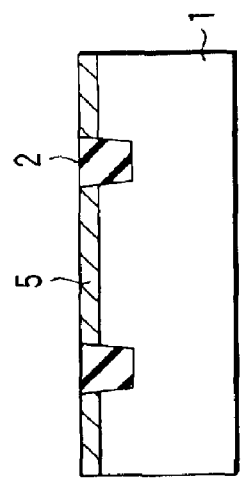
Figure 4B:
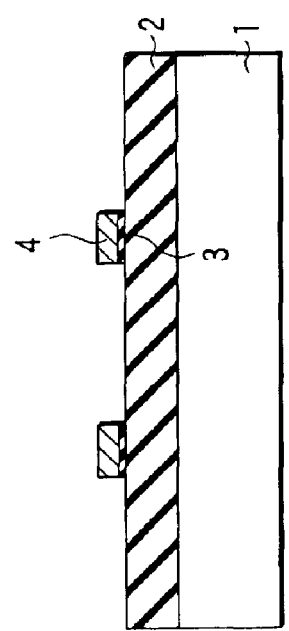
Figure 4D:
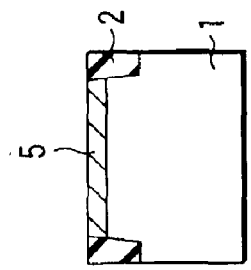
Figure 5C:
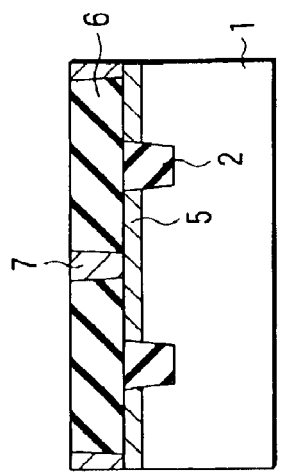
FIGS. 5A, 5B, 5C, and 5D are sectional views showing the method of manufacturing the magnetic random access memory according to the first embodiment of the present invention.
Figure 5D:
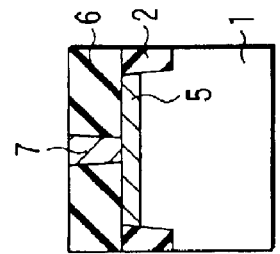
Figure 5A:
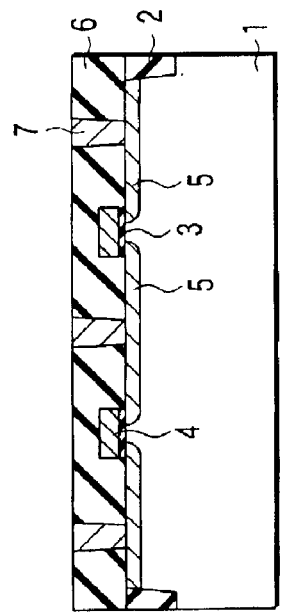
Figure 5B:
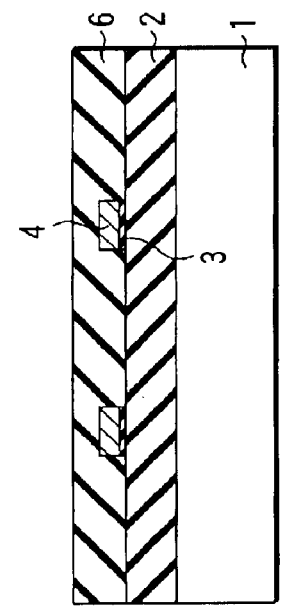
Figure 6C:
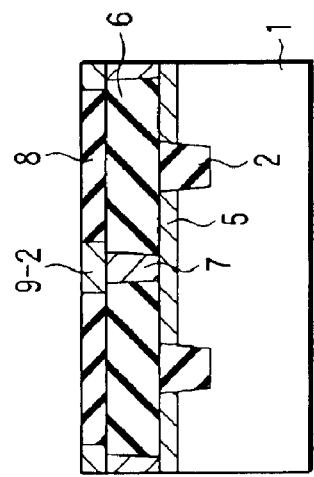
FIGS. 6A, 6B, 6C, and 6D are sectional views showing the method of manufacturing the magnetic random access memory according to the first embodiment of the present invention.
Figure 6D:
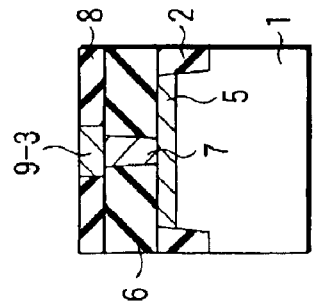
Figure 6A:
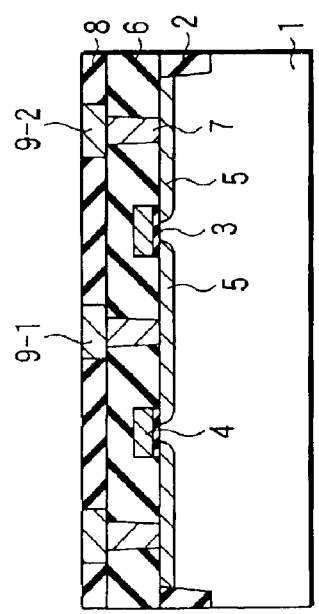
Figure 6B:
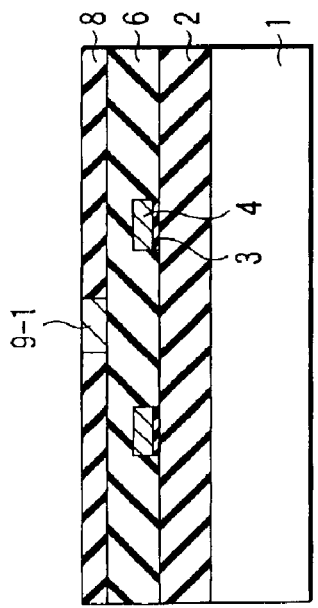
Figure 7A:
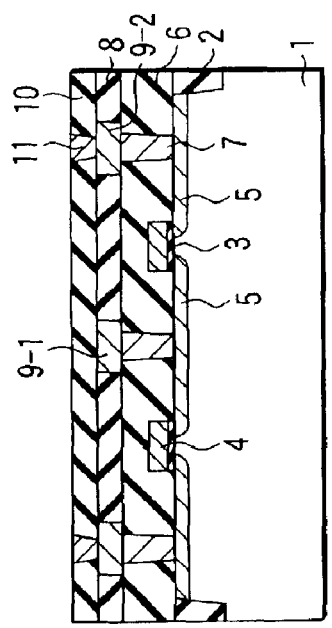
FIGS. 7A, 7B, 7C, and 7D are sectional views showing the method of manufacturing the magnetic random access memory according to the first embodiment of the present invention.
Figure 7B:
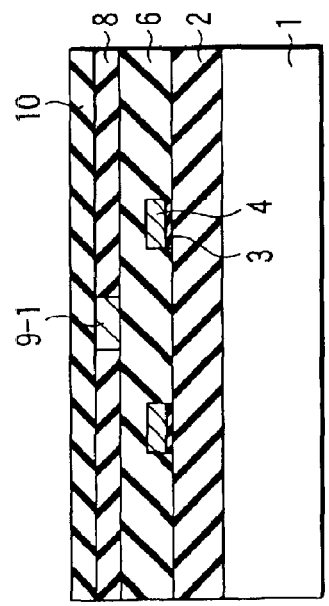
Figure 7C:
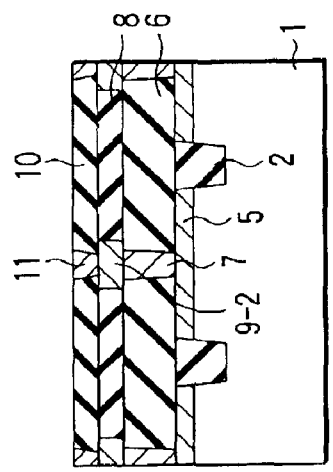
Figure 7D:
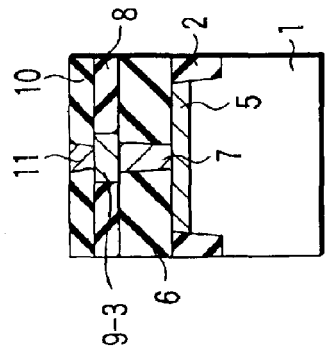
Figure 8A:
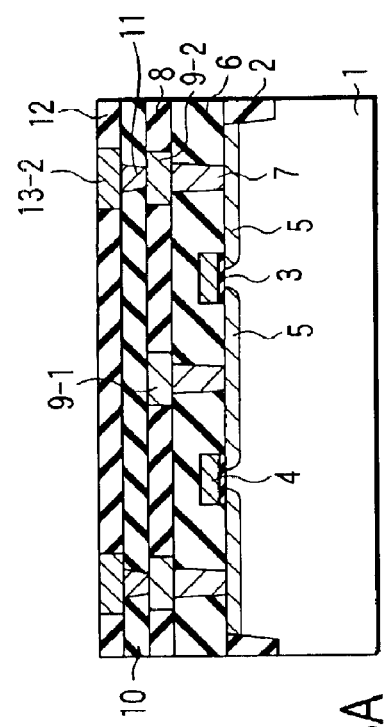
FIGS. 8A, 8B, 8C, and 8D are sectional views showing the method of manufacturing the magnetic random access memory according to the first embodiment of the present invention.
Figure 8B:
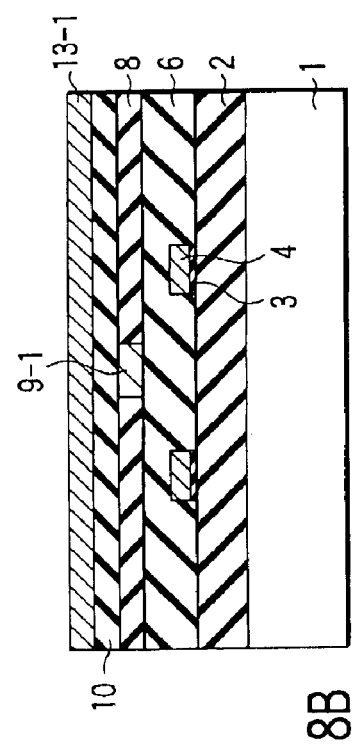
Figure 8C:
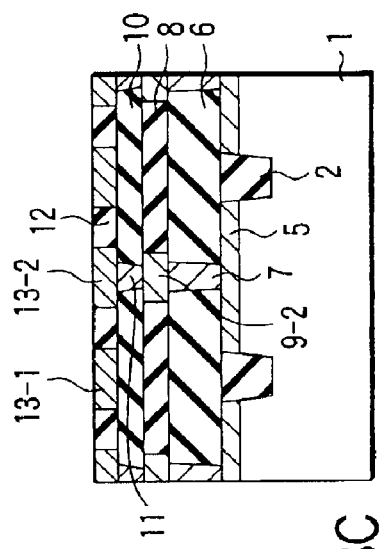
Figure 8D:
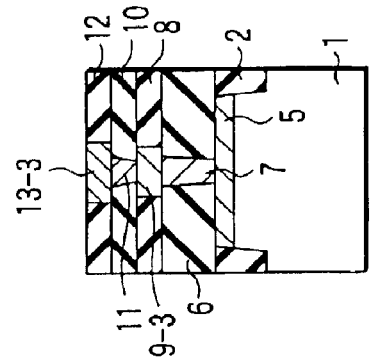
Figure 9A:
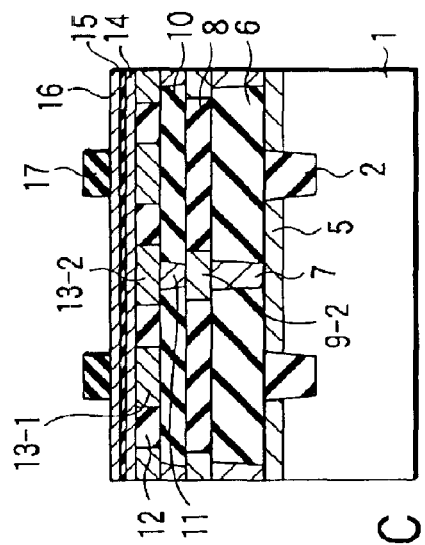
FIGS. 9A, 9B, 9C, and 9D are sectional views showing the method of manufacturing the magnetic random access memory according to the first embodiment of the present invention.
Figure 9B:
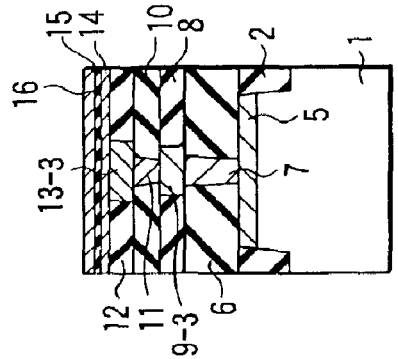
Figure 9C:
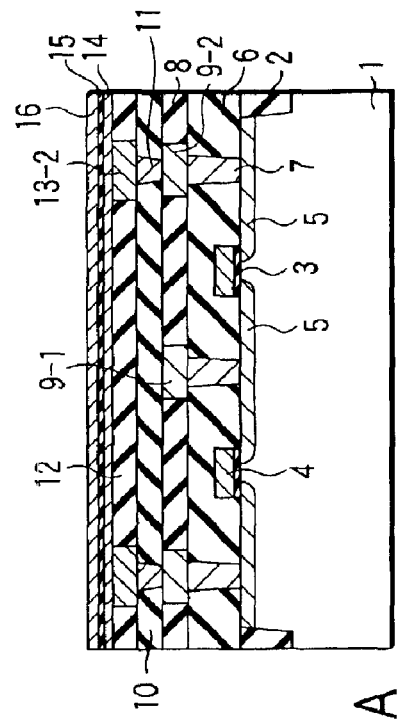
Figure 9D:
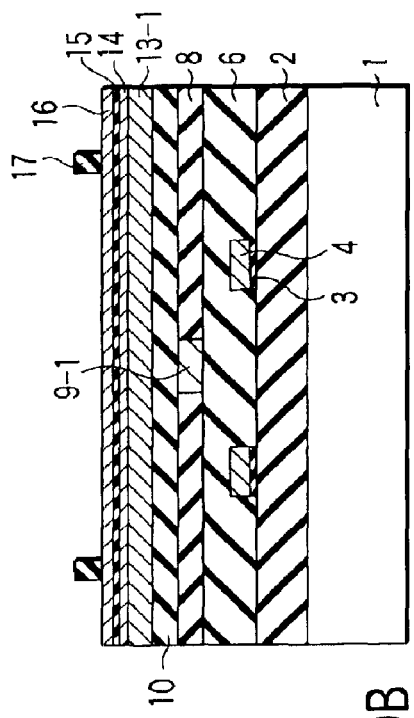
Figure 10A:
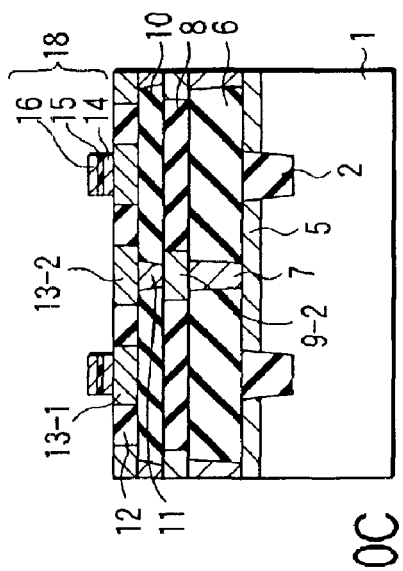
FIGS. 10A, 10B, 10C, and 10D are sectional views showing the method of manufacturing the magnetic random access memory according to the first embodiment of the present invention.
Figure 10C:
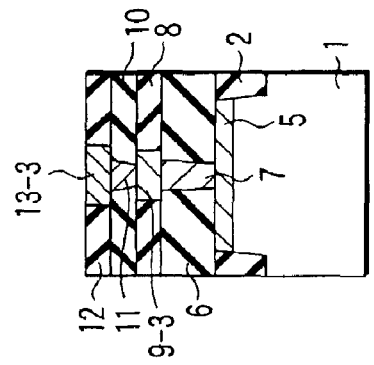
Figure 10B:
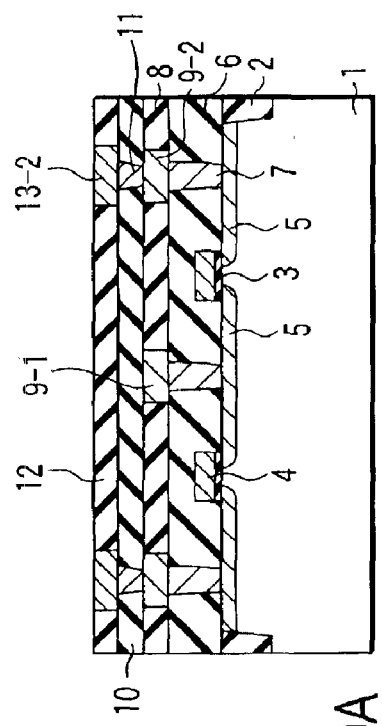
Figure 10D:
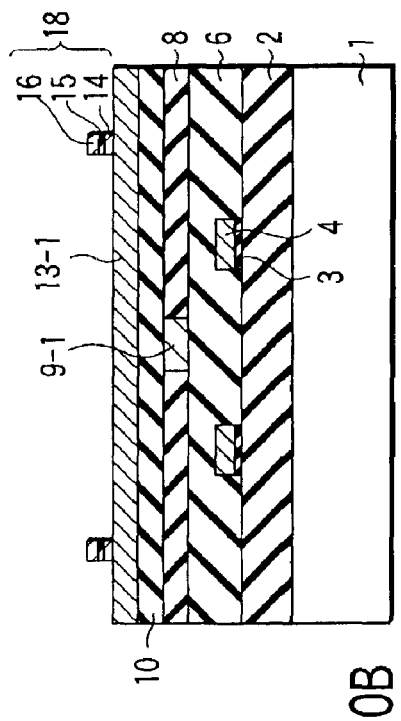
Figure 11A:
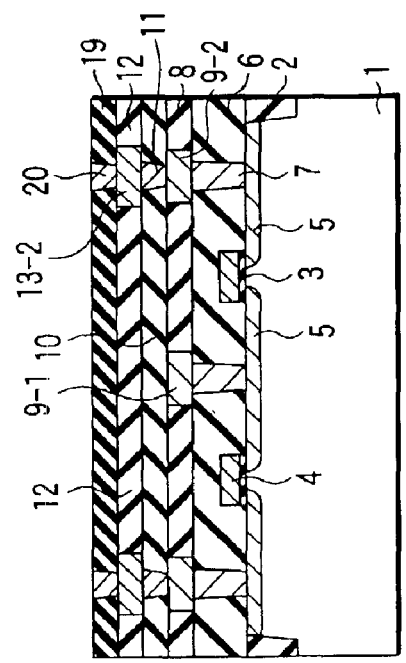
FIGS. 11A, 11B, 11C, and 11D are sectional views showing the method of manufacturing the magnetic random access memory according to the first embodiment of the present invention.
Figure 11C:
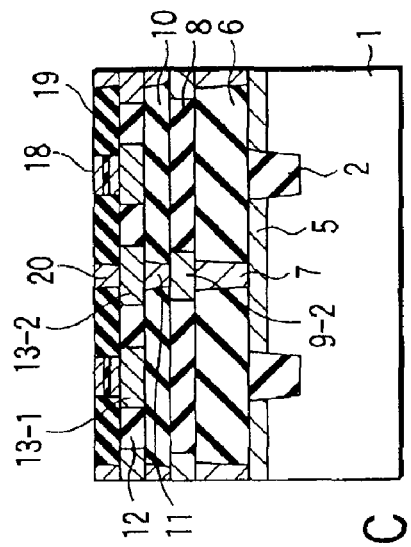
Figure 11B:
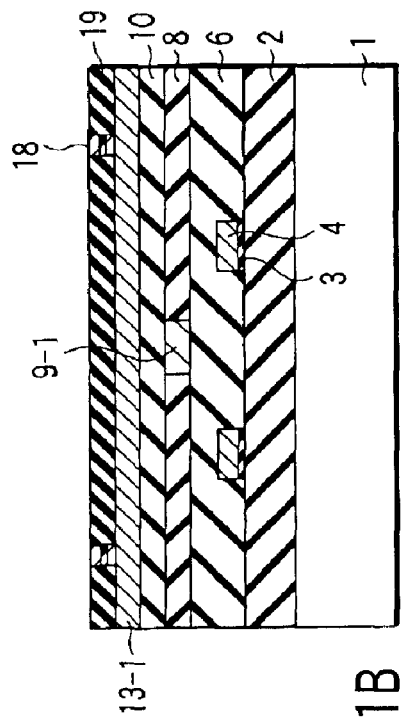
Figure 11D:
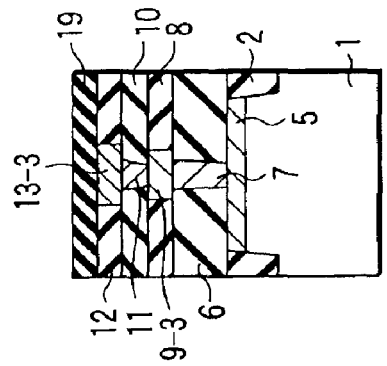
Figure 12C:
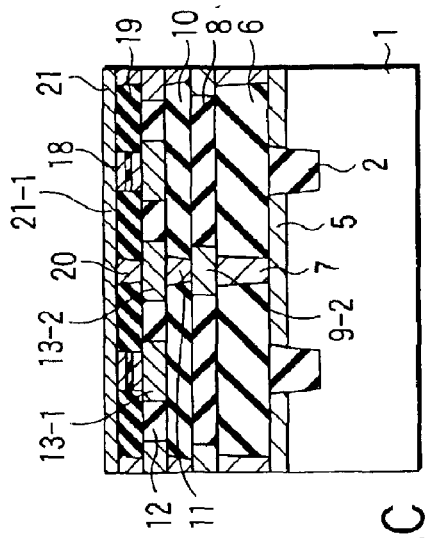
FIGS. 12A, 12B, 12C, and 12D are sectional views showing the method of manufacturing the magnetic random access memory according to the first embodiment of the present invention.
Figure 12D:
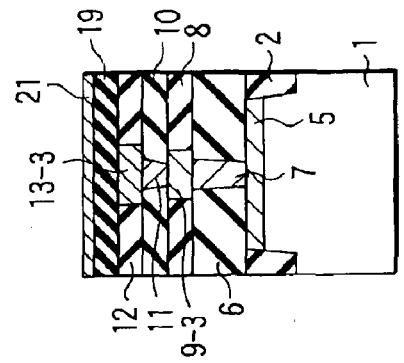
Figure 12A:
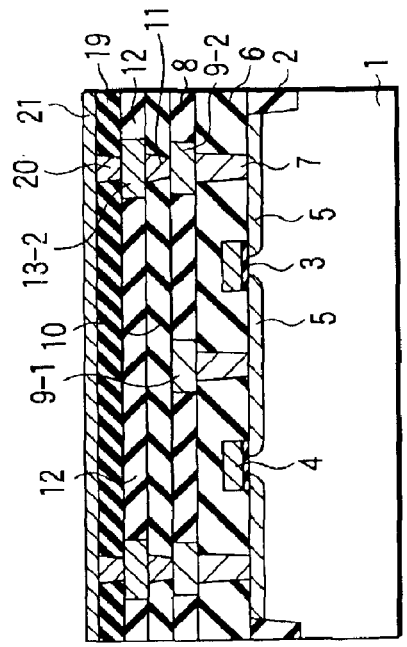
Figure 12B:
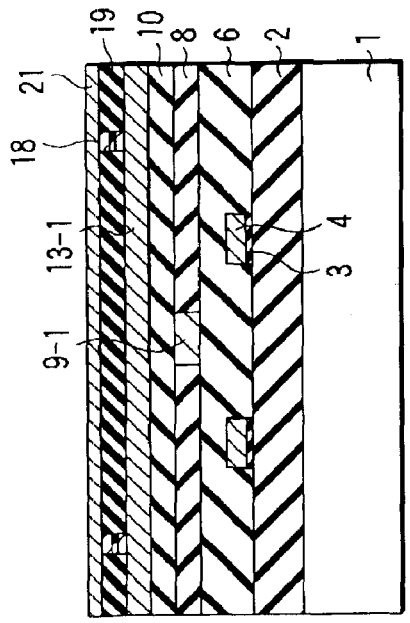
Figure 13A:
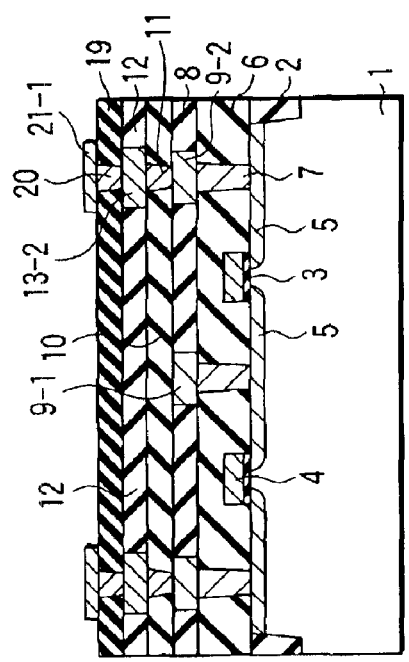
FIGS. 13A, 13B, 13C, and 13D are sectional views showing the method of manufacturing the magnetic random access memory according to the first embodiment of the present invention.
Figure 13B:
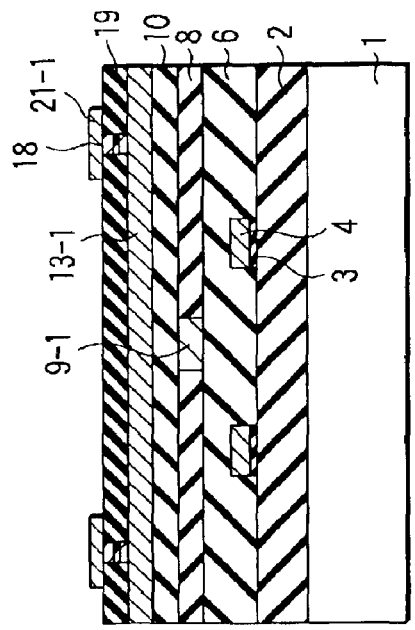
Figure 13C:
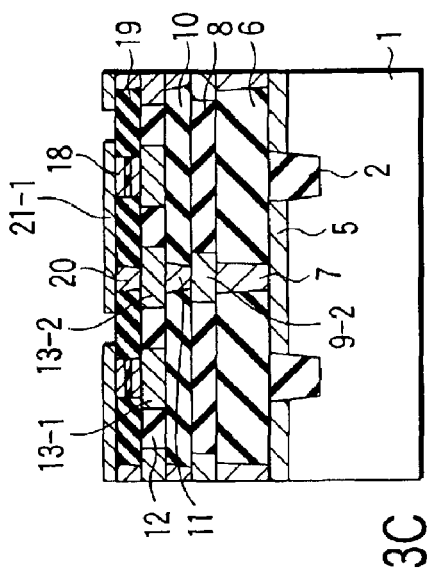
Figure 13D:
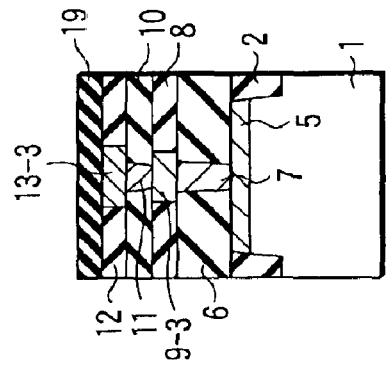
Figure 14C:
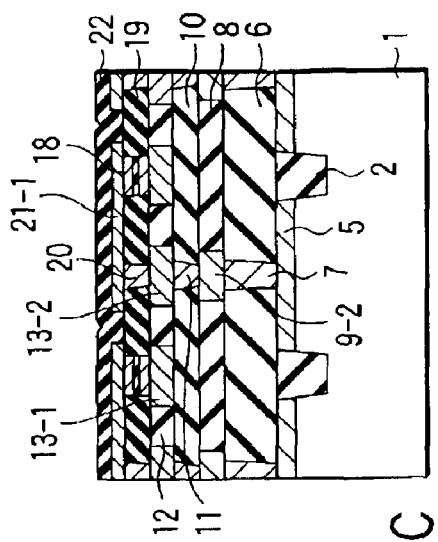
FIGS. 14A, 14B, 14C, and 14D are sectional views showing the method of manufacturing the magnetic random access memory according to the first embodiment of the present invention.
Figure 14D:
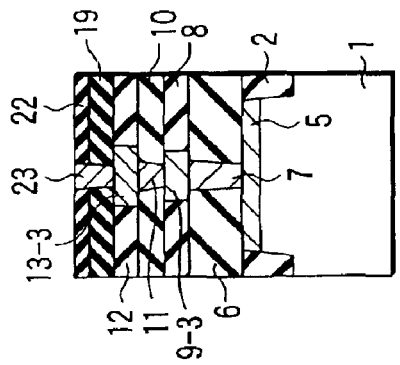
Figure 14A:
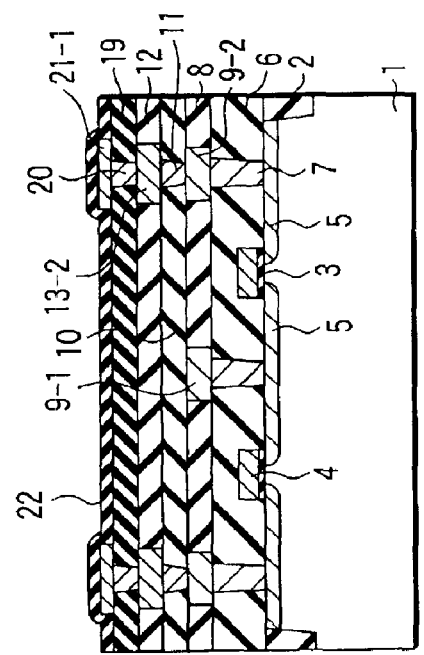
Figure 14B:
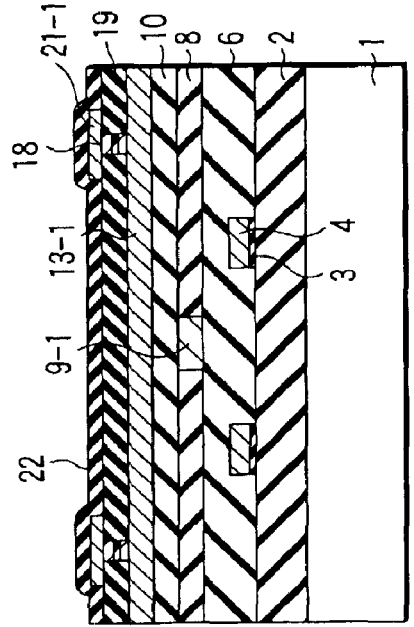

FIG. 1 is a plan view showing the planar pattern of a magnetic random access memory according to a first embodiment of the present invention. FIG. 2A is a sectional view taken along a line A—A in FIG. 1. FIG. 2B is a sectional view taken along a line B—B in FIG. 1. FIG. 2C is a sectional view taken along a line C—C in FIG. 1. FIG. 2D is a sectional view of the substrate contact portion of a peripheral circuit.

As shown in FIGS. 1 and 2A to 2D, the magnetic random access memory according to the first embodiment has a memory cell including a magnetoresistive element. In this embodiment, as a memory cell including a magnetoresistive element, a 1-magnetoresistive-element—1-transistor memory cell including one magnetoresistive element and one cell transistor will be exemplified. The cell transistor is formed in the element region of, e.g., a p-type silicon substrate 1. The element region is defined by an element isolation region 2 formed on the substrate 1. The cell transistor has a gate electrode 4 and n-type source and drain regions 5. The gate electrode 4 functions as a read word line and extends in the first direction. A source line 9-1 and intracell via 9-2 are formed above the cell transistor. These elements are formed from, e.g., a first metal layer. The source line 9-1 extends in the first direction, like the read word line, and is connected to one of the source and drain regions 5, e.g., the source region of the cell transistor through a first metal layer—substrate contact 7. The intracell via 9-2 is connected to the other of the source and drain regions 5, e.g., the drain region of the cell transistor through the first metal layer—substrate contact 7. A bit line 13-1 and intracell via 13-2 are formed above the source line 9-1 and the intracell via 9-2. These elements are formed from, e.g., a second metal layer. The intracell via 13-2 is connected to the intracell via 9-2 through a second metal layer—first metal layer contact 11. The bit line 13-1 extends in the second direction that crosses, e.g., is perpendicular to the read word line. A magnetoresistive element, e.g., an Magnetic Tunnel Junction (MTJ) element 18 is formed on the bit line 13-1. The MTJ element 18 is a Tunneling Magneto Resistive (TMR) element. The MTJ element 18 includes a fixed-layer and memory-layer, which are formed from magnetic layers, e.g., ferromagnetic layers, and a tunnel barrier layer formed from an insulating nonmagnetic layer formed between the fixed-layer and the memory-layer. In the fixed-layer, the direction of spin is fixed. In the memory-layer, the direction of spin changes in accordance with the write magnetic field. One end of the MTJ element 18, e.g., the memory-layer is connected to the bit line 13-1. An intracell local interconnection 21-1 is formed on the MTJ element 18. The intracell local interconnection 21-1 is connected to the other end of the MTJ element 18, e.g., the fixed-layer and also connected to the intracell via 13-2 through an extra metal—second metal layer contact 20 (in the present invention, a conductive layer that forms the intracell local interconnection 21-1 is called an extra metal layer for the descriptive convenience). With this structure, the MTJ element 18 is connected between the bit line 13-1 and the other of the source and drain regions 5, e.g., the drain region of the cell transistor. A write word line 24-1 is formed above the intracell local interconnection 21-1. The write word line 24-1 extends in the first direction, like, e.g., the read word line, to cross the bit line 13-1 on the upper side of the MTJ element 18. In writing data in the MTJ element 18, the write word line applies a magnetic field to the MTJ element 18. The easy axis of magnetization of the MTJ element 18 is set in the first direction in which the write word line 24-1 extends.

In the magnetic random access memory according to the first embodiment, the MTJ element 18 is formed under the intracell local interconnection 21-1. Hence, the intracell local interconnection 21-1 is not influenced when patterning the MTJ element 18. For this reason, the intracell local interconnection 21-1 can be made thin, and the distance between the write word line 24-1 and the MTJ element 18 can be reduced.

The MTJ element 18 can easily receive the magnetic field for the write word line 24-1 as compared to a typical magnetic random access memory having an MTJ element on an intracell local interconnection. Hence, data can easily be written in the MTJ element 18.

In addition, since the intracell local interconnection 21-1 is not influenced when patterning the MTJ element 18, any variation in thickness of the intracell local interconnection 21-1 can be suppressed. This also makes it possible to suppress a variation in resistance value between the bit line and the cell transistor. Hence, the reliability related to a data read can be improved.

A method of manufacturing the magnetic random access memory according to the first embodiment of the present invention will be described next.

FIGS. 3A to 15D are sectional views showing the method of manufacturing the magnetic random access memory according to the first embodiment of the present invention. FIGS. 3A, 4A, 5A, 6A, 7A, 8A, 9A, 10A, 11A, 12A, 13A, 14A, and 15A correspond to the section shown in FIG. 2A. FIGS. 3B, 4B, 5B, 6B, 7B, 8B, 9B, 10B, 11B, 12B, 13B, 14B, and 15B correspond to the section shown in FIG. 2B. FIGS. 3C, 4C, 5C, 6C, 7C, 8C, 9C, 10C, 11C, 12C, 13C, 14C, and 15C correspond to the section shown in FIG. 2C. FIGS. 3D, 4D, 5D, 6D, 7D, 8D, 9D, 10D, 11D, 12D, 13D, 14D, and 15D correspond to the section shown in FIG. 2D.

First, as shown in FIGS. 3A to 3D, a shallow trench corresponding to an element isolation region is formed in the p-type silicon substrate 1. The shallow trench is filled with an insulating material, e.g., $SiO_2$ to form an element isolation region (shallow trench isolation: STI).

Next, as shown in FIGS. 4A to 4D, the substrate 1 corresponding to the element region defined by the element isolation region is thermally oxidized to form a gate insulating film ($SiO_2$) 3. Conductive polysilicon is deposited on the substrate 1 and on the element isolation region 2 to form a conductive polysilicon film. The conductive polysilicon film is patterned to form the gate electrode 4. An n-type impurity such as arsenic or phosphorus is ion-implanted into the substrate 1 using the gate electrode 4 and element isolation region 2 as a mask and diffused to form n-type source and drain regions 5.

As shown in FIGS. 5A to 5D, an insulating material, e.g., $SiO_2$ is deposited on the structure shown in FIGS. 4A to 4D to form a first dielectric interlayer 6. Next, openings that reach the n-type source and drain regions 5 are formed in the first dielectric interlayer 6. The openings are filled with a conductive material, e.g., a metal such as tungsten to form the first metal layer—substrate contacts 7.

As shown in FIGS. 6A to 6D, an insulating material, e.g., $SiO_2$ is deposited on the structure shown in FIGS. 5A to 5D to form a second dielectric interlayer 8. First metal layer interconnection trenches that reach the contacts 7 are formed in the second dielectric interlayer 8. The interconnection trenches are filled with a conductive material, e.g., a metal such as tungsten to form interconnection patterns of a first metal layer 9. In this embodiment, of the interconnection patterns, the source line 9-1, intracell via 9-2, and intra-peripheral-circuit via 9-3 are formed.

As shown in FIGS. 7A to 7D, an insulating material, e.g., $SiO_2$ is deposited on the structure shown in FIGS. 6A to 6D to form a third dielectric interlayer 10. Next, openings that reach the intracell via 9-2 and intra-peripheral-circuit via 9-3 are formed in the third dielectric interlayer 10. The openings are filled with a conductive material, e.g., a metal such as tungsten to form second metal layer—first metal layer contacts 11.

As shown in FIGS. 8A to 8D, an insulating material, e.g., $SiO_2$ is deposited on the structure shown in FIGS. 7A to 7D to form a fourth dielectric interlayer 12. Next, second layer metal interconnection trenches that reach the contacts 11 are formed in the fourth dielectric interlayer 12. The interconnection trenches are filled with a conductive material, e.g., a metal such as tungsten to form interconnection patterns of a second metal layer 13. In this embodiment, of the interconnection patterns, the bit line 13-1, the intracell via 13-2, and an intra-peripheral-circuit via 13-3 are formed.

As shown in FIGS. 9A to 9D, a ferromagnetic material, e.g., CoFe or NiFe is sputtered on the structure shown in FIGS. 8A to 8D to form a ferromagnetic layer 14. Next, an insulating material, e.g., Alumina is deposited on the ferromagnetic layer 14 to form an insulating layer 15. Subsequently, a ferromagnetic material e.g., CoFe or NiFe is sputtered on the insulating layer 15 to form a ferromagnetic layer 16. Then, a mask material is deposited on the ferromagnetic layer 16 to form a mask layer 17. The mask layer 17 is patterned into a shape corresponding to the layout pattern of the MTJ element.

As shown in FIGS. 10A to 10D, the ferromagnetic layer 16, insulating layer 15, and ferromagnetic layer 14 are sequentially etched using the mask layer 17 as a mask. With this process, the MTJ element 18 having, e.g., a three-layered structure including the ferromagnetic layer 14, insulating layer 15, and ferromagnetic layer 16 is formed. In this embodiment, for example, the ferromagnetic layer 14 functions as a memory-layer in which the direction of spin changes in accordance with the write magnetic field. The insulating layer 15 functions as a tunnel barrier. The ferromagnetic layer 16 functions as a fixed-layer in which the direction of spin is fixed. Note that the MTJ element 18 is not limited to the above three-layered structure.

As shown in FIGS. 11A to 11D, an insulating material, e.g., $SiO_2$ is deposited on the structure shown in FIGS. 10A to 10D to form a fifth dielectric interlayer 19. The fifth dielectric interlayer 19 is subjected to, e.g., chemical mechanical polishing (CMP) to expose the MTJ element 18. Next, an opening that reaches the intracell via 13-2 is formed in the fifth dielectric interlayer 19. The opening is filled with a conductive material, e.g., a metal such as tungsten to form an extra metal—second metal layer contact 20.

As shown in FIGS. 12A to 12D, a conductive material, e.g., a metal such as tungsten is deposited on the structure shown in FIGS. 11A to 11D to form an extra metal layer 21. In this embodiment, for example, the thickness of the extra metal layer 21, i.e., the thickness of the extra metal layer in the typical magnetic random access memory can be made small.

As shown in FIGS. 13A to 13D, the extra metal layer 21 is patterned to form the intracell local interconnection 21-1.

As shown in FIGS. 14A to 14D, an insulating material, e.g., $SiO_2$ is deposited on the structure shown in FIGS. 13A to 13D to form a sixth dielectric interlayer 22. An opening that reaches the intra-peripheral-circuit via 13-3 is formed in the sixth dielectric interlayer 22 and fifth dielectric interlayer 19. The opening is filled with a conductive material, e.g., a metal such as tungsten to form a third metal layer—second metal layer contact 23.

Next, as shown in FIGS. 15A to 15D, a conductive material such as AlCu or Cu is deposited on the structure shown in FIGS. 14A to 14D to form a third metal layer 24. For example, when AlCu or Cu is used for the third metal layer 24, it is generally sandwiched between barrier metal layers. To do this, barrier metal layers may be formed under and on the third metal layer 24. This also applies to other embodiments to be described below. Examples of the material of the barrier metal layer are Ti, TiN, Ta, TaN, and W. The third metal layer 24 is patterned to form the write word line 24-1 and an intra-peripheral-circuit interconnection 24-2.

In this way, the magnetic random access memory according to the first embodiment can be formed.

(Second Embodiment)

Figure 16:
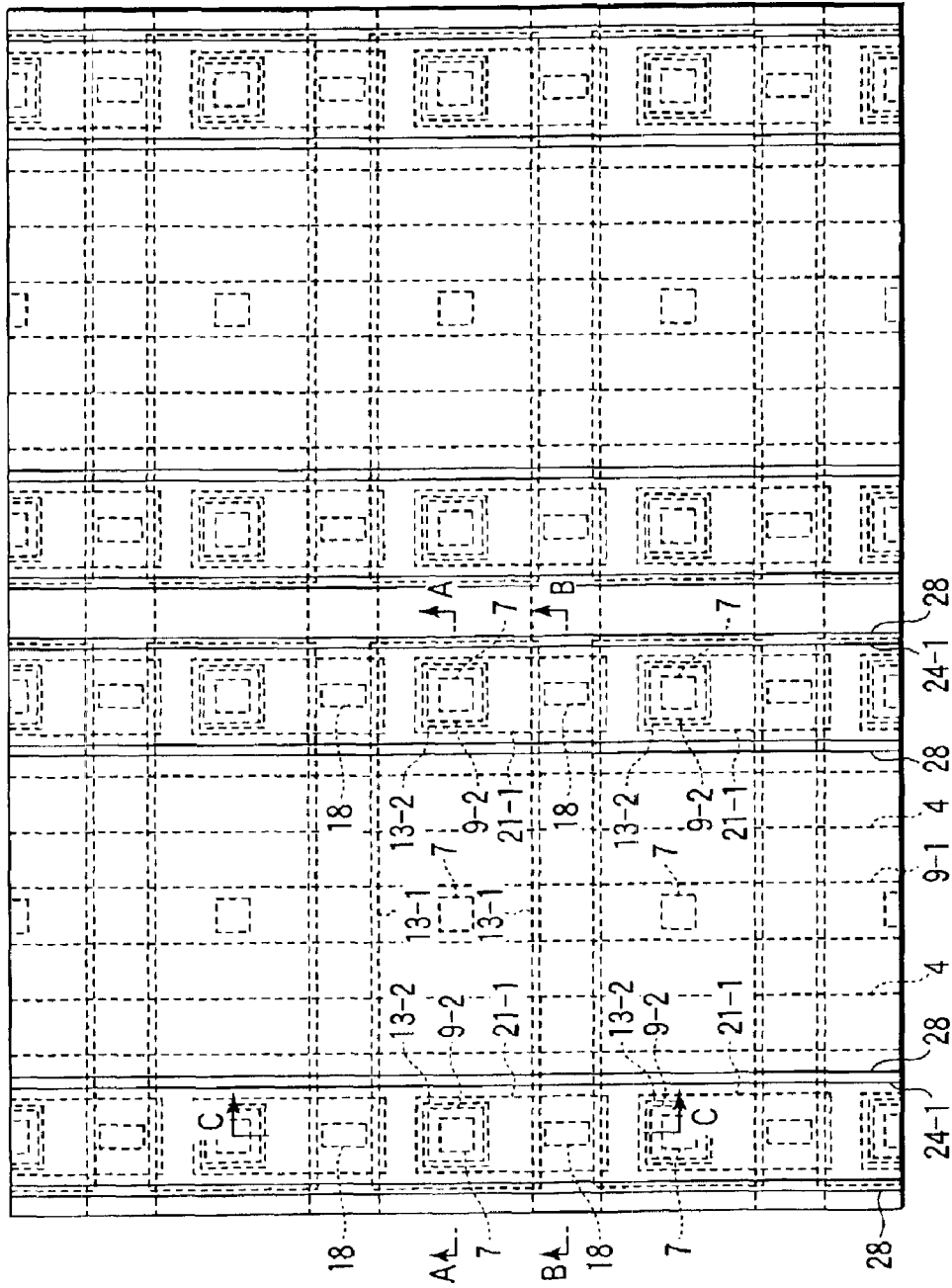
FIG. 16 is a plan view showing the planar pattern of a magnetic random access memory according to a second embodiment of the present invention.
Figure 17A:
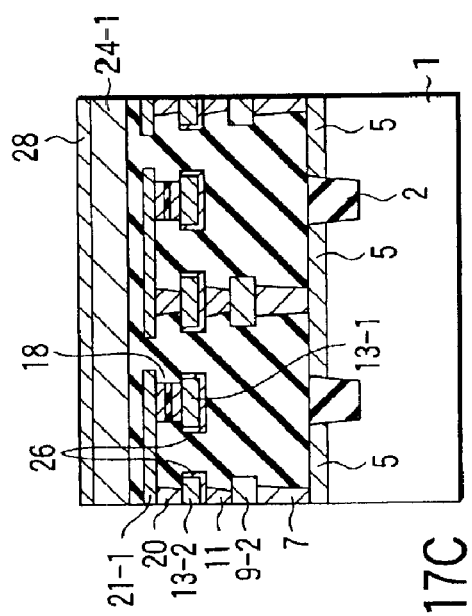
FIG. 17A is a sectional view taken along a line A—A in FIG. 16.
Figure 17C:
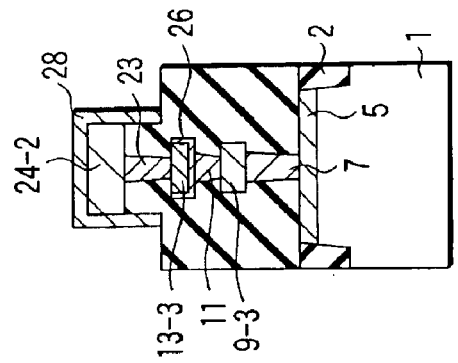
FIG. 17C is a sectional view taken along a line C—C in FIG. 16.
Figure 17B:
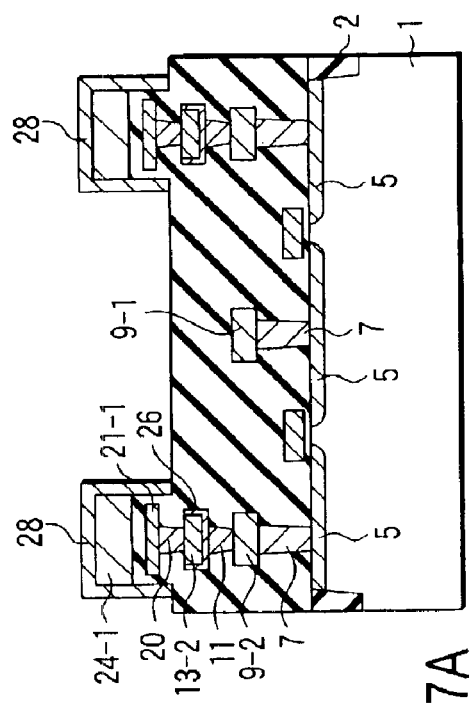
FIG. 17B is a sectional view taken along a line B—B in FIG. 16.
Figure 17D:
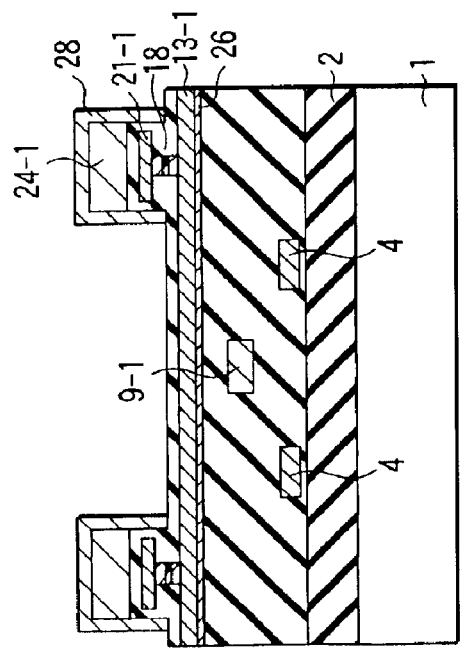
FIG. 17D is a sectional view of the substrate contact portion of a peripheral circuit.
Figure 18C:
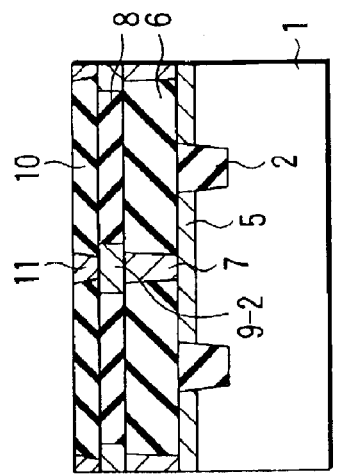
FIGS. 18A, 18B, 18C, and 18D are sectional views showing a first method of manufacturing the magnetic random access memory according to the second embodiment of the present invention.
Figure 18D:
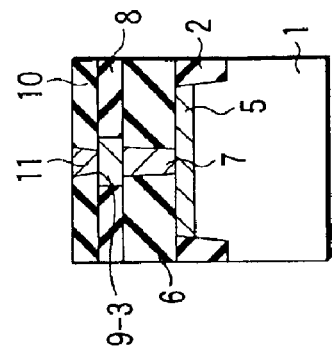
Figure 18A:
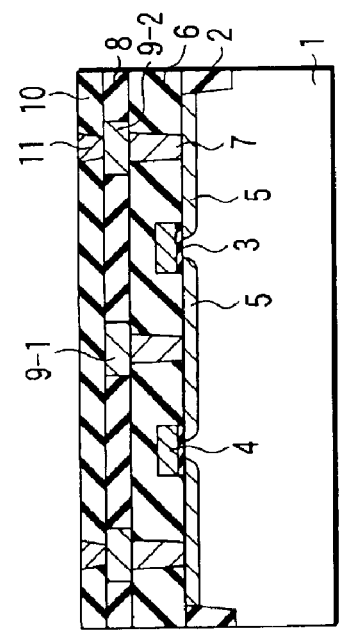
Figure 18B:
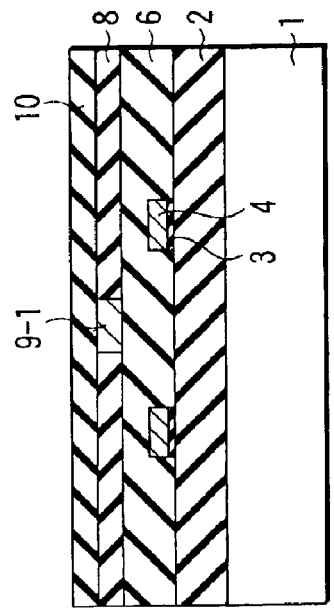
Figure 19A:
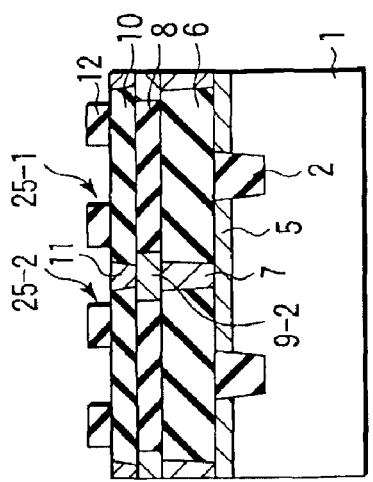
FIGS. 19A, 19B, 19C, and 19D are sectional views showing the first method of manufacturing the magnetic random access memory according to the second embodiment of the present invention.
Figure 19B:
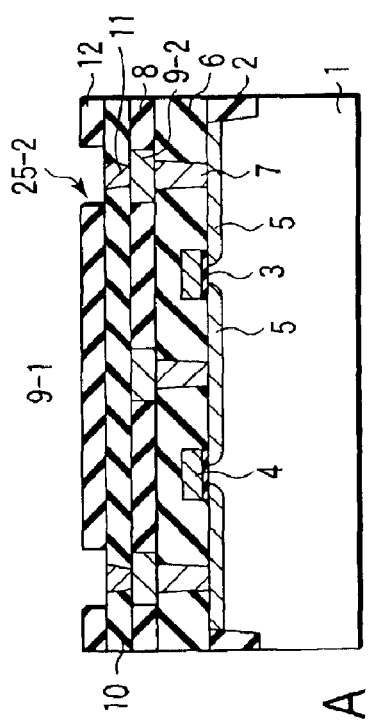
Figure 19C:
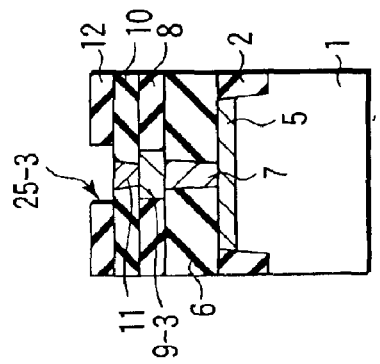
Figure 19D:
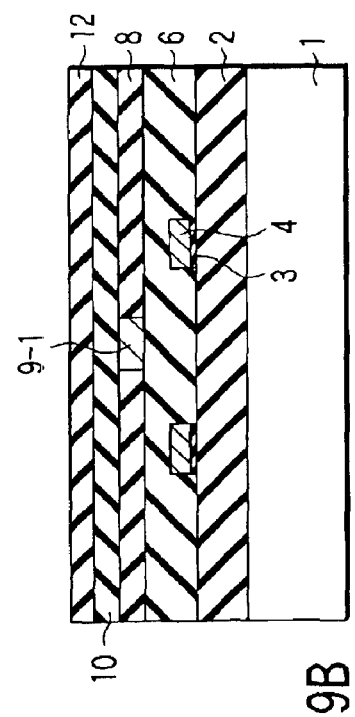
Figure 20C:
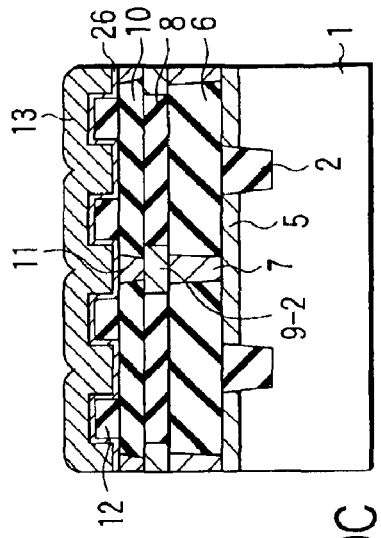
FIGS. 20A, 20B, 20C, and 20D are sectional views showing the first method of manufacturing the magnetic random access memory according to the second embodiment of the present invention.
Figure 20D:
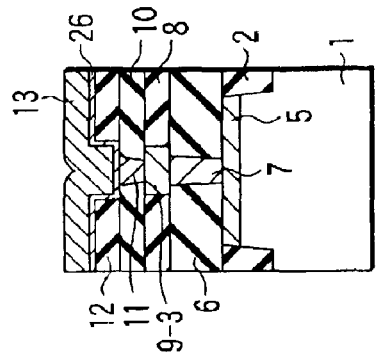
Figure 20A:
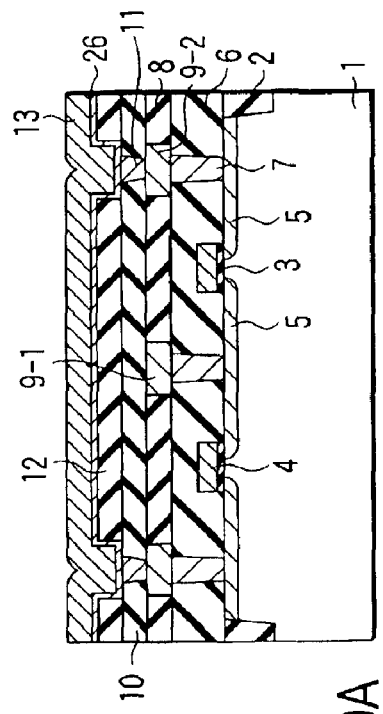
Figure 20B:
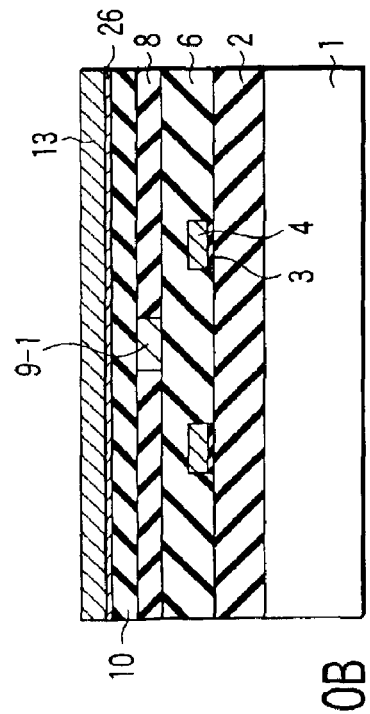
Figure 21A:
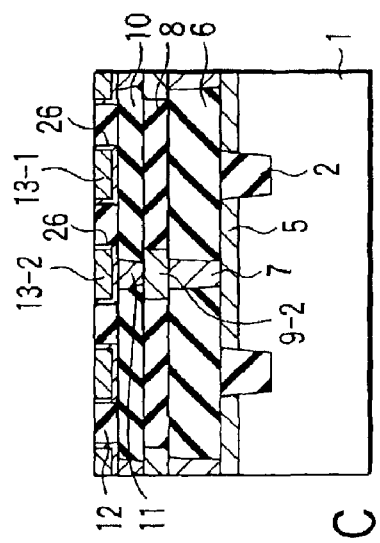
FIGS. 21A, 21B, 21C, and 21D are sectional views showing the first method of manufacturing the magnetic random access memory according to the second embodiment of the present invention.
Figure 21B:
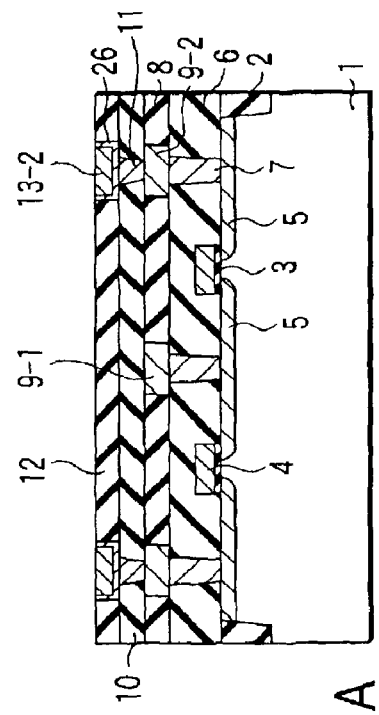
Figure 21C:
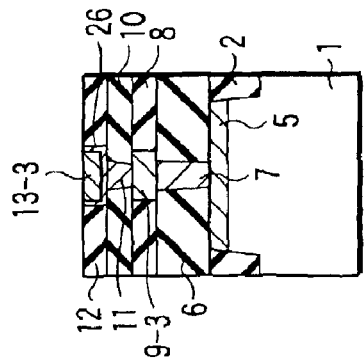
Figure 21D:
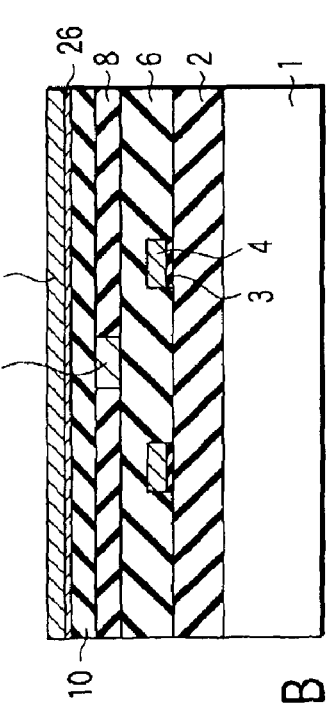
Figure 22C:
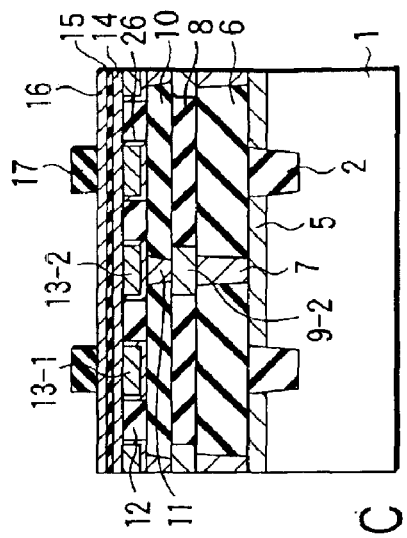
FIGS. 22A, 22B, 22C, and 22D are sectional views showing the first method of manufacturing the magnetic random access memory according to the second embodiment of the present invention.
Figure 22D:
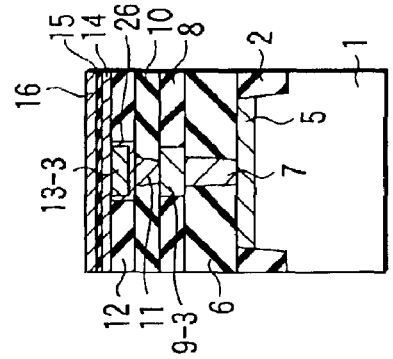
Figure 22A:
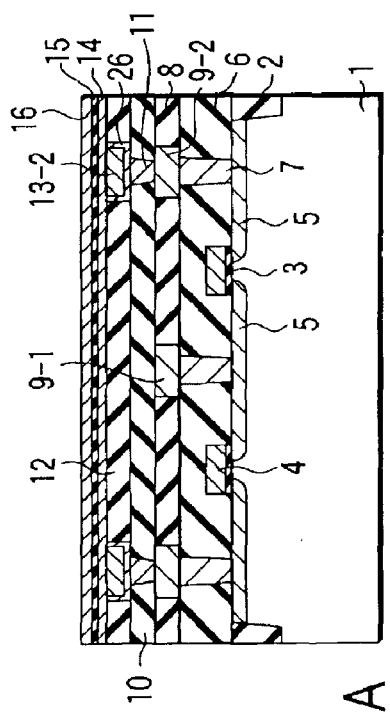
Figure 22B:
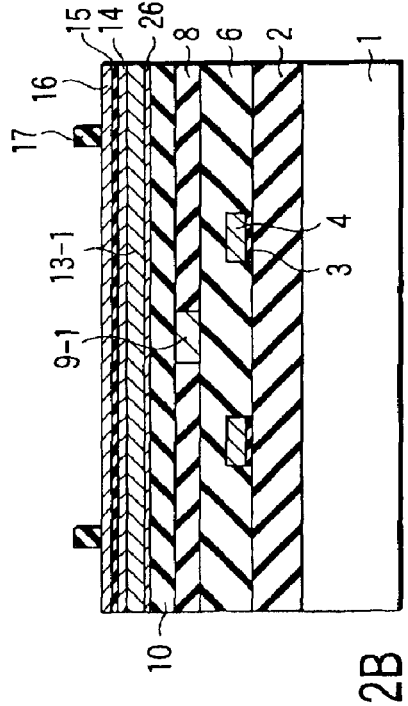
Figure 23A:
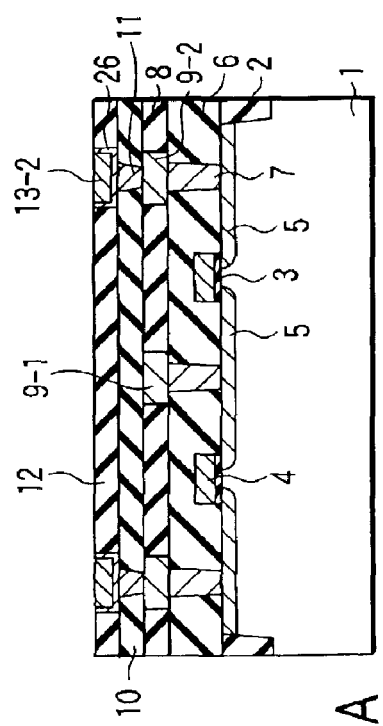
FIGS. 23A, 23B, 23C, and 23D are sectional views showing the first method of manufacturing the magnetic random access memory according to the second embodiment of the present invention.
Figure 23B:
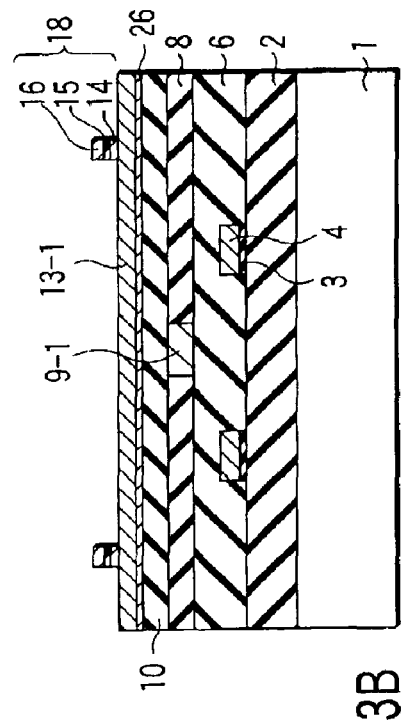
Figure 23C:
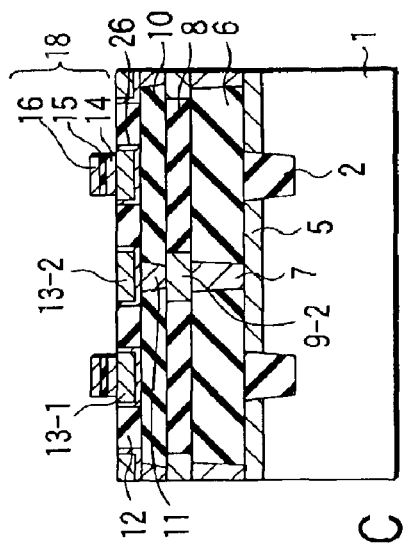
Figure 23D:
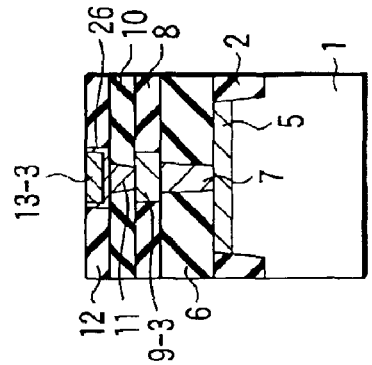
Figure 24C:
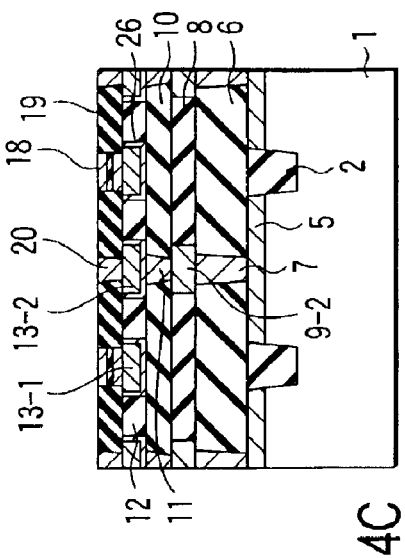
FIGS. 24A, 24B, 24C, and 24D are sectional views showing the first method of manufacturing the magnetic random access memory according to the second embodiment of the present invention.
Figure 24D:
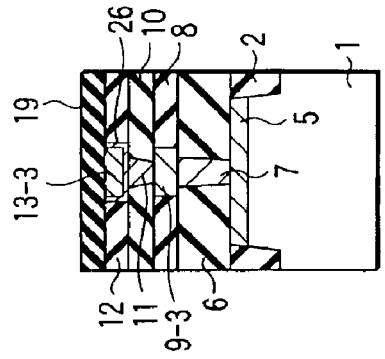
Figure 24A:
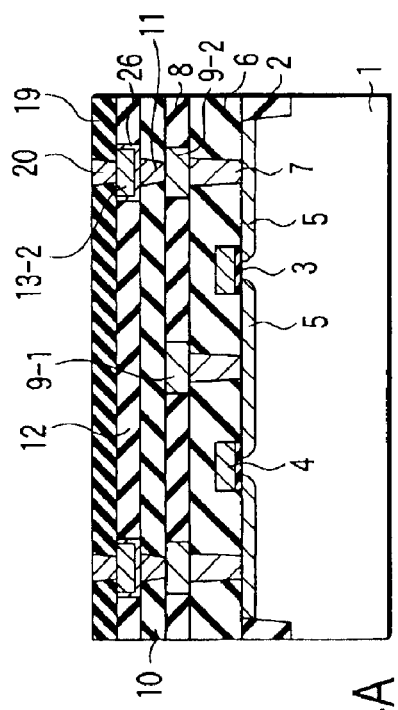
Figure 24B:
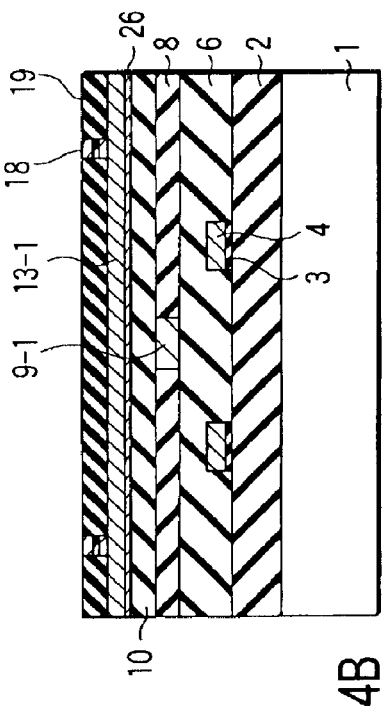
Figure 25A:
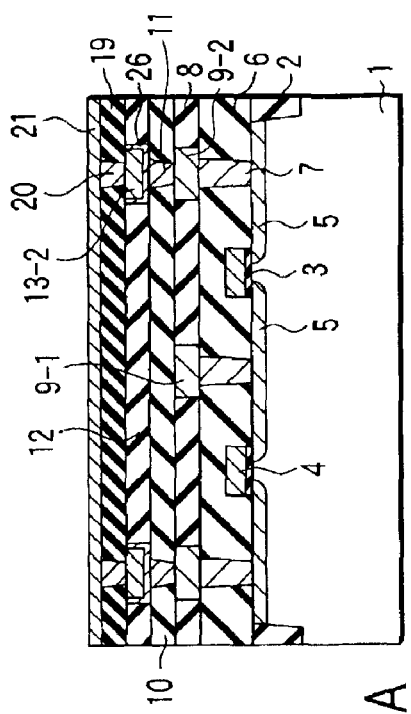
FIGS. 25A, 25B, 25C, and 25D are sectional views showing the first method of manufacturing the magnetic random access memory according to the second embodiment of the present invention.
Figure 25B:
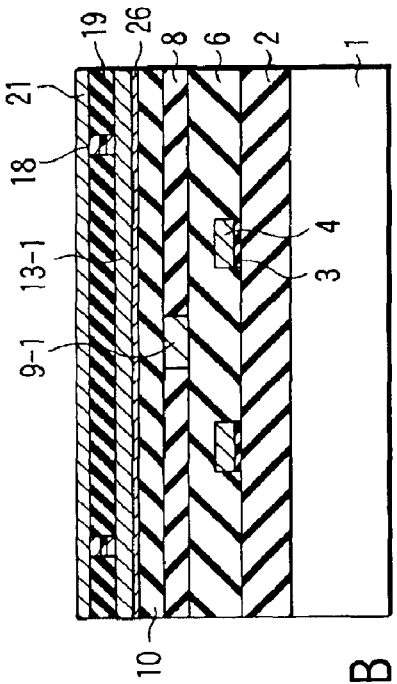
Figure 25C:
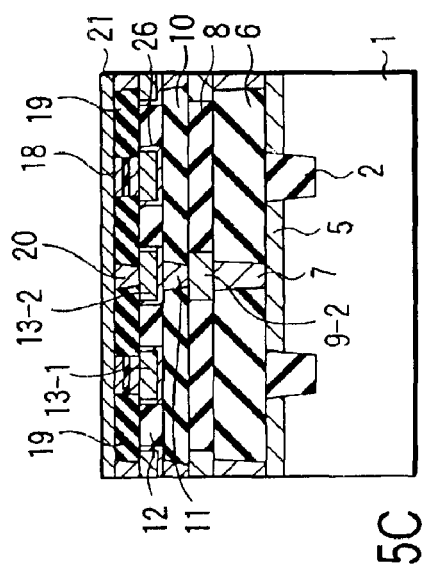
Figure 25D:
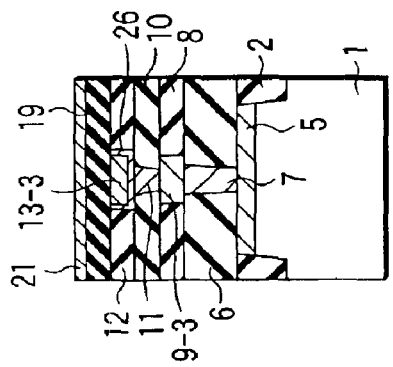
Figure 26A:
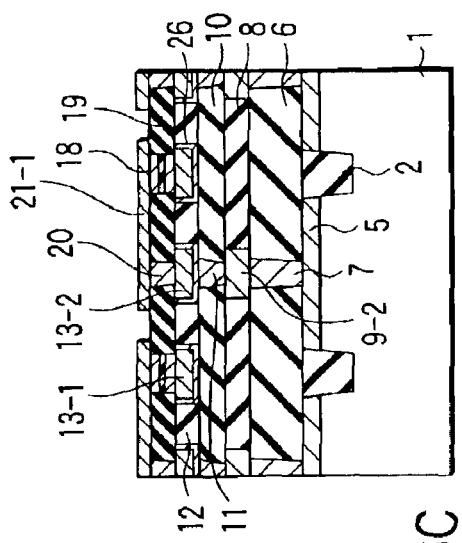
FIGS. 26A, 26B, 26C, and 26D are sectional views showing the first method of manufacturing the magnetic random access memory according to the second embodiment of the present invention.
Figure 26C:
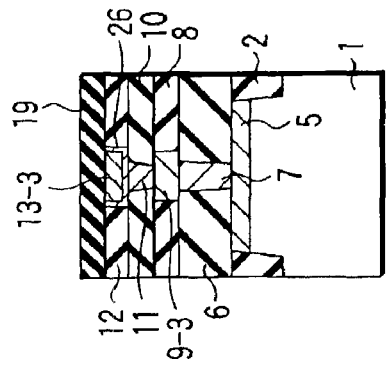
Figure 26B:
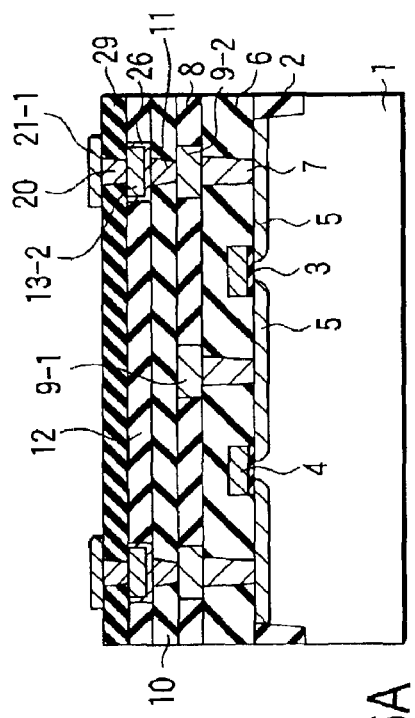
Figure 26D:
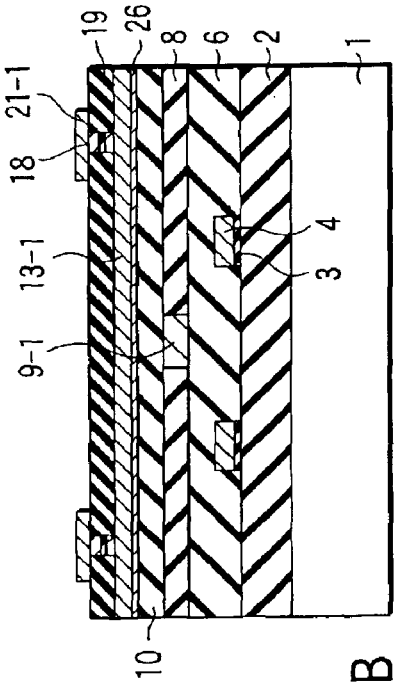
Figure 27A:
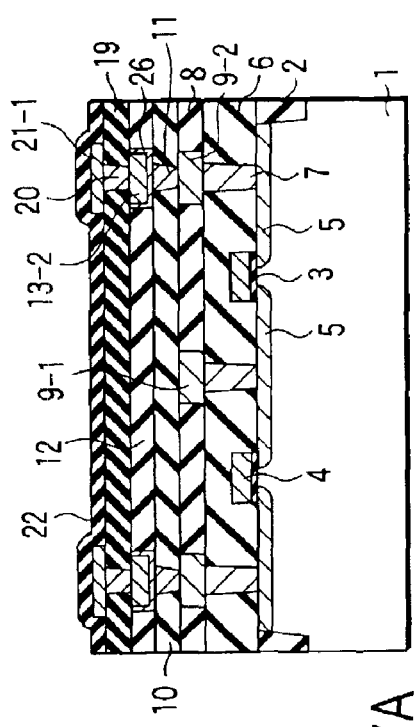
FIGS. 27A, 27B, 27C, and 27D are sectional views showing the first method of manufacturing the magnetic random access memory according to the second embodiment of the present invention.
Figure 27B:
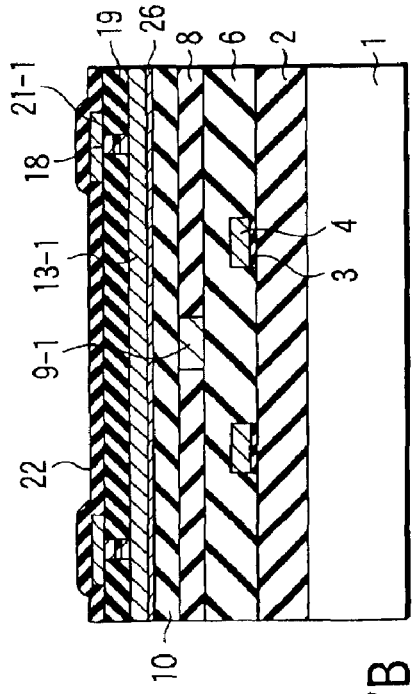
Figure 27C:
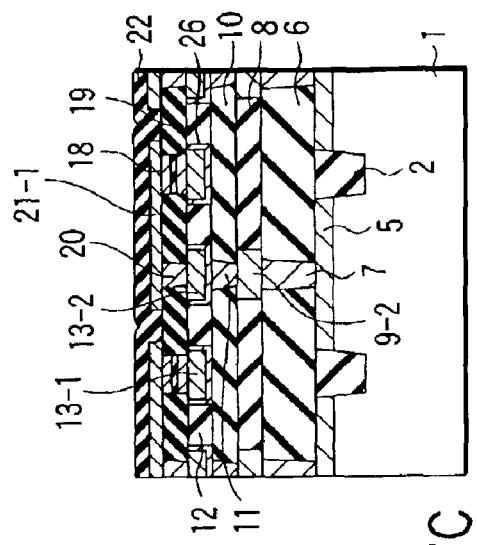
Figure 27D:
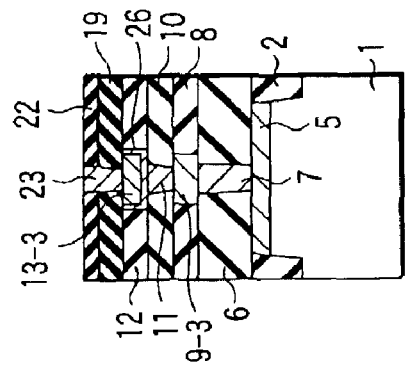
Figure 28A:
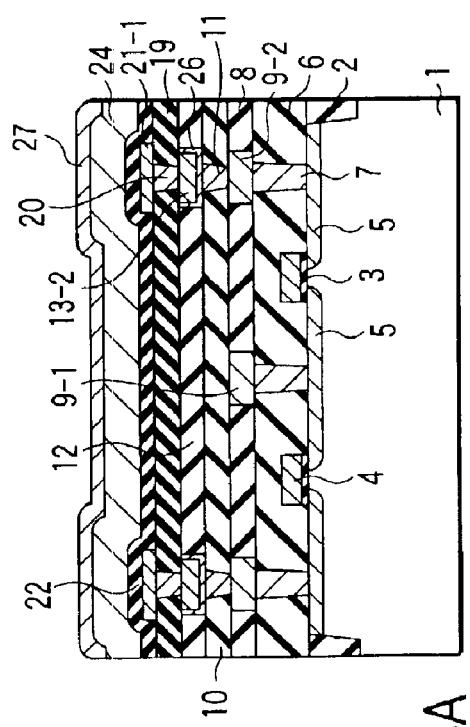
FIGS. 28A, 28B, 28C, and 28D are sectional views showing the first method of manufacturing the magnetic random access memory according to the second embodiment of the present invention.
Figure 28B:
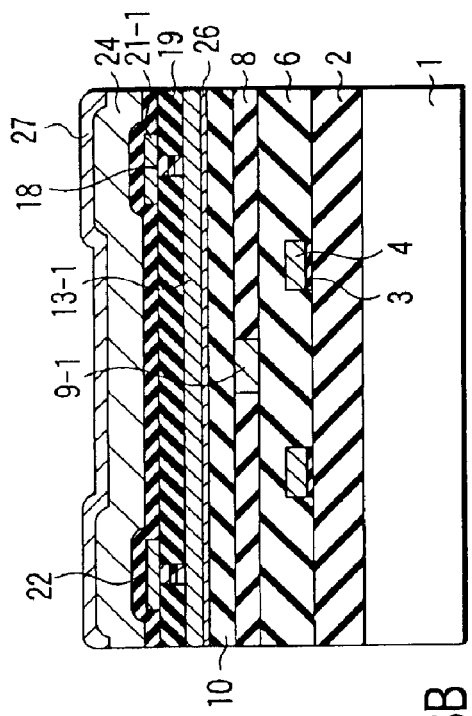
Figure 28C:
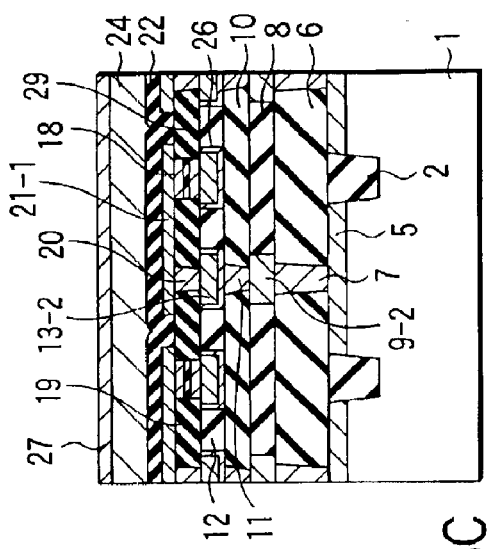
Figure 28D:
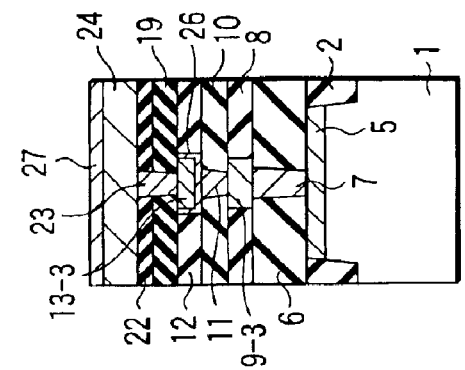
Figure 30C:
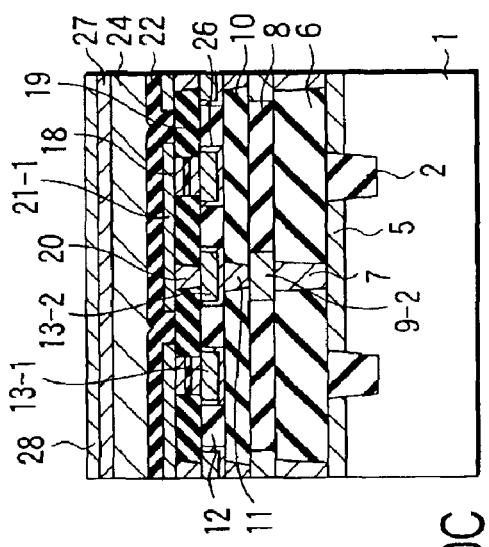
FIGS. 30A, 30B, 30C, and 30D are sectional views showing the first method of manufacturing the magnetic random access memory according to the second embodiment of the present invention.
Figure 30D:
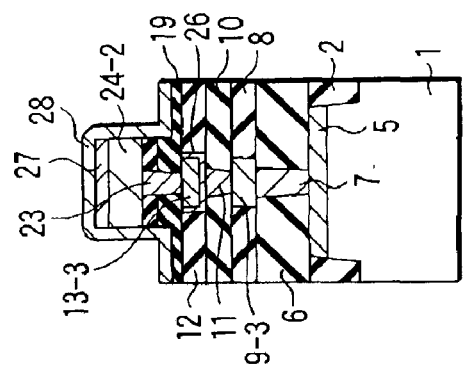
Figure 30A:
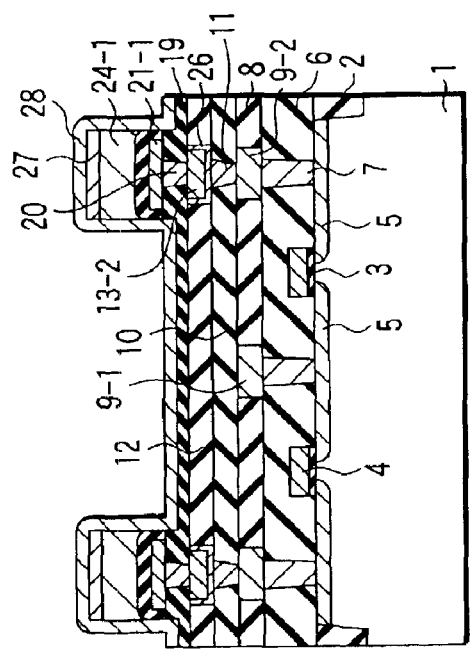
Figure 30B:
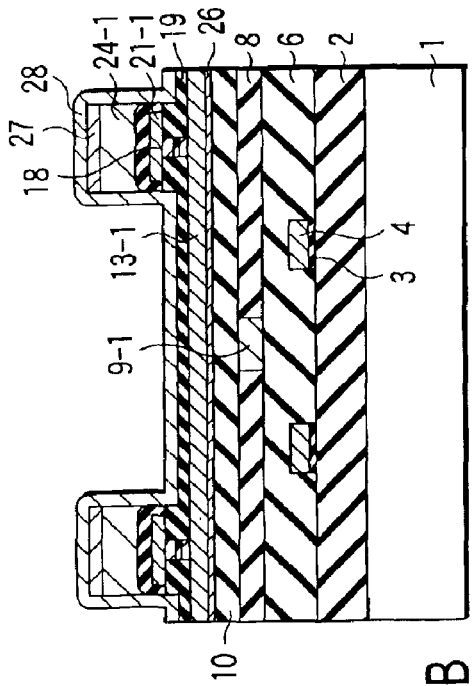
Figure 31C:
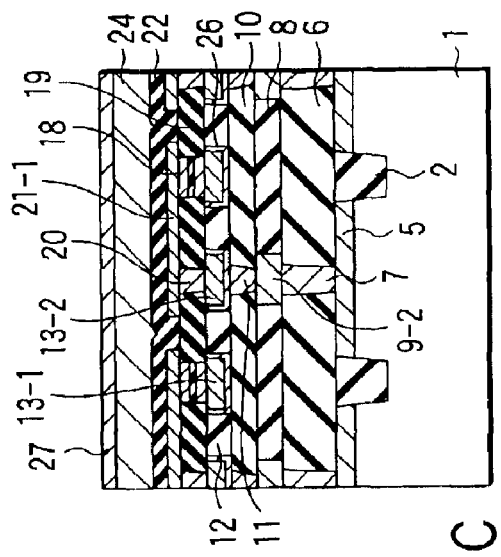
FIGS. 31A, 31B, 31C, and 31D are sectional views showing the first method of manufacturing the magnetic random access memory according to the second embodiment of the present invention.
Figure 31D:
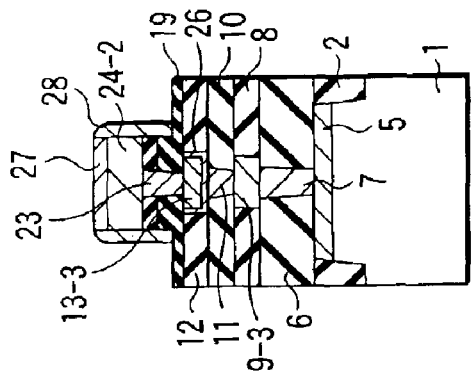
Figure 31A:
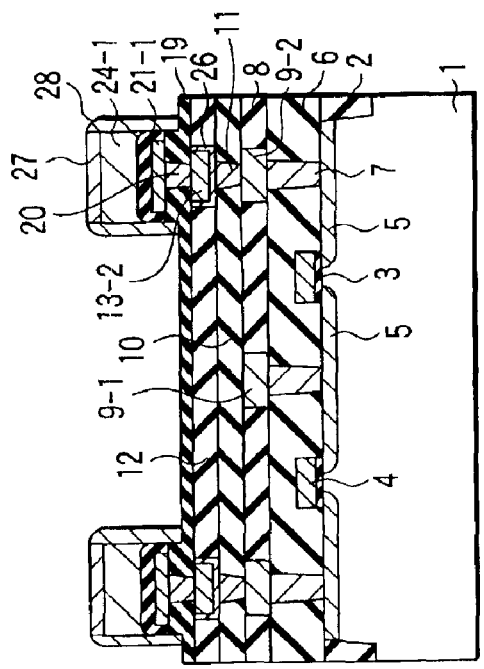
Figure 31B:
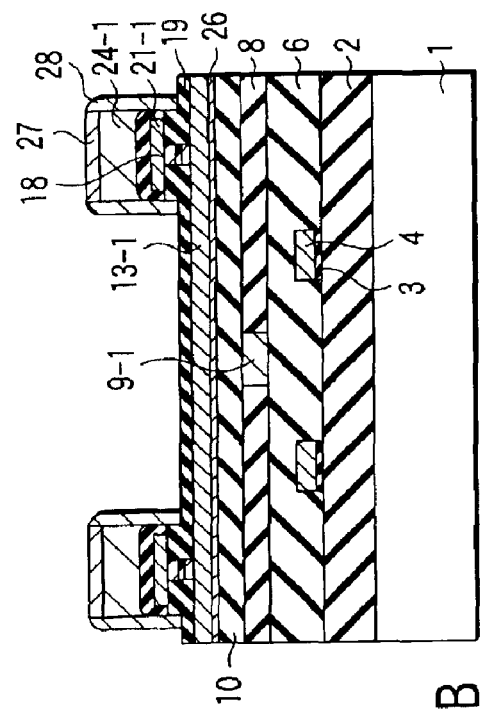
Figure 32C:
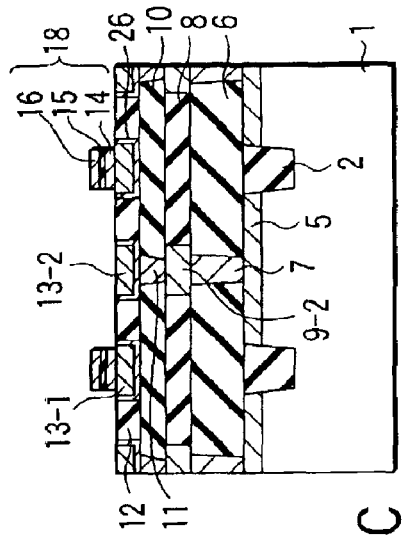
FIGS. 32A, 32B, 32C, and 32D are sectional views showing a second method of manufacturing the magnetic random access memory according to the second embodiment of the present invention.
Figure 32D:
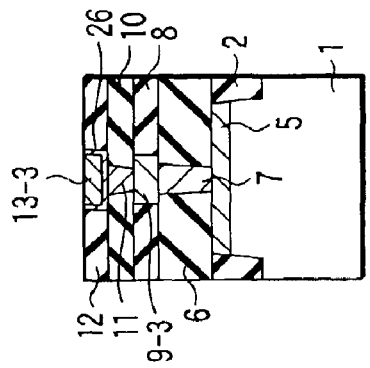
Figure 32A:
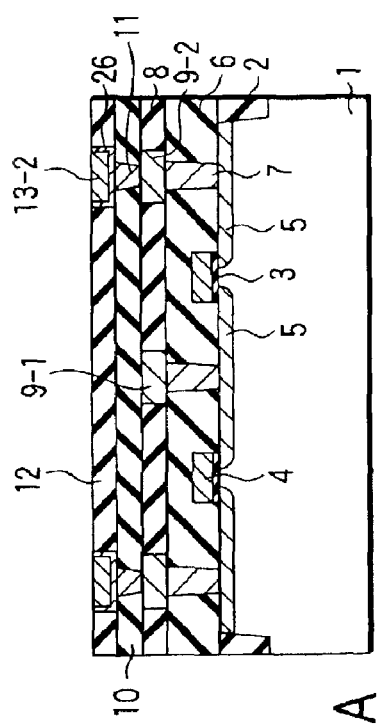
Figure 32B:
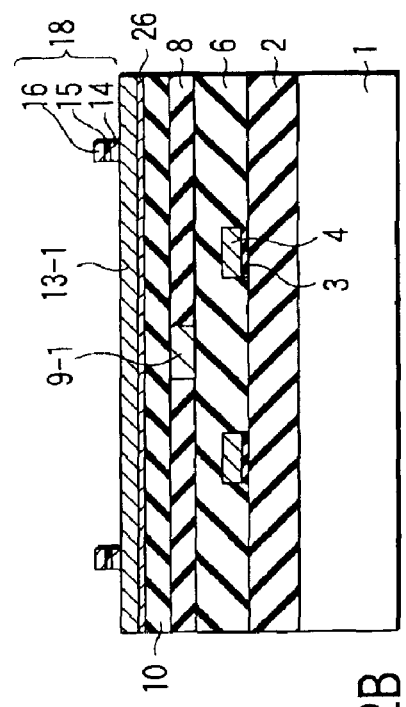
Figure 33A:
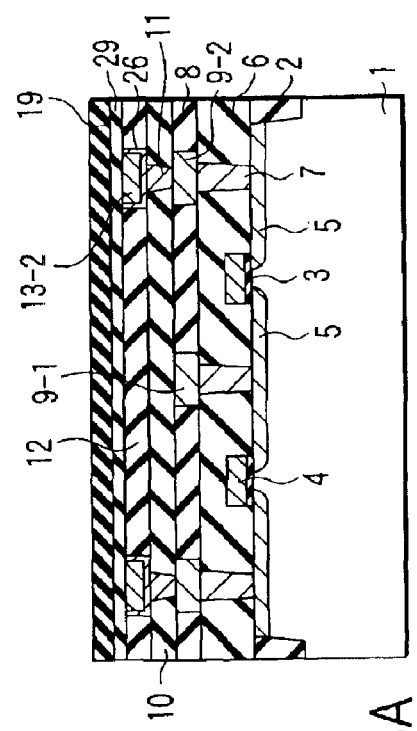
FIGS. 33A, 33B, 33C, and 33D are sectional views showing the second method of manufacturing the magnetic random access memory according to the second embodiment of the present invention.
Figure 33B:
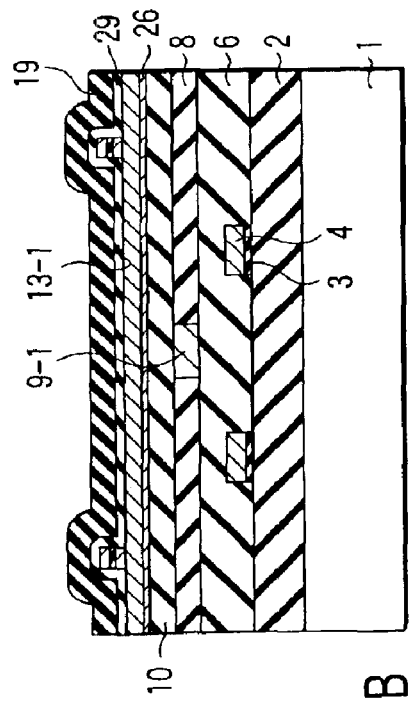
Figure 33C:
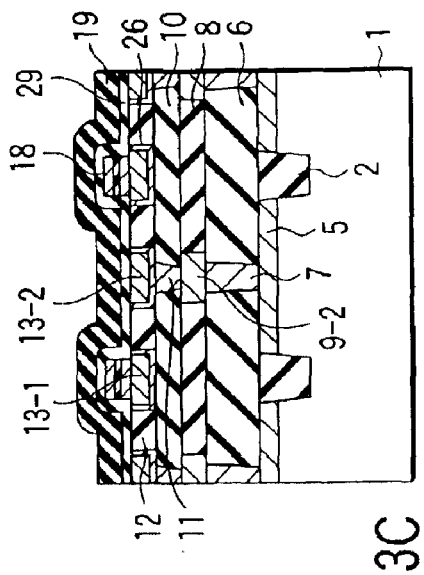
Figure 33D:
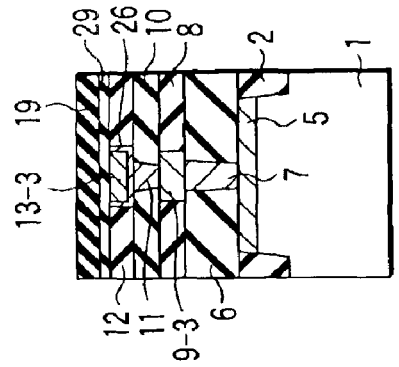
Figure 34C:
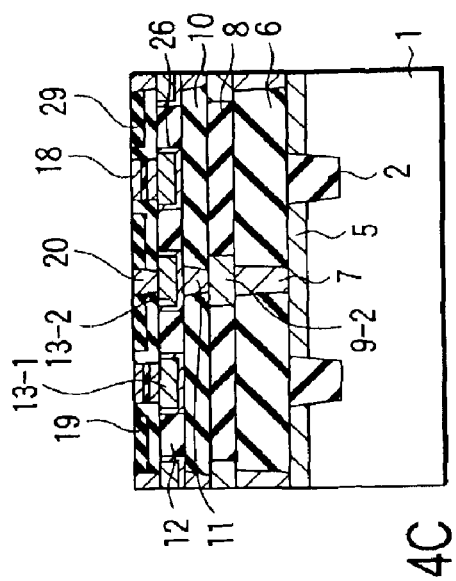
FIGS. 34A, 34B, 34C, and 34D are sectional views showing the second method of manufacturing the magnetic random access memory according to the second embodiment of the present invention.
Figure 34D:
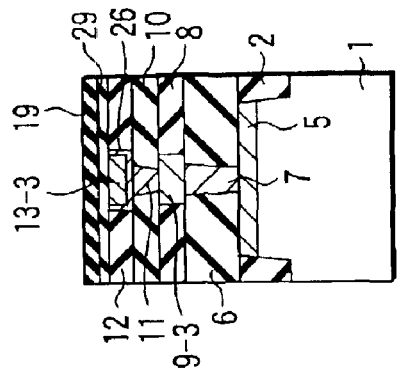
Figure 34A:
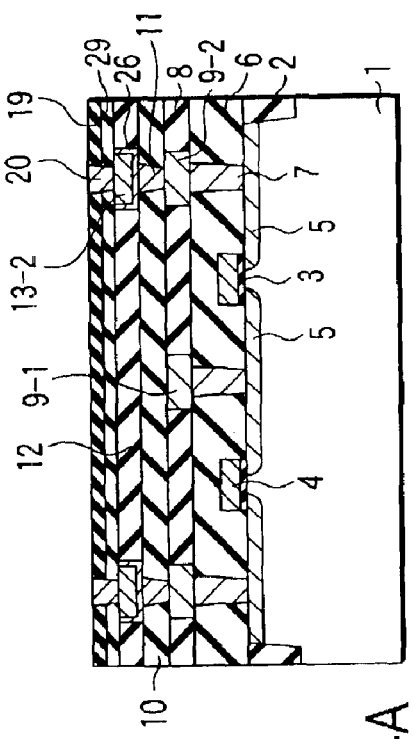
Figure 34B:
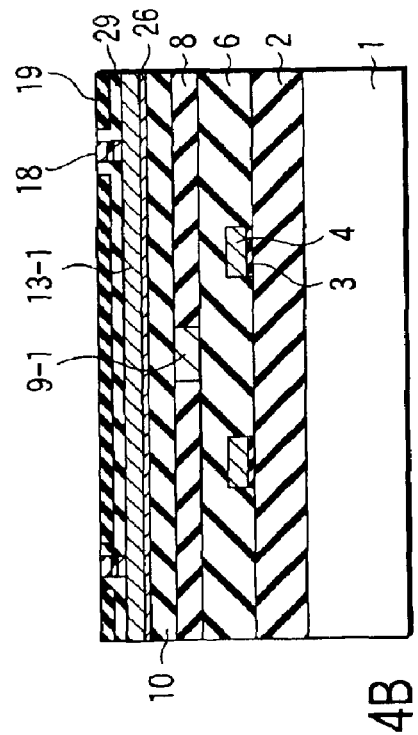
Figure 35A:
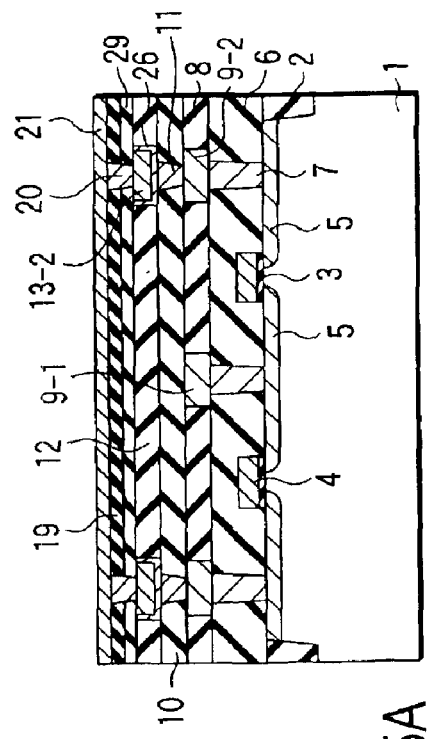
FIGS. 35A, 35B, 35C, and 35D are sectional views showing the second method of manufacturing the magnetic random access memory according to the second embodiment of the present invention.
Figure 35C:
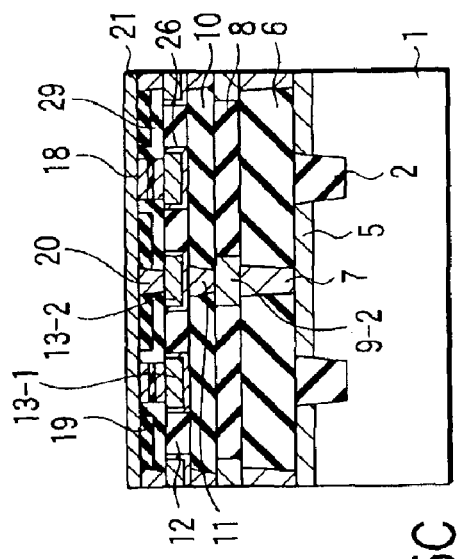
Figure 35B:
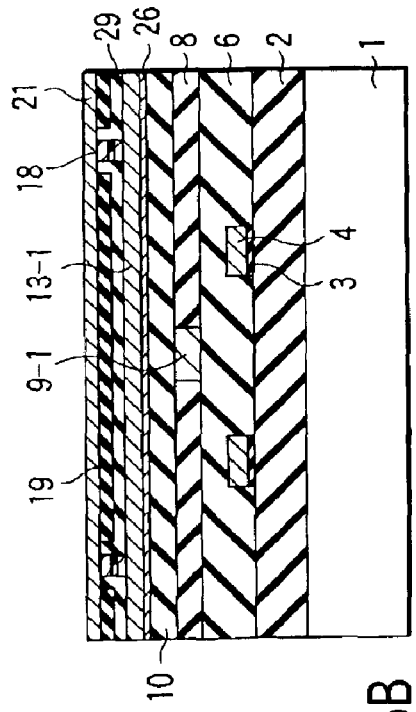
Figure 35D:
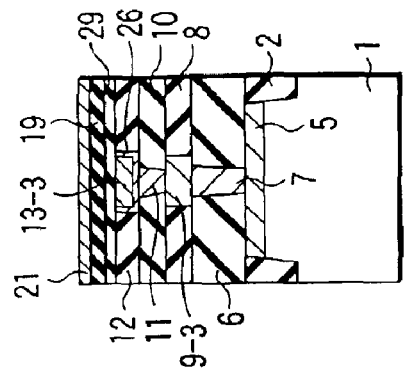
Figure 36A:
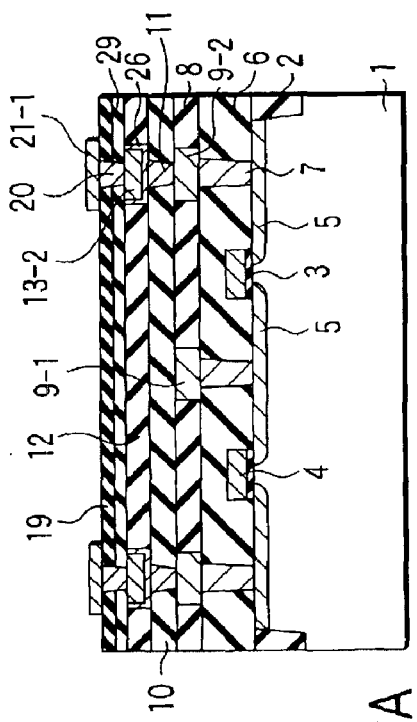
FIGS. 36A, 36B, 36C, and 36D are sectional views showing the second method of manufacturing the magnetic random access memory according to the second embodiment of the present invention.
Figure 36C:
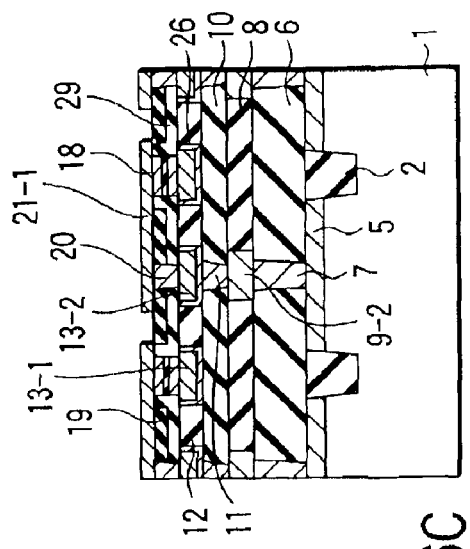
Figure 36B:
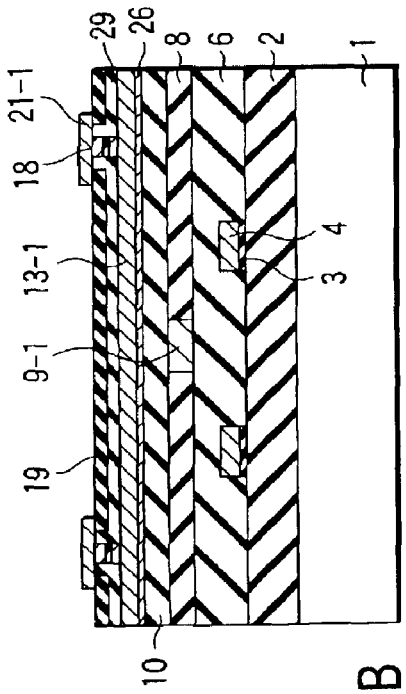
Figure 36D:
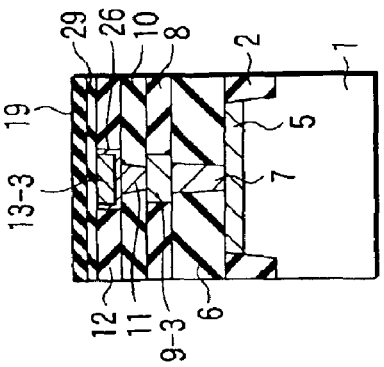
Figure 38A:
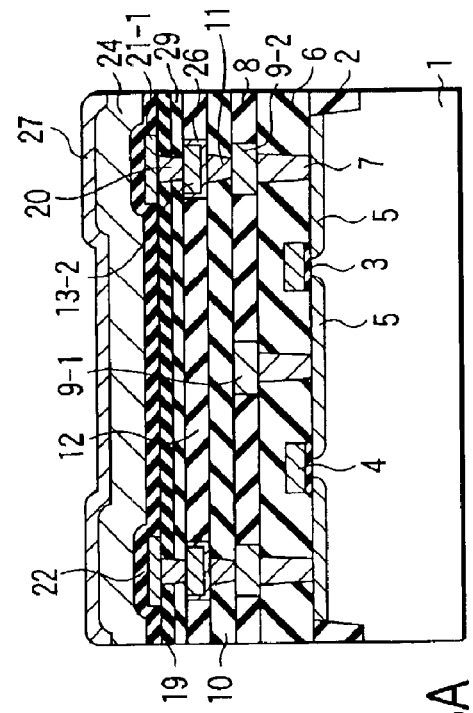
FIGS. 38A, 38B, 38C, and 38D are sectional views showing the second method of manufacturing the magnetic random access memory according to the second embodiment of the present invention.
Figure 38B:
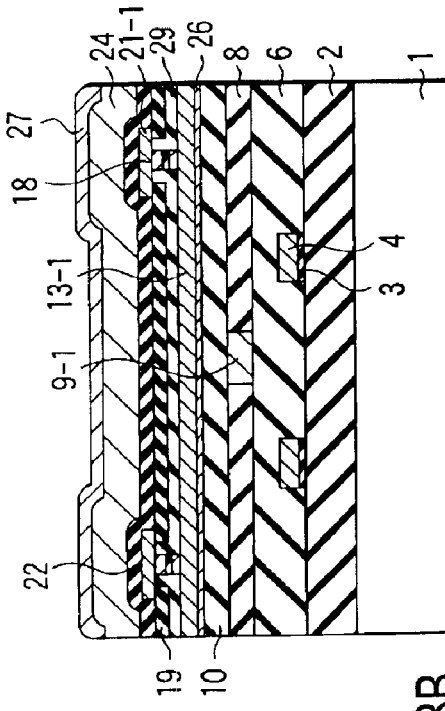
Figure 38C:
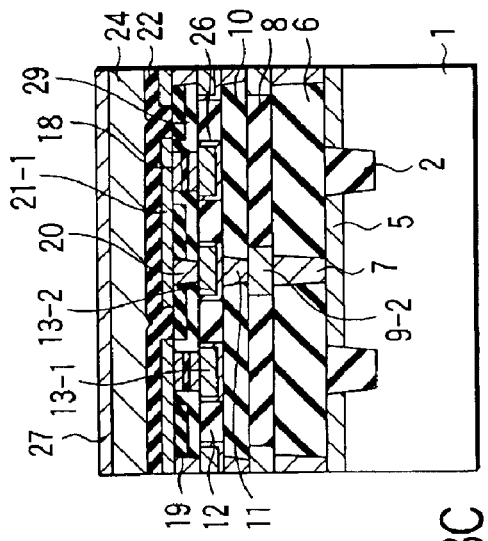
Figure 38D:
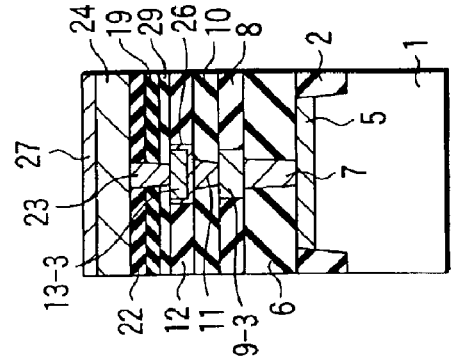
Figure 41C:
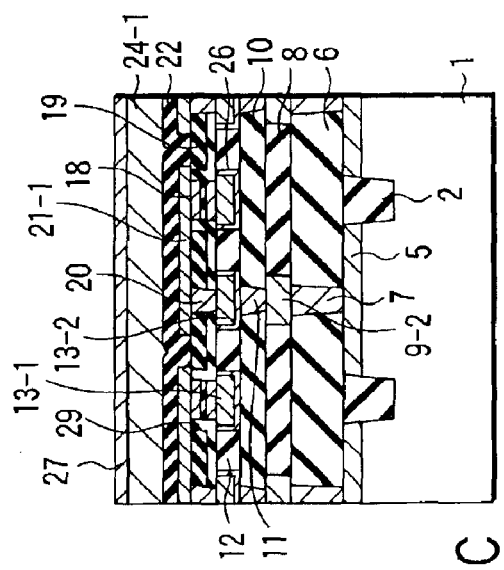
FIGS. 41A, 41B, 41C, and 41D are sectional views showing the second method of manufacturing the magnetic random access memory according to the second embodiment of the present invention.
Figure 41D:
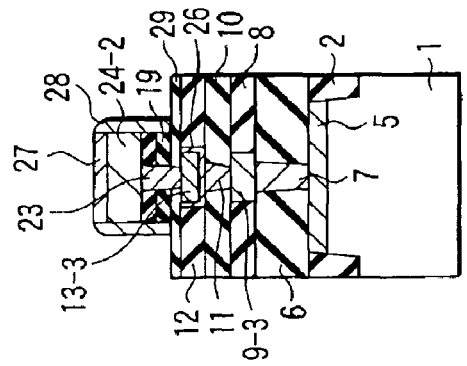
Figure 41A:
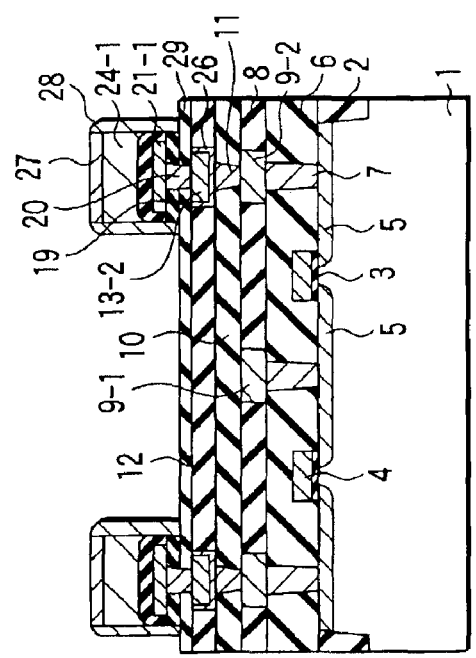
Figure 41B:
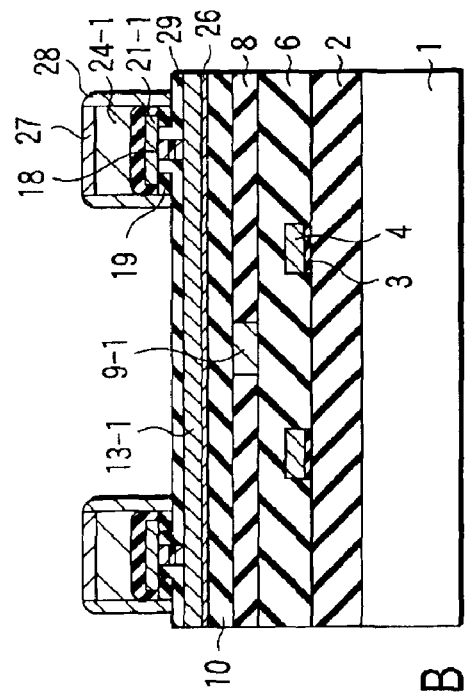
Figure 42A:
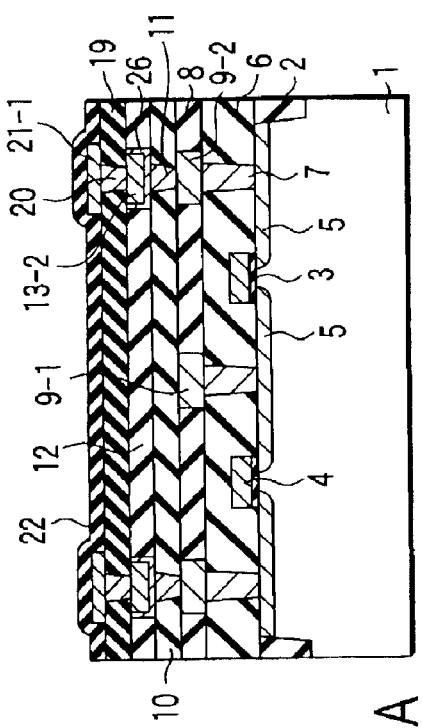
FIGS. 42A, 42B, 42C, and 42D are sectional views showing the third method of manufacturing the magnetic random access memory according to the second embodiment of the present invention.
Figure 42B:
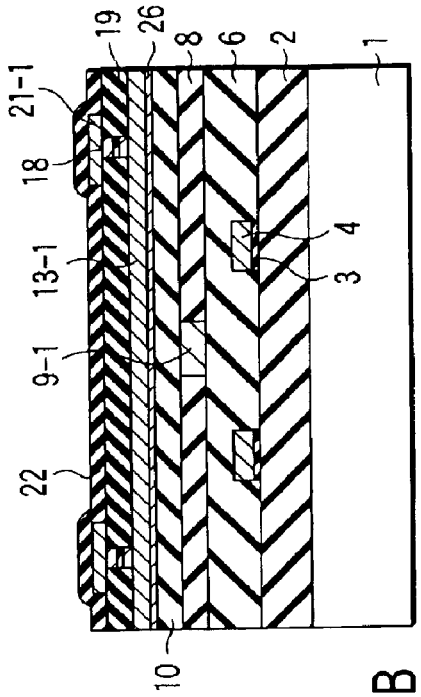
Figure 42C:
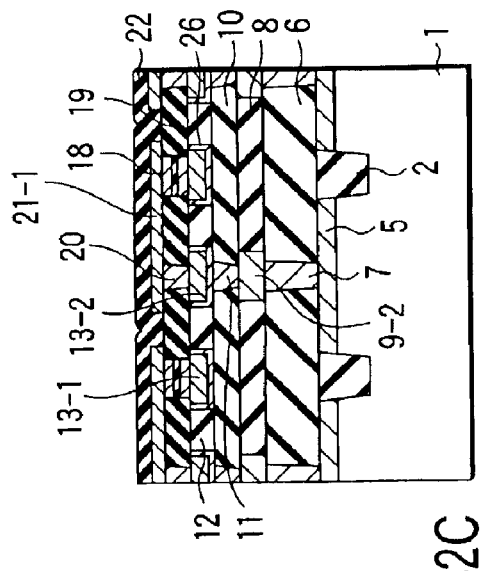
Figure 42D:
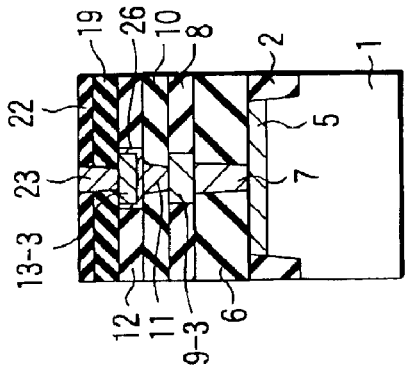
Figure 43C:
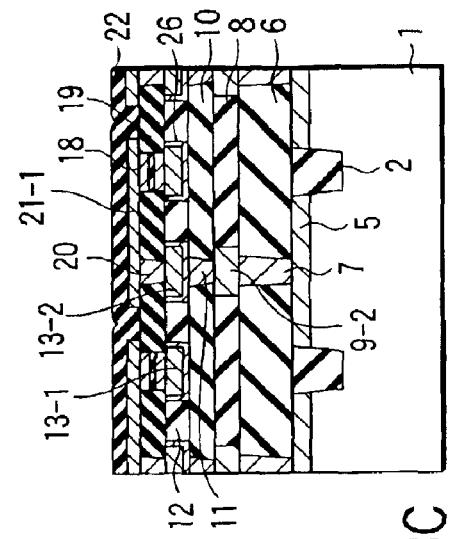
FIGS. 43A, 43B, 43C, and 43D are sectional views showing the third method of manufacturing the magnetic random access memory according to the second embodiment of the present invention.
Figure 43D:
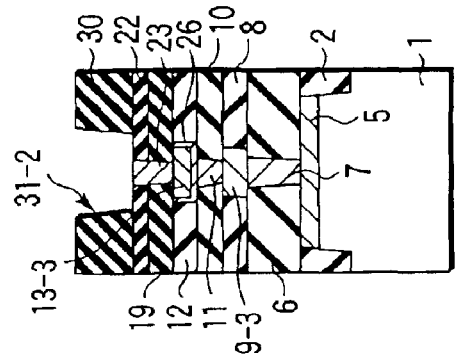
Figure 43A:
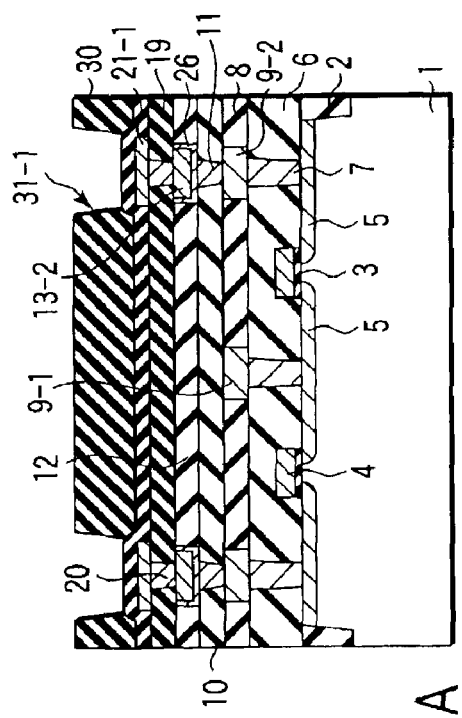
Figure 43B:
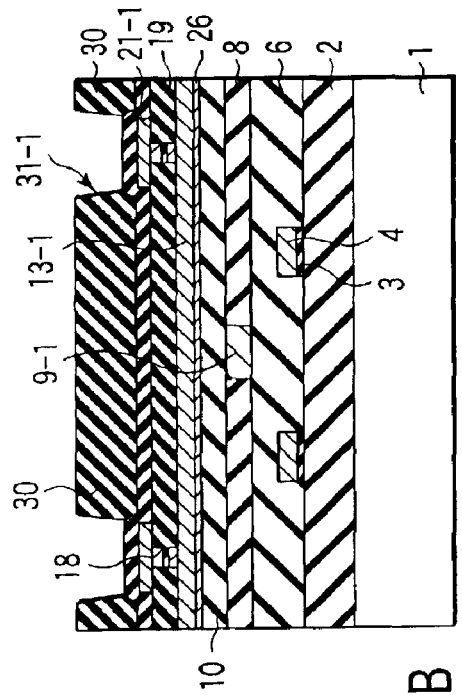
Figure 44A:
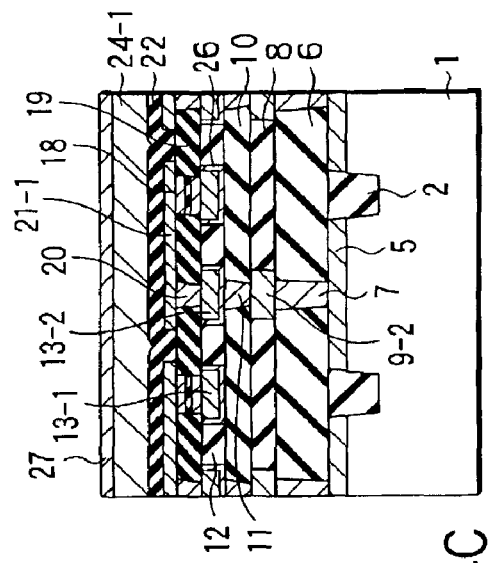
FIGS. 44A, 44B, 44C, and 44D are sectional views showing the third method of manufacturing the magnetic random access memory according to the second embodiment of the present invention.
Figure 44B:
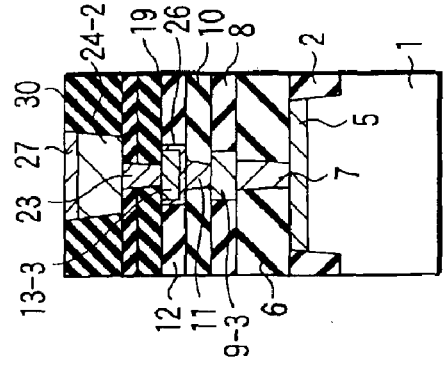
Figure 44C:
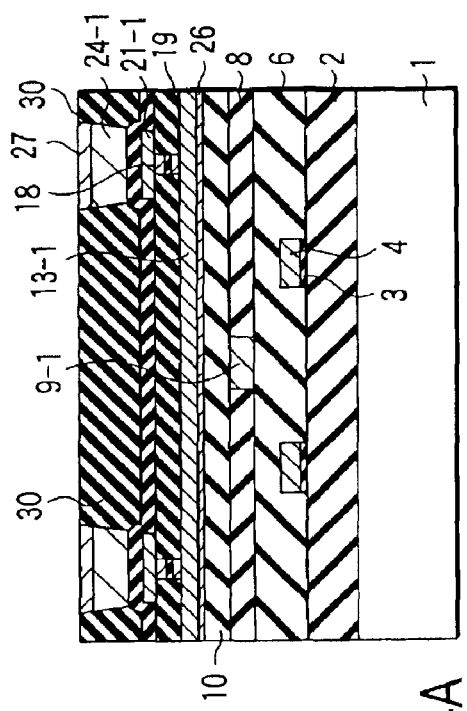
Figure 44D:
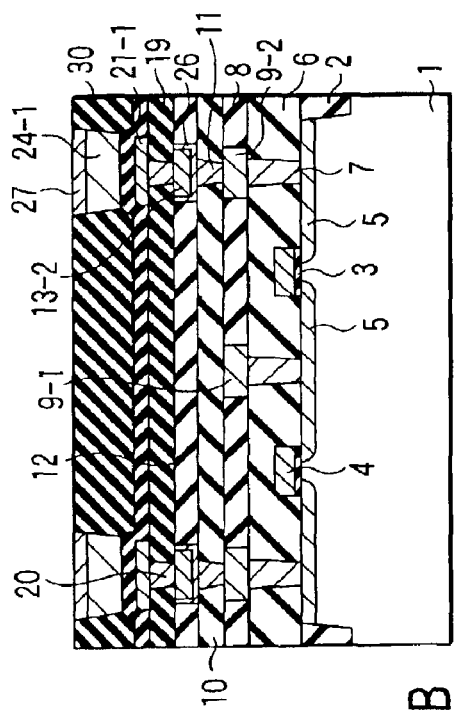
Figure 45C:
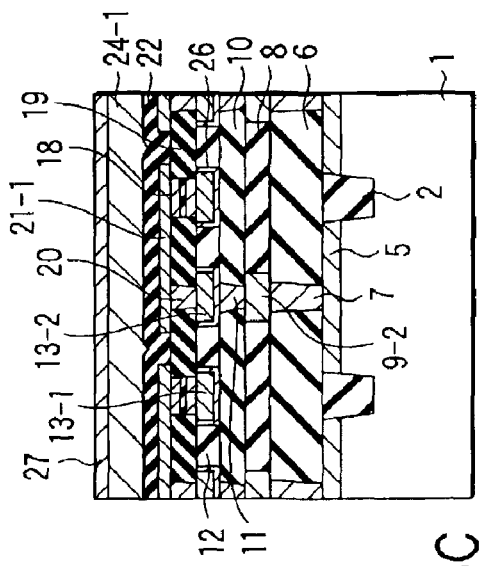
FIGS. 45A, 45B, 45C, and 45D are sectional views showing the third method of manufacturing the magnetic random access memory according to the second embodiment of the present invention.
Figure 45D:
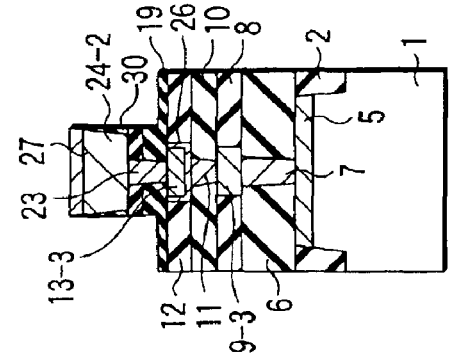
Figure 45A:
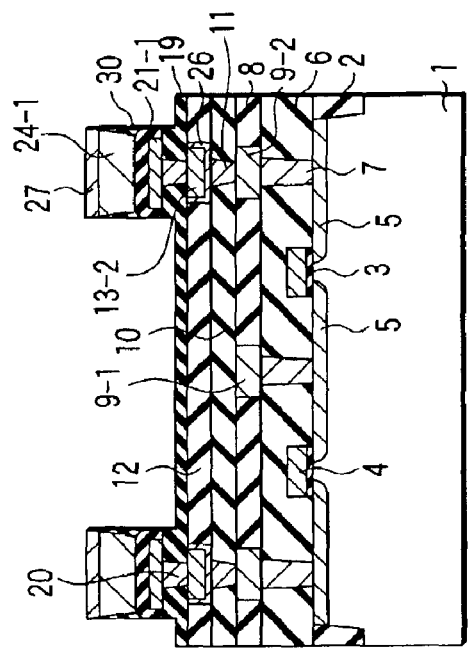
Figure 45B:
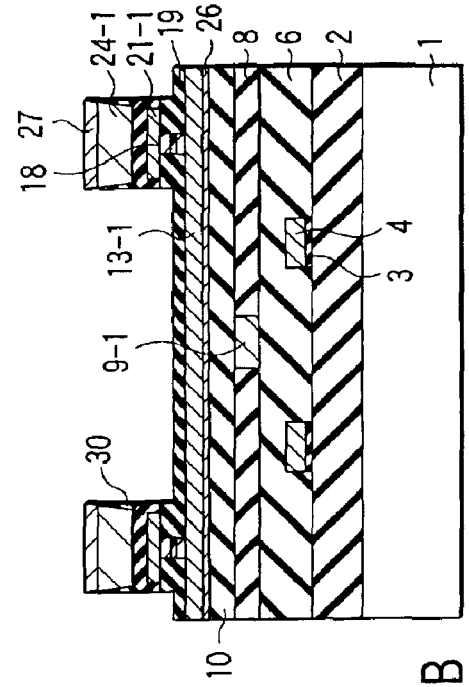
Figure 46A:
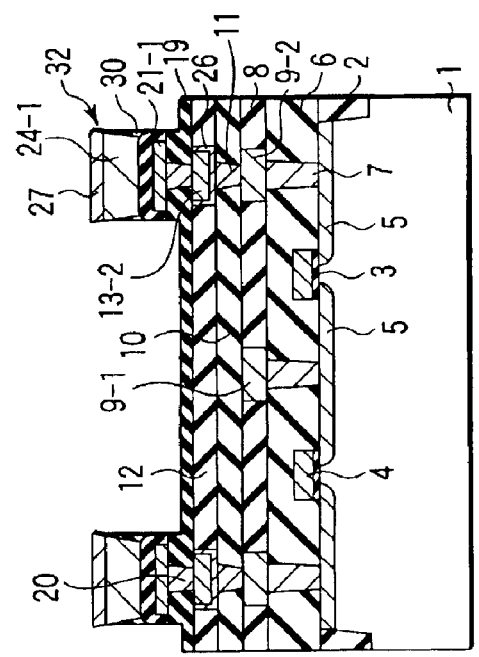
FIGS. 46A, 46B, 46C, and 46D are sectional views showing the third method of manufacturing the magnetic random access memory according to the second embodiment of the present invention.
Figure 46B:
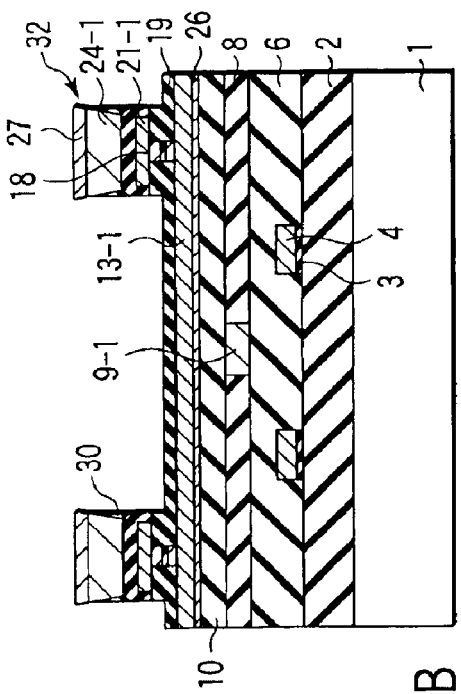
Figure 46C:
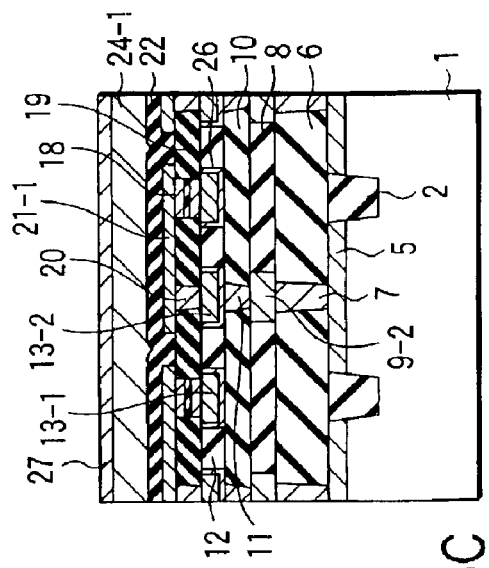
Figure 46D:
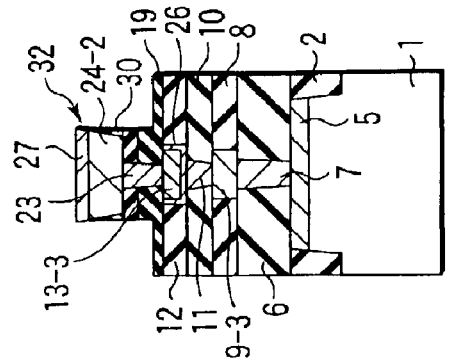

FIG. 16 is a plan view showing the planar pattern of a magnetic random access memory according to a second embodiment of the present invention. FIG. 17A is a sectional view taken along a line A—A in FIG. 16. FIG. 17B is a sectional view taken along a line B—B in FIG. 16. FIG. 17C is a sectional view taken along a line C—C in FIG. 16. FIG. 17D is a sectional view of the substrate contact portion of a peripheral circuit.

As shown in FIGS. 16 and 17A to 17D, the magnetic random access memory of the second embodiment is different from the first embodiment in that a yoke layer 28 that covers the upper and side surfaces of a write word line 24-1 and the side surface of an MTJ element 18 to confine the magnetic field from the write word line 24-1 is formed. The yoke layer 28 of this embodiment is made of, e.g., a conductive magnetic material. Since the yoke layer 28 of this embodiment is formed from a conductive magnetic material, it is separated for each write word line 24-1. Additionally, in this embodiment, a yoke layer 26 that covers the bottom and side surfaces of a bit line 13-1 is formed.

The magnetic random access memory according to the second embodiment has the yoke layer 28 that covers the upper and side surfaces of the write word line 24-1 and the side surface of the MTJ element 18. For this reason, as compared to a structure without the yoke layer 28, the magnetic field from the write word line 24-1 can be efficiently applied to the MTJ element 18.

In addition, an adjacent unselected MTJ element 18 is hard to be influenced by the magnetic field from the selected write word line 24-1. For this reason, the reliability related to, e.g., a data read can be improved.

Furthermore, since the yoke layer 26 that covers the bottom and side surfaces of the bit line 13-1 is formed, the magnetic field from the bit line 13-1 can be efficiently applied to the MTJ element in a data write mode.

The yoke layer 26 is not in contact with the yoke layer 28. Since the yoke layer 26 is not in contact with the yoke layer 28, for example, any interference between the magnetic field from the yoke layer 26 and that from the yoke layer 28 can advantageously be suppressed.

[First Manufacturing Method]

A first method of manufacturing the magnetic random access memory according to the second embodiment of the present invention will be described next.

FIGS. 18A to 31D are sectional views showing the first method of manufacturing the magnetic random access memory according to the second embodiment of the present invention. FIGS. 18A, 19A, 20A, 21A, 22A, 23A, 24A, 25A, 26A, 27A, 28A, 29A, 30A, and 31A correspond to the section shown in FIG. 17A. FIGS. 18B, 19B, 20B, 21B, 22B, 23B, 24B, 25B, 26B, 27B, 28B, 29B, 30B, and 31B correspond to the section shown in FIG. 17B. FIGS. 18C, 19C, 20C, 21C, 22C, 23C, 24C, 25C, 26C, 27C, 28C, 29C, 30C, and 31C correspond to the section shown in FIG. 17C. FIGS. 18D, 19D, 20D, 21D, 22D, 23D, 24D, 25D, 26D, 27D, 28D, 29D, 30D, and 31D correspond to the section shown in FIG. 17D.

First, the structure shown in FIGS. 18A to 18D is obtained by the manufacturing method described with reference to FIGS. 3A to 7D.

Next, as shown in FIGS. 19A to 19D, an insulating material, e.g., $SiO_2$ is deposited on the structure shown in FIGS. 18A to 18D to form a fourth dielectric interlayer 12. Second metal layer interconnection trenches 25 that reach contacts 11 are formed in the fourth dielectric interlayer 12. In this embodiment, a bit line trench 25-1, intracell via trench 25-2, and intra-peripheral-circuit via trench 25-3 are formed.

As shown in FIGS. 20A to 20D, a conductive or insulating yoke material is deposited on the structure shown in FIGS. 19A to 19D to form the yoke layer 26. In this embodiment, the conductive yoke layer 26 is exemplified. As a conductive yoke material, for example, an Ni—Fe alloy, Co—Fe—Ni alloy, Co—(Zr, Hf, Nb, Ta, Ti) film, or (Co, Fe, Ni)—(Si, B)—(P, Al, Me, Nb, Mn)-based amorphous material can be used. As an insulating yoke material, for example, insulating ferrite, (Fe, Co)—(B, Si, Hf, Zr, Sm, Ta, Al)—(F, O, N)-based metal-nonmetal nanogranular film can be used. Next, a conductive material, e.g., a metal such as tungsten is deposited on the conductive yoke layer 26 to form a second metal layer 13.

As shown in FIGS. 21A to 21D, the second metal layer 13 and conductive yoke layer 26 are subjected to, e.g., chemical mechanical polishing (CMP) to fill the bit line trench 25-1, intracell via trench 25-2, and intra-peripheral-circuit via trench 25-3 with the second metal layer and conductive yoke material. With this process, a bit line 13-1, intracell via 13-2, and intra-peripheral-circuit via 13-3 are formed.

As shown in FIGS. 22A to 22D, a ferromagnetic material is sputtered on the structure shown in FIGS. 21A to 21D to form a ferromagnetic layer 14. Next, an insulating material is deposited on the ferromagnetic layer 14 to form an insulating layer 15. Subsequently, a ferromagnetic material is sputtered on the insulating layer 15 to form a ferromagnetic layer 16. Then, a mask material is deposited on the ferromagnetic layer 16 to form a mask layer 17. The mask layer 17 is patterned into a shape corresponding to the layout pattern of the MTJ element.

As shown in FIGS. 23A to 23D, the ferromagnetic layer 16, insulating layer 15, and ferromagnetic layer 14 are sequentially etched using the mask layer 17 as a mask. With this process, the MTJ element 18 having, e.g., a three-layered structure including the ferromagnetic layer 14, insulating layer 15, and ferromagnetic layer 16 is formed. In this embodiment, for example, the ferromagnetic layer 14 functions as a memory-layer in which the direction of spin changes in accordance with the write magnetic field. The insulating layer 15 functions as a tunnel barrier. The ferromagnetic layer 16 functions as a fixed-layer in which the direction of spin is fixed.

As shown in FIGS. 24A to 24D, an insulating material, e.g., $SiO_2$ is deposited on the structure shown in FIGS. 23A to 23D to form a fifth dielectric interlayer 19. The fifth dielectric interlayer 19 is subjected to, e.g., chemical mechanical polishing (CMP) to expose the MTJ element 18. Next, an opening that reaches the intracell via 13-2 is formed in the fifth dielectric interlayer 19. The opening is filled with a conductive material, e.g., a metal such as tungsten to form an extra metal—second metal layer contact 20.

As shown in FIGS. 25A to 25D, a conductive material, e.g., a metal such as tungsten is deposited on the structure shown in FIGS. 24A to 24D to form an extra metal layer 21.

As shown in FIGS. 26A to 26D, the extra metal layer 21 is patterned to form an intracell local interconnection 21-1.

As shown in FIGS. 27A to 27D, an insulating material, e.g., $SiO_2$ is deposited on the structure shown in FIGS. 26A to 26D to form a sixth dielectric interlayer 22. An opening that reaches the intra-peripheral-circuit via 13-3 is formed in the sixth dielectric interlayer 22 and fifth dielectric interlayer 19. The opening is filled with a conductive material, e.g., a metal such as tungsten to form a third metal layer—second metal layer contact 23.

As shown in FIGS. 28A to 28D, a conductive material, e.g., AlCu or Cu is deposited on the structure shown in FIGS. 27A to 27D to form a third metal layer 24. Next, a conductive yoke material is deposited on the third metal layer 24 to form a conductive yoke layer 27. As a material of the conductive yoke layer 27, for example, an Ni—Fe alloy, Co—Fe—Ni alloy, Co—(Zr, Hf, Nb, Ta, Ti) film, or (Co, Fe, Ni)—(Si, B)—(P, Al, Mo, Nb, Mn)-based amorphous material can be used.

As shown in FIGS. 29A to 29D, the conductive yoke layer 27, third metal layer 24, and sixth dielectric interlayer 22 are etched using a mask material (not shown) corresponding to the write word line pattern and intra-peripheral-circuit interconnection pattern as a mask. In addition, the fifth dielectric interlayer 19 is etched halfway. With this process, a write word line 24-1 and intra-peripheral-circuit interconnection 24-2 are formed. The reason why the fifth dielectric interlayer 19 is etched halfway is that the yoke layer 28 to be formed later need be brought close to, e.g., the bit line 13-1 as much as possible. The reason why the fifth dielectric interlayer is not etched until the bit line 13-1 is exposed is that the yoke layer 26 need be prevented from coming into contact with the yoke layer 28 to be formed later.

Next, as shown in FIGS. 30A to 30D, a conductive yoke material is deposited on the structure shown in FIGS. 29A to 29D to form the conductive yoke layer 28. As a material of the conductive yoke layer 28, for example, an Ni—Fe alloy, Co—Fe—Ni alloy, Co—(Zr, Hf, Nb, Ta, Ti) film, or (Co, Fe, Ni)—(Si, B)—(P, Al, Mo, Nb, Mn)-based amorphous material can be used, like the conductive yoke layer 27.

As shown in FIGS. 31A to 31D, the conductive yoke layer 28 is anisotropically etched using anisotropic etching, e.g., reactive ion etching (RIE) to leave the conductive yoke layer 28 on the side surfaces of the conductive yoke layer 27, write word line 24-1 or intra-peripheral-circuit interconnection 24-2, sixth dielectric interlayer 22, and fifth dielectric interlayer 19.

In this way, the magnetic random access memory according to the second embodiment can be formed.

[Second Manufacturing Method]

A second method of manufacturing the magnetic random access memory according to the second embodiment of the present invention will be described next.

FIGS. 32A to 41D are sectional views showing the second method of manufacturing the magnetic random access memory according to the second embodiment of the present invention. FIGS. 32A, 33A, 34A, 35A, 36A, 37A, 38A, 39A, 40A, and 41A correspond to the section shown in FIG. 17A. FIGS. 32B, 33B, 34B, 35B, 36B, 37B, 38B, 39B, 40B, and 41B correspond to the section shown in FIG. 17B. FIGS. 32C, 33C, 34C, 35C, 36C, 37C, 38C, 39C, 40C, and 41C correspond to the section shown in FIG. 17C. FIGS. 32D, 33D, 34D, 35D, 36D, 37D, 38D, 39D, 40D, and 41D correspond to the section shown in FIG. 17D.

First, the structure shown in FIGS. 32A to 32D is obtained by the manufacturing method described with reference to FIGS. 3A to 7D and FIGS. 19A to 23D.

Next, as shown in FIGS. 33A to 33D, an insulating material, e.g., SiN is deposited on the structure shown in FIGS. 32A to 32D to form a stopper layer 29. Next, an insulating material, e.g., SiO$_2$ is deposited on the stopper layer 29 to form the fifth dielectric interlayer 19. An example of the material of the stopper layer 29 is SiN. However, any other material that can ensure an etching selectivity ratio with respect to the fifth dielectric interlayer 19 can be used.

As shown in FIGS. 34A to 34D, the fifth dielectric interlayer 19 and stopper layer 29 are subjected to, e.g., chemical mechanical polishing (CMP) to expose the MTJ element 18. Next, an opening that reaches the intracell via 13-2 is formed in the fifth dielectric interlayer 19 and stopper layer 29. The opening is filled with a conductive material, e.g., a metal such as tungsten to form the extra metal—second metal layer contact 20.

As shown in FIGS. 35A to 35D, a conductive material, e.g., a metal such as tungsten is deposited on the structure shown in FIGS. 34A to 34D to form the extra metal layer 21. As shown in FIGS. 36A to 36D, the extra metal layer 21 is patterned to form the intracell local interconnection 21-1.

As shown in FIGS. 37A to 37D, an insulating material, e.g., SiO$_2$ is deposited on the structure shown in FIGS. 36A to 36D to form a sixth dielectric interlayer 22. An opening that reaches the intra-peripheral-circuit via 13-3 is formed in the sixth dielectric interlayer 22 and fifth dielectric interlayer 19. The opening is filled with a conductive material, e.g., a metal such as tungsten to form the third metal layer—second metal layer contact 23.

As shown in FIGS. 38A to 38D, a conductive material, e.g., AlCu or Cu is deposited on the structure shown in FIGS. 37A to 37D to form the third metal layer 24. Next, a conductive yoke material is deposited on the third metal layer 24 to form the conductive yoke layer 27.

As shown in FIGS. 39A to 39D, the conductive yoke layer 27, third metal layer 24, sixth dielectric interlayer 22, and fifth dielectric interlayer 19 are etched using a mask material (not shown) corresponding to the write word line pattern and intra-peripheral-circuit interconnection pattern as a mask, e.g., until the stopper layer 29 is exposed. With this process, the write word line 24-1 and intra-peripheral-circuit interconnection 24-2 are formed.

Next, as shown in FIGS. 40A to 40D, a conductive yoke material is deposited on the structure shown in FIGS. 39A to 39D to form the conductive yoke layer 28.

As shown in FIGS. 41A to 41D, the conductive yoke layer 28 is anisotropically etched using anisotropic etching, e.g., reactive ion etching (RIE) to leave the conductive yoke layer 28 on the side surfaces of the conductive yoke layer 27, write word line 24-1 or intra-peripheral-circuit interconnection 24-2, sixth dielectric interlayer 22, and fifth dielectric interlayer 19.

In this way, the magnetic random access memory according to the second embodiment can be formed.

[Third Manufacturing Method]

A third method of manufacturing the magnetic random access memory according to the second embodiment of the present invention will be described next.

FIGS. 42A to 47D are sectional views showing the third method of manufacturing the magnetic random access memory according to the second embodiment of the present invention. FIGS. 42A, 43A, 44A, 45A, 46A, and 47A correspond to the section shown in FIG. 17A. FIGS. 42B, 43B, 44B, 45B, 46B, and 47B correspond to the section shown in FIG. 17B. FIGS. 42C, 43C, 44C, 45C, 46C, and 47C correspond to the section shown in FIG. 17C. FIGS. 42D, 43D, 44D, 45D, 46D, and 47D correspond to the section shown in FIG. 17D.

First, the structure shown in FIGS. 42A to 42D is obtained by the manufacturing method described with reference to FIGS. 3A to 7D and FIGS. 19A to 27D.

Next, as shown in FIGS. 43A to 43D, an insulating material, e.g., SiO$_2$ is deposited on the structure shown in FIGS. 42A to 42D to form a seventh dielectric interlayer 30. Third layer metal interconnection trenches 31 are formed in the seventh dielectric interlayer 30. With this process, a write word line trench 31-1 and intra-peripheral-circuit interconnection trench 31-2 are formed.

As shown in FIGS. 44A to 44D, a conductive material, e.g., AlCu or Cu is deposited on the structure shown in FIGS. 42A to 42D to form the third metal layer 24. The third metal layer 24 is, e.g., etched back to bury the third metal layer 24 halfway in the write word line trench 31-1 and intra-peripheral-circuit interconnection trench 31-2. A conductive yoke material is deposited on the third metal layer 24 and seventh dielectric interlayer 30 to form the conductive yoke layer 27. The conductive yoke layer 27 is subjected to, e.g., chemical mechanical polishing (CMP) to bury it in the write word line trench 31-1 and intra-peripheral-circuit interconnection trench 31-2.

As shown in FIGS. 45A to 45D, the conductive yoke layer 27, third metal layer 24, seventh dielectric interlayer 30, and sixth dielectric interlayer 22 are etched using a mask material (not shown) corresponding to the write word line pattern and intra-peripheral-circuit interconnection pattern as a mask. In addition, the fifth dielectric interlayer 19 is etched halfway. With this process, the write word line 24-1 and intra-peripheral-circuit interconnection 24-2 are formed.

As shown in FIGS. 46A to 46D, the seventh dielectric interlayer 30 is, e.g., wet-etched to remove the seventh dielectric interlayer 30 that is present on the side surface of the conductive yoke layer 27. With this process, a portion 32 where the side surface of the conductive yoke layer 27 is exposed is obtained. This process is executed as needed.

As shown in FIGS. 47A to 47D, a conductive yoke material is deposited on the structure shown in FIGS. 46A to 46D to form the conductive yoke layer 28. The conductive yoke layer 28 is anisotropically etched using anisotropic etching, e.g., reactive ion etching (RIE) to leave the conductive yoke layer 28 on the side surfaces of the conductive yoke layer 27, write word line 24-1 or intra-peripheral-circuit interconnection 24-2, seventh dielectric interlayer 30, sixth dielectric interlayer 22, and fifth dielectric interlayer 19.

In this way, the magnetic random access memory according to the second embodiment can be formed.

[Modification]

A modification to the magnetic random access memory according to the second embodiment of the present invention will be described next.

FIGS. 48A, 48B, 48C, and 48D are sectional views showing the modification to the magnetic random access memory according to the second embodiment of the present invention. FIG. 48A corresponds to the section shown in FIG. 17A. FIG. 48B corresponds to the section shown in FIG. 17B. FIG. 48C corresponds to the section shown in FIG. 17C. FIG. 48D corresponds to the section shown in FIG. 17D.

As shown in FIGS. 48A to 48D, the conductive yoke layer 28 may be formed to cover the side surfaces of the write word line 24-1 and MTJ element 18.

(Third Embodiment)

Figure 49:
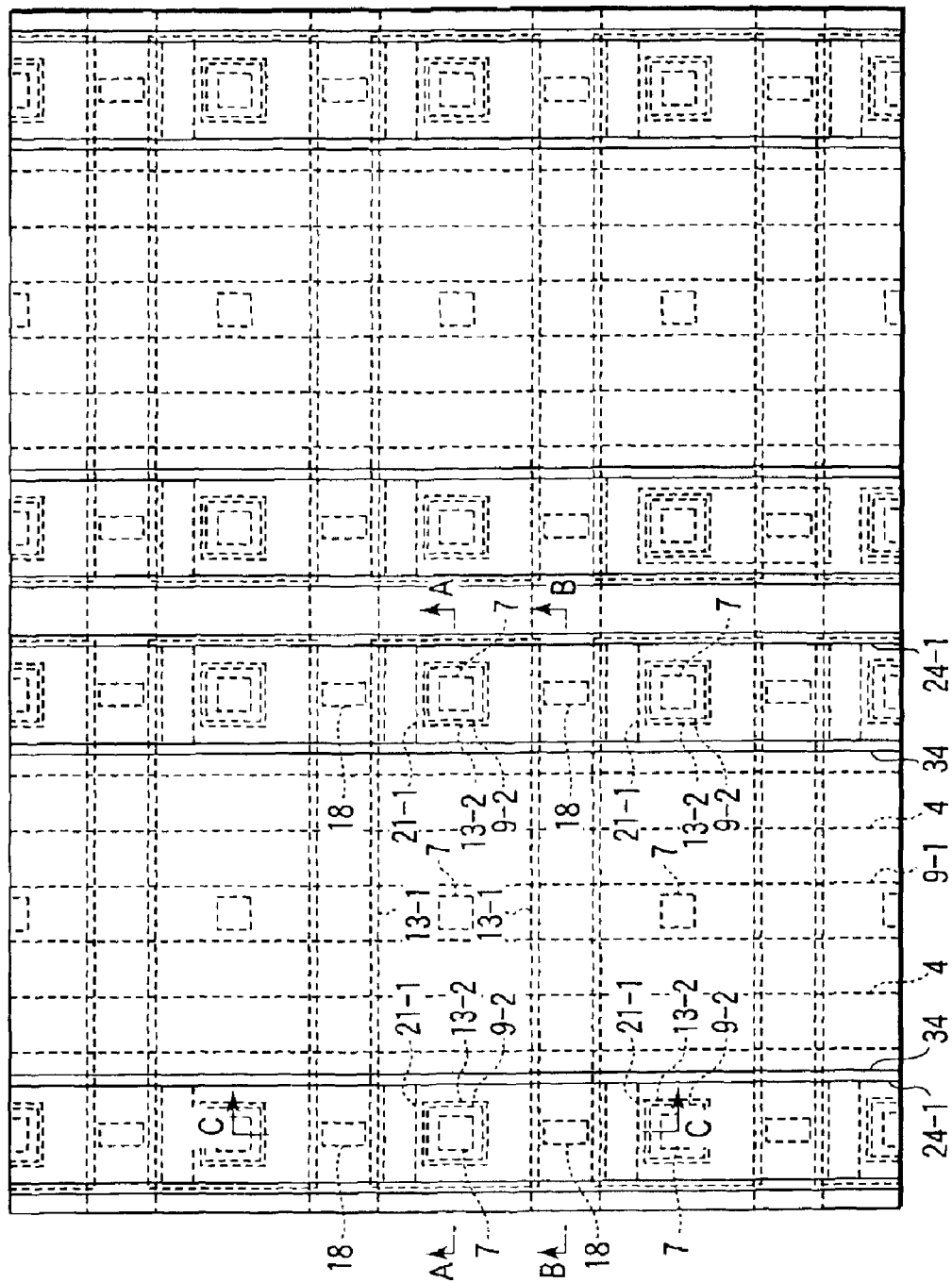
FIG. 49 is a plan view showing the planar pattern of a magnetic random access memory according to the third embodiment of the present invention.
Figure 52A:
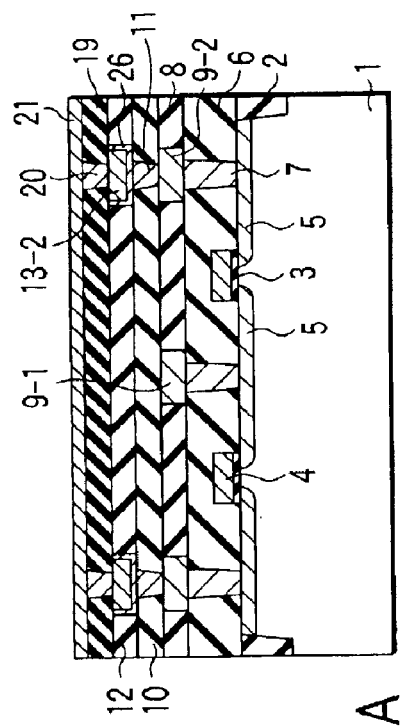
FIGS. 52A, 52B, 52C, and 52D are sectional views showing the method of manufacturing the magnetic random access memory according to the third embodiment of the present invention.
Figure 52B:
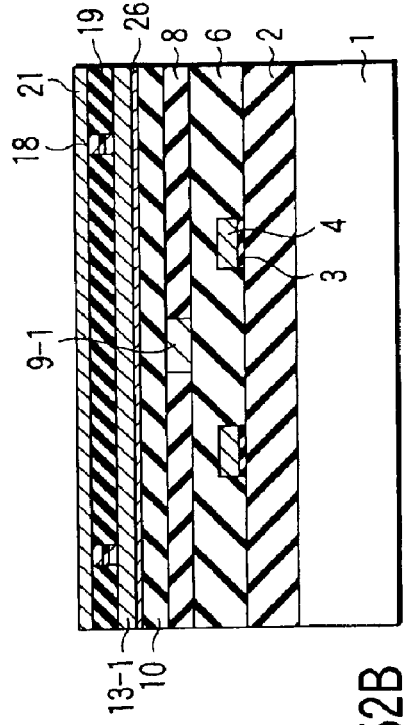
Figure 52C:
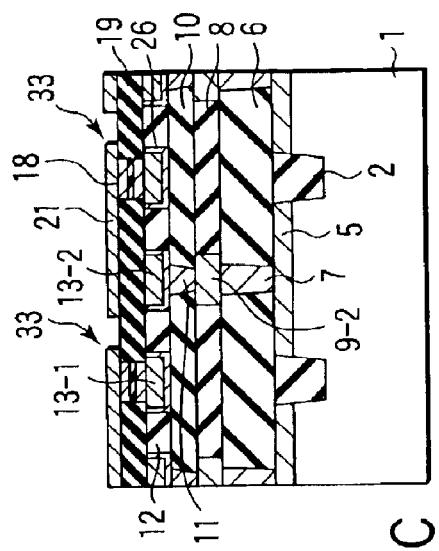
Figure 52D:
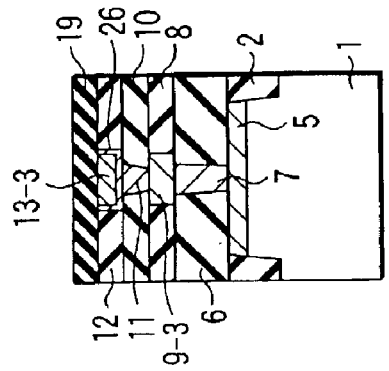
Figure 53C:
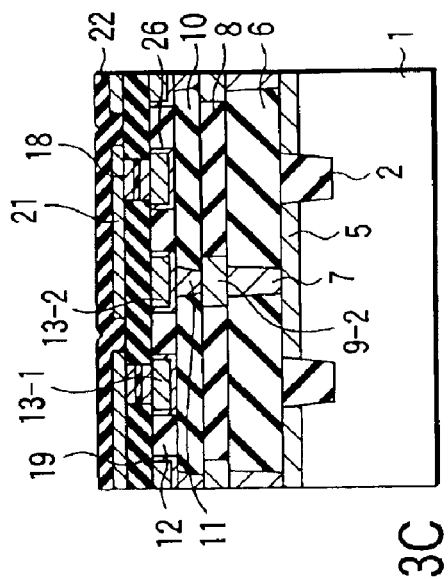
FIGS. 53A, 53B, 53C, and 53D are sectional views showing the method of manufacturing the magnetic random access memory according to the third embodiment of the present invention.
Figure 53D:
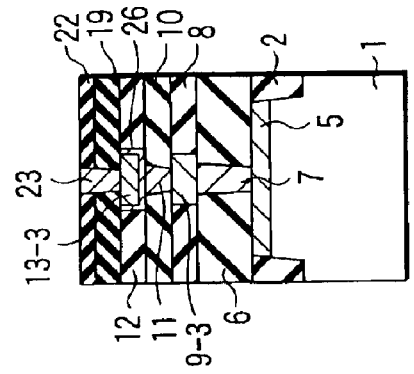
Figure 53A:
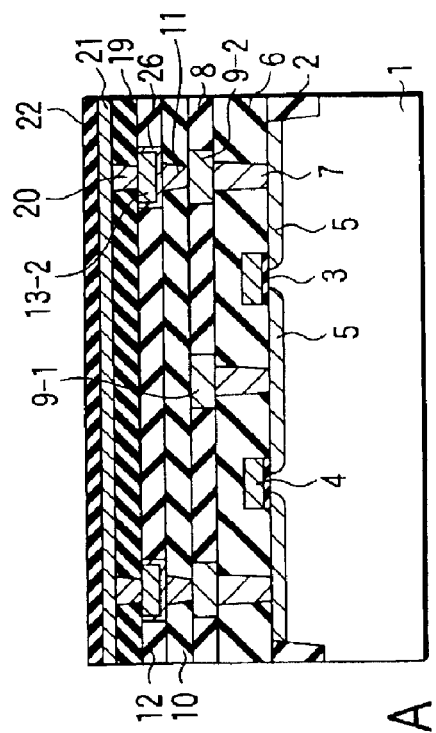
Figure 53B:
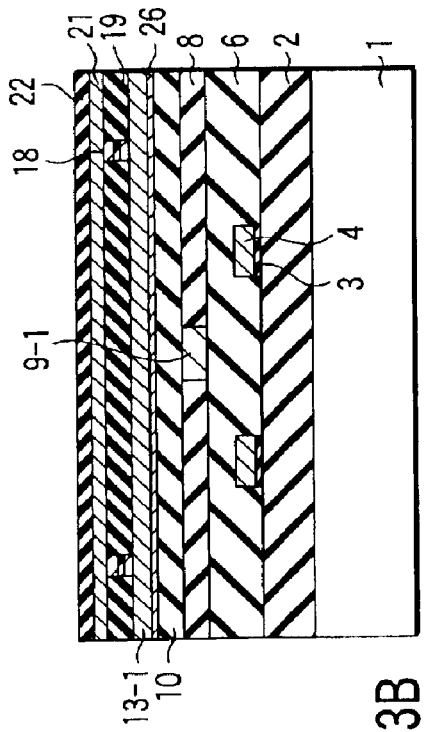
Figure 55A:
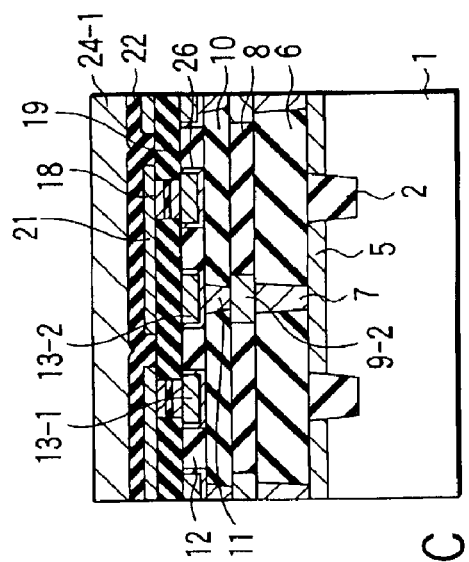
FIGS. 55A, 55B, 55C, and 55D are sectional views showing the method of manufacturing the magnetic random access memory according to the third embodiment of the present invention.
Figure 55B:
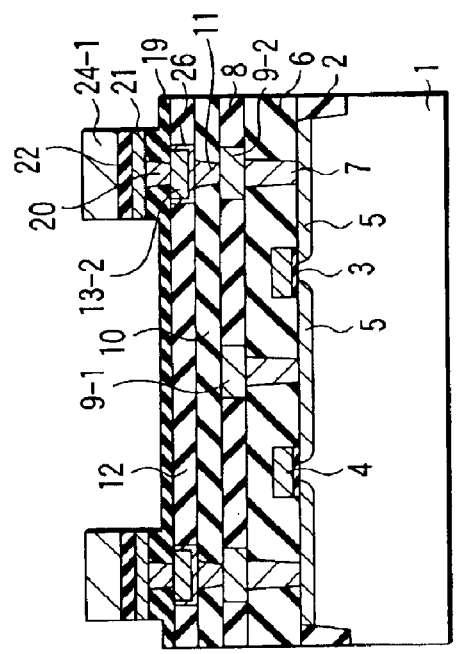
Figure 55C:
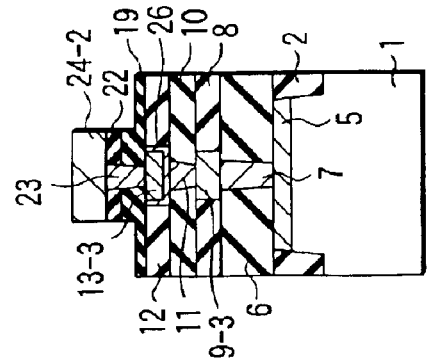
Figure 55D:
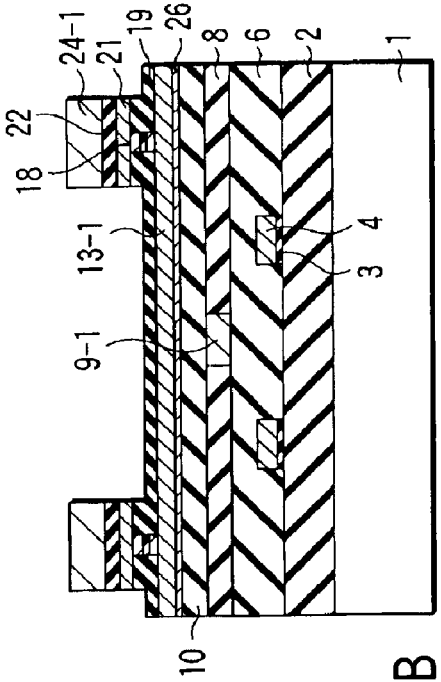
Figure 56C:
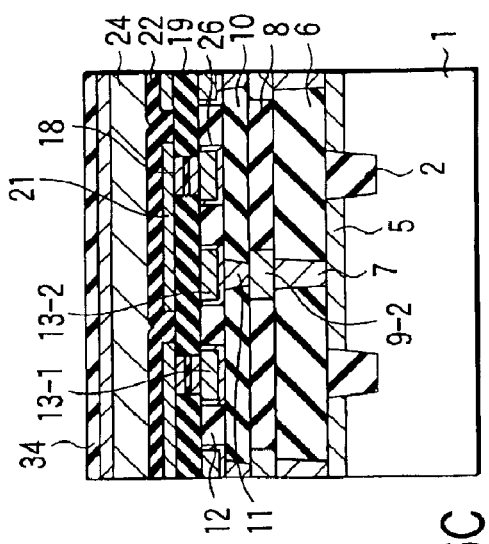
FIGS. 56A, 56B, 56C, and 56D are sectional views showing the method of manufacturing the magnetic random access memory according to the third embodiment of the present invention.
Figure 56D:
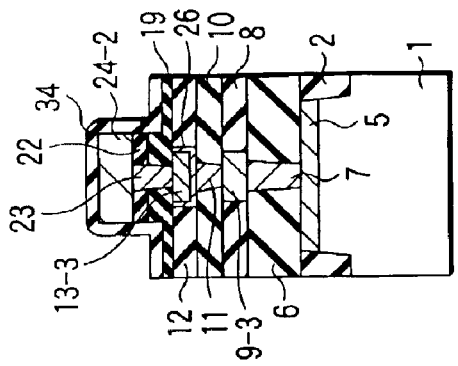
Figure 56A:
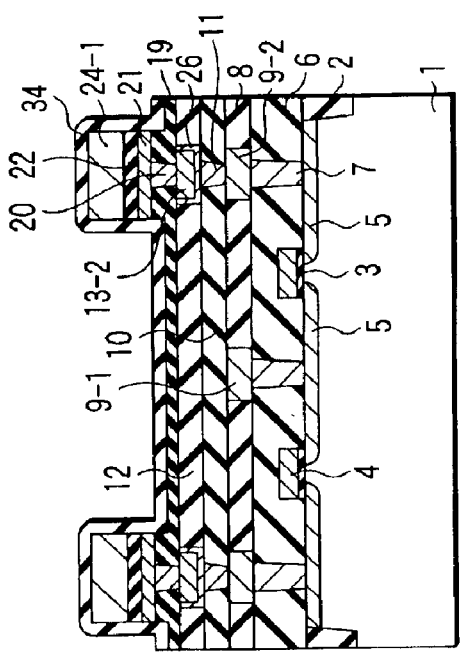
Figure 56B:
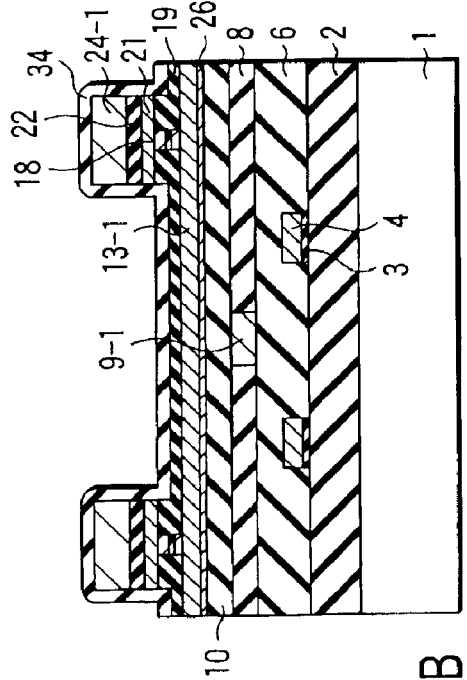

FIG. 49 is a plan view showing the planar pattern of a magnetic random access memory according to the third embodiment of the present invention. FIG. 50A is a sectional view taken along a line A—A in FIG. 49. FIG. 50B is a sectional view taken along a line B—B in FIG. 49. FIG. 50C is a sectional view taken along a line C—C in FIG. 49. FIG. 50D is a sectional view of the substrate contact portion of a peripheral circuit.

As shown in FIGS. 49 and 50A to 50D, the magnetic random access memory of the third embodiment is different from the second embodiment in that a yoke layer 34 is made of an insulating material.

When the yoke layer 34 is formed from an insulating material, an intracell local interconnection 21-1 may be in contact with the yoke layer 34. This is advantageous in micropatterning a memory cell as compared to a memory having a conductive yoke layer. This is because, for example, in forming a write word line 24-1, no mask alignment margin for, e.g., the intracell local interconnection 21-1 need be taken into consideration.

Additionally, since the intracell local interconnection 21-1 can be in contact with the yoke layer 34, the intracell local interconnection 21-1 can be widened. For example, as in this embodiment, the width of the intracell local interconnection 21-1 can be equalized with that of the write word line 24-1. When the width of the intracell local interconnection 21-1 can be increased, the resistance value of the intracell local interconnection 21-1 can be made small.

[Manufacturing Method]

A method of manufacturing the magnetic random access memory according to the third embodiment of the present invention will be described next.

FIGS. 51A to 56D are sectional views showing the method of manufacturing the magnetic random access memory according to the third embodiment of the present invention. FIGS. 51A, 52A, 53A, 54A, 55A, and 56A correspond to the section shown in FIG. 50A. FIGS. 51B, 52B, 53B, 54B, 55B, and 56B correspond to the section shown in FIG. 50B. FIGS. 51C, 52C, 53C, 54C, 55C, and 56C correspond to the section shown in FIG. 50C. FIGS. 51D, 52D, 53D, 54D, 55D, and 56D correspond to the section shown in FIG. 50D.

First, the structure shown in FIGS. 51A to 51D is obtained by the manufacturing method described with reference to FIGS. 3A to 7D and FIGS. 19A to 25D.

Next, as shown in FIGS. 52A to 52D, an extra metal layer 21 is etched to form a slit 33 in the extra metal layer 21. The slit 33 extends in the same direction as that of, e.g., a bit line 13-1 and serves as an isolation region for sequentially isolating the intracell local interconnection 21-1 to be formed later along the direction in which, e.g., a read word line 4 extends.

As shown in FIGS. 53A to 53D, an insulating material, e.g., $SiO_2$ is deposited on the structure shown in FIGS. 52A to 52D to form a sixth dielectric interlayer 22. An opening that reaches an intra-peripheral-circuit via 13-3 is formed in the sixth dielectric interlayer 22 and fifth dielectric interlayer 19. The opening is filled with a conductive material, e.g., a metal such as tungsten to form a third metal layer—second metal layer contact 23.

As shown in FIGS. 54A to 54D, a conductive material, e.g., AlCu or Cu is deposited on the structure shown in FIGS. 53A to 53D to form a third metal layer 24.

As shown in FIGS. 55A to 55D, the third metal layer 24, sixth dielectric interlayer 22, and extra metal layer 21 are etched using a mask material (not shown) corresponding to the write word line pattern and intra-peripheral-circuit interconnection pattern as a mask. In addition, the fifth dielectric interlayer 19 is etched halfway. With this process, the write word line 24-1, the intra-peripheral-circuit interconnection 24-2, and the intracell local interconnection 21-1 are formed.

Next, as shown in FIGS. 56A to 56D, an insulating yoke material is deposited on the structure shown in FIGS. 55A to 55D to form the insulating yoke layer 34. As a material of the insulating yoke layer 34, for example, an insulating ferrite, (Fe, Co)—(B, Si, Hf, Zr, Sm, Ta, Al)—(F, O, N)-based metal-nonmetal nanogranular film can be used.

In this way, the magnetic random access memory according to the third embodiment can be formed.

[First Modification]

A first modification to the magnetic random access memory according to the third embodiment of the present invention will be described next.

Figure 57C:
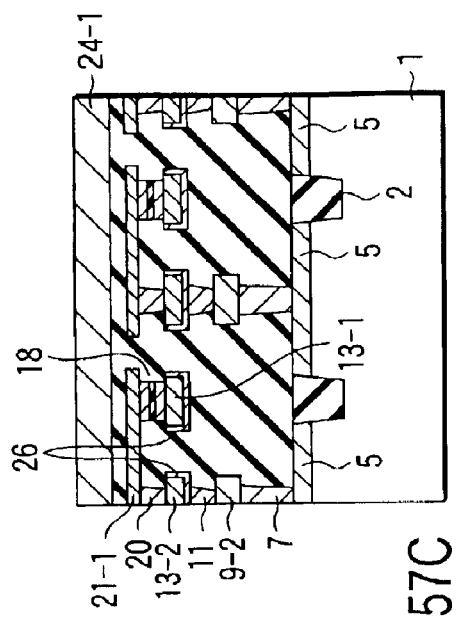
FIGS. 57A, 57B, 57C, and 57D are sectional views showing the first modification to the magnetic random access memory according to the third embodiment of the present invention.
Figure 57D:
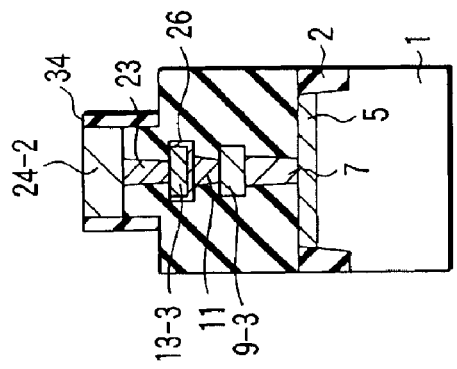
Figure 57A:
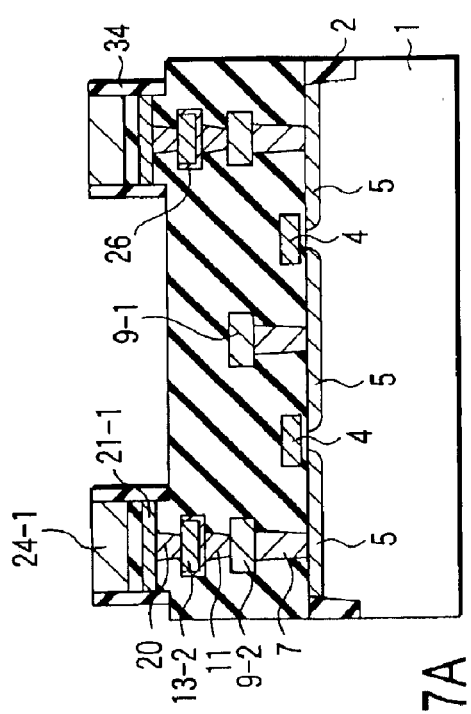
Figure 57B:
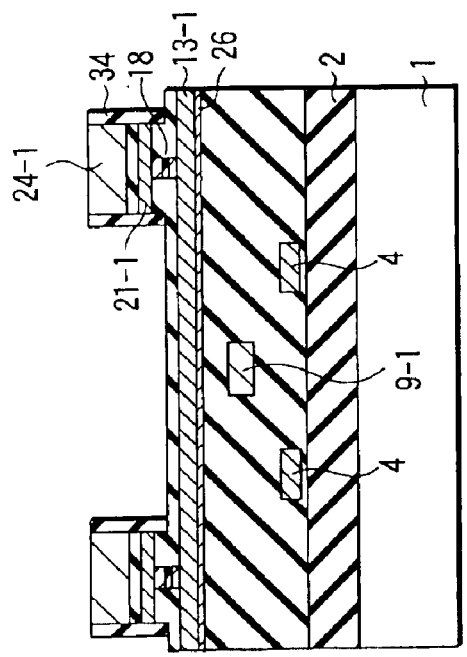

FIGS. 57A, 57B, 57C, and 57D are sectional views showing the first modification to the magnetic random access memory according to the third embodiment of the present invention. FIG. 57A corresponds to the section shown in FIG. 50A. FIG. 57B corresponds to the section shown in FIG. 50B. FIG. 57C corresponds to the section shown in FIG. 50C. FIG. 57D corresponds to the section shown in FIG. 50D.

As shown in FIGS. 57A to 57D, the insulating yoke layer 34 may be formed to cover the side surfaces of the write word line 24-1 and MTJ element 18.

[Second Modification]

A second modification to the magnetic random access memory according to the third embodiment of the present invention will be described next.

Figure 58A:
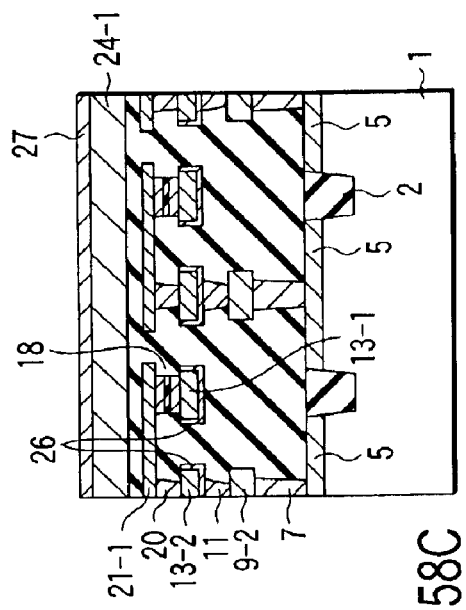
FIGS. 58A, 58B, 58C, and 58D are sectional views showing the second modification to the magnetic random access memory according to the third embodiment of the present invention.
Figure 58C:
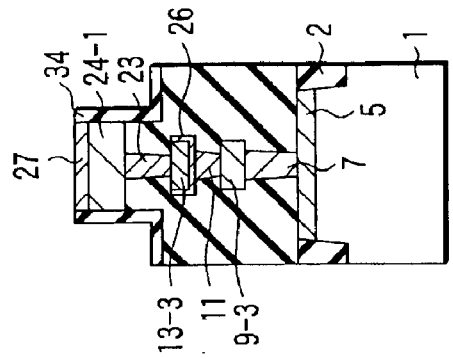
Figure 58B:
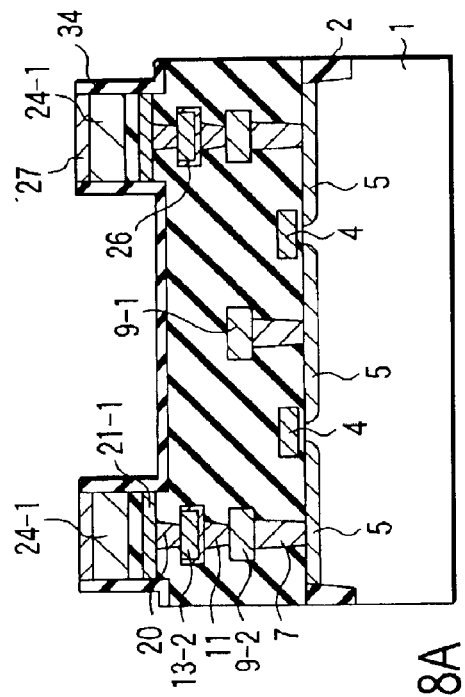
Figure 58D:
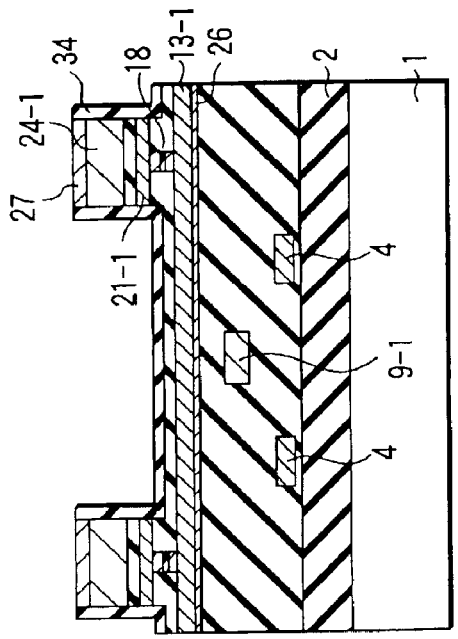
Figure 59C:
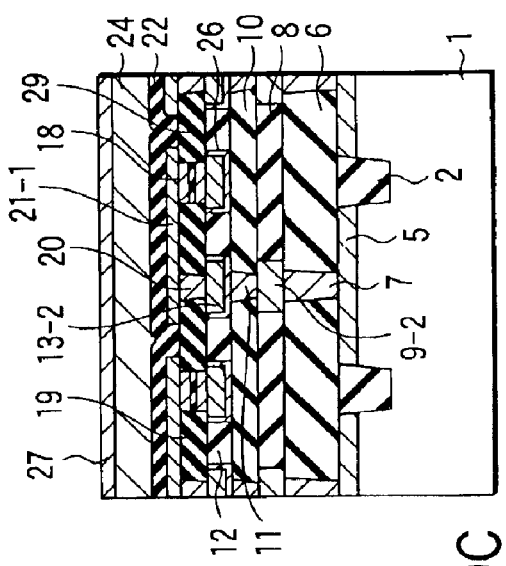
FIGS. 59A, 59B, 59C, and 59D are sectional views showing a method of manufacturing a magnetic random access memory according to a fourth embodiment of the present invention.
Figure 59D:
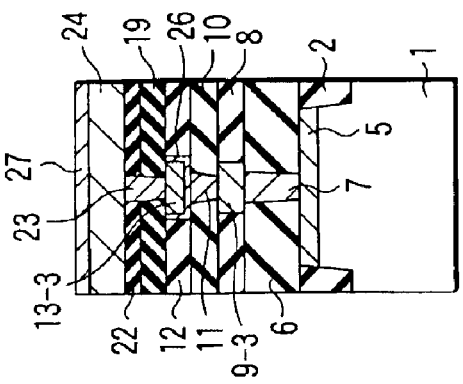
Figure 59A:
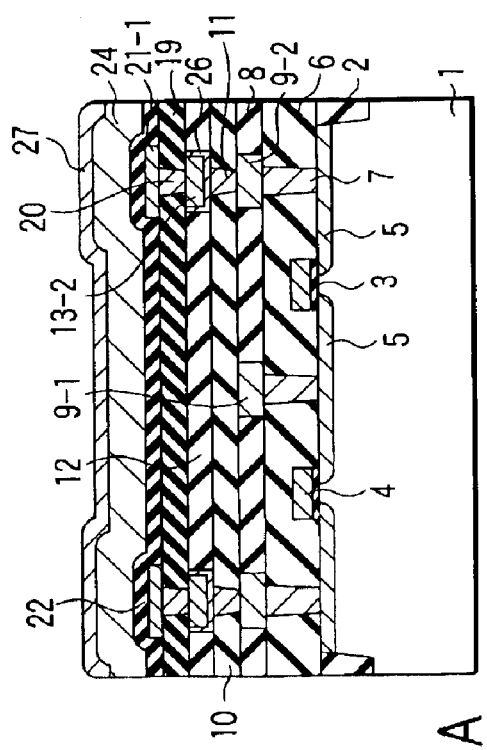
Figure 59B:
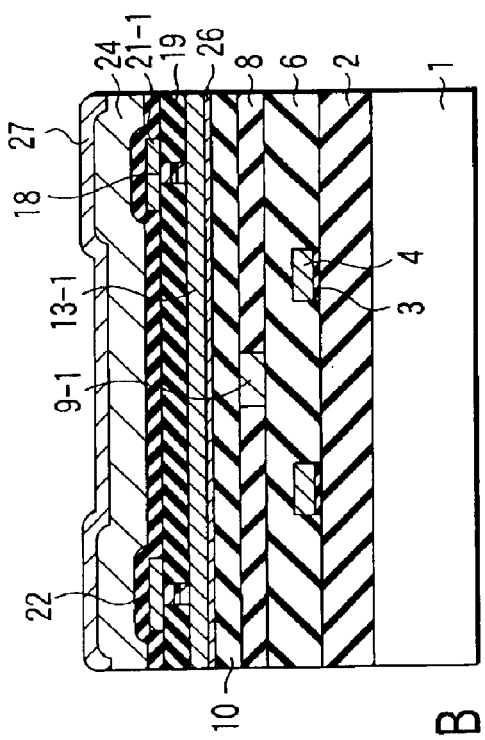
Figure 61C:
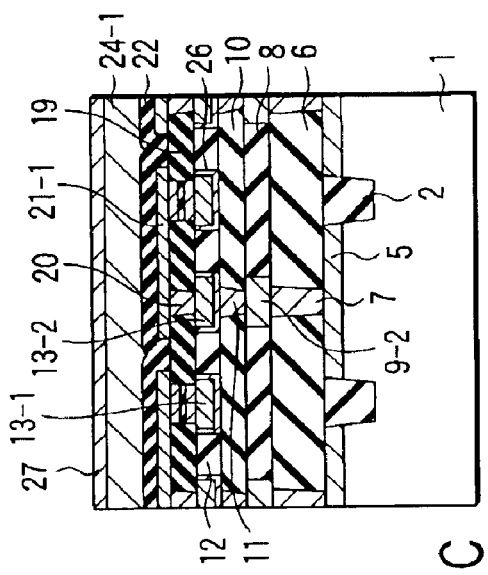
FIGS. 61A, 61B, 61C, and 61D are sectional views showing the method of manufacturing the magnetic random access memory according to the fourth embodiment of the present invention.
Figure 61D:
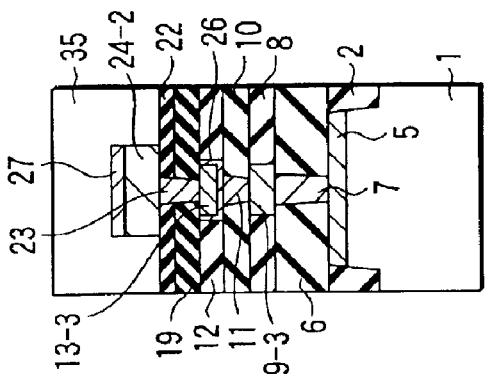
Figure 61A:
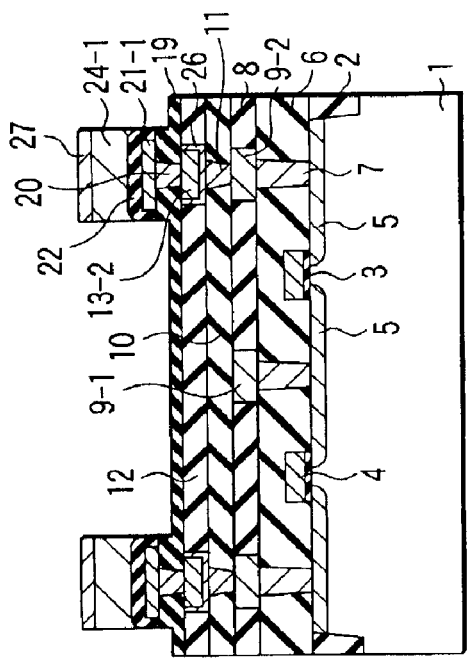
Figure 61B:
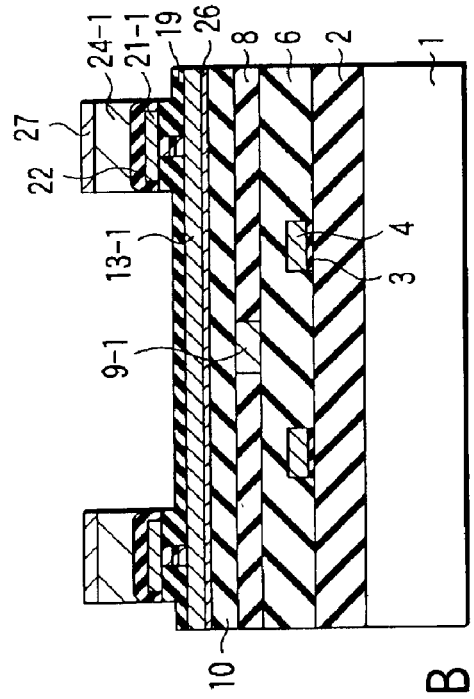
Figure 62C:
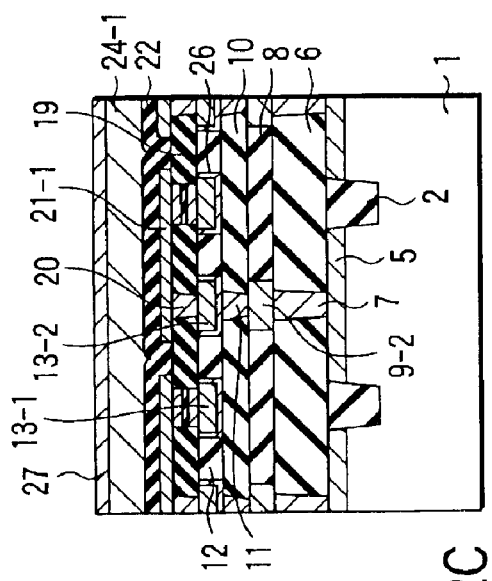
FIGS. 62A, 62B, 62C, and 62D are sectional views showing the method of manufacturing the magnetic random access memory according to the fourth embodiment of the present invention.
Figure 62D:
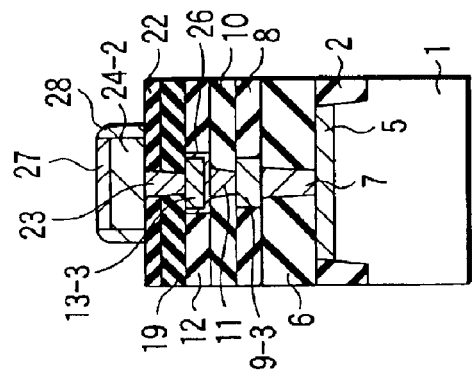
Figure 62A:
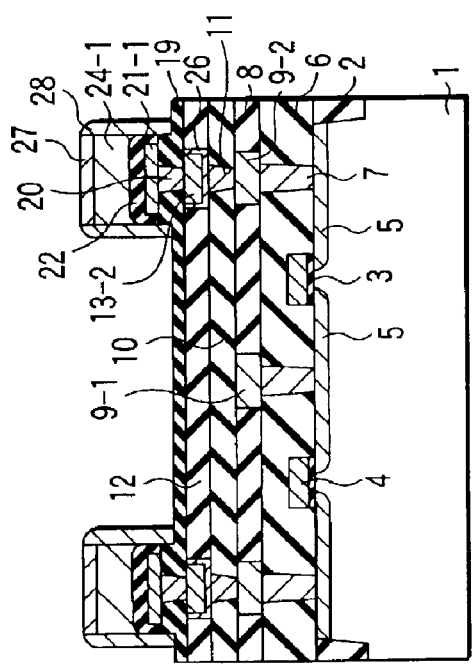
Figure 62B:
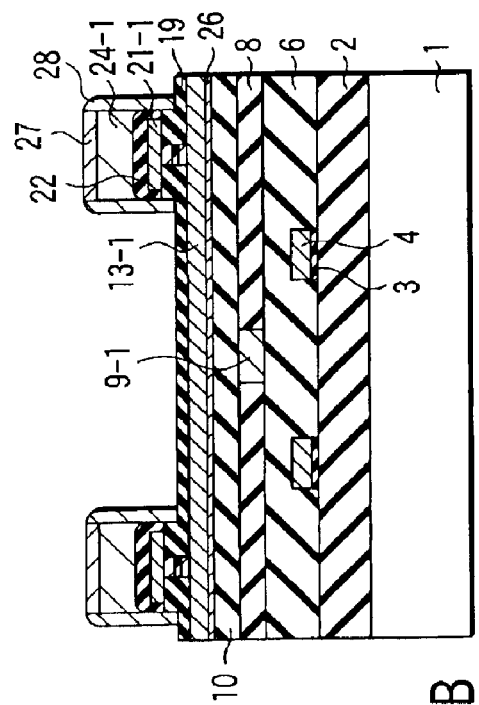
Figure 63A:
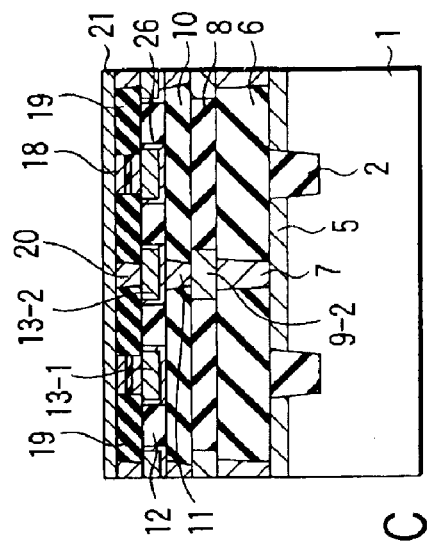
FIGS. 63A, 63B, 63C, and 63D are sectional views showing a method of manufacturing the magnetic random access memory according to a fifth embodiment of the present invention.
Figure 63B:
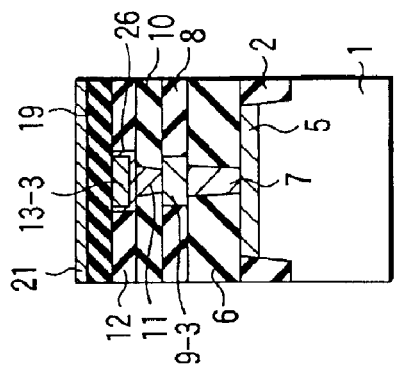
Figure 63C:
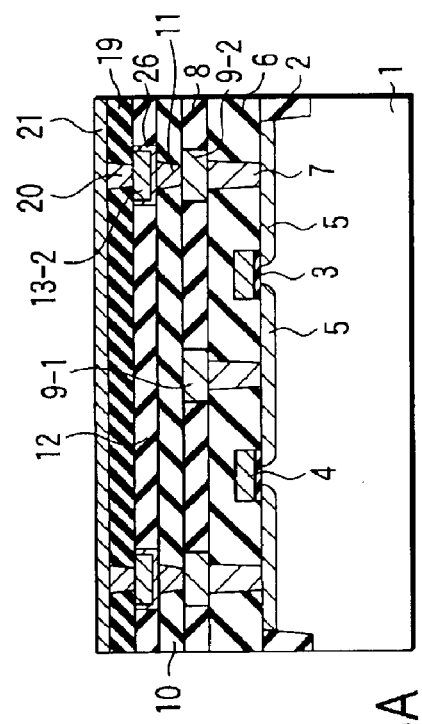
Figure 63D:
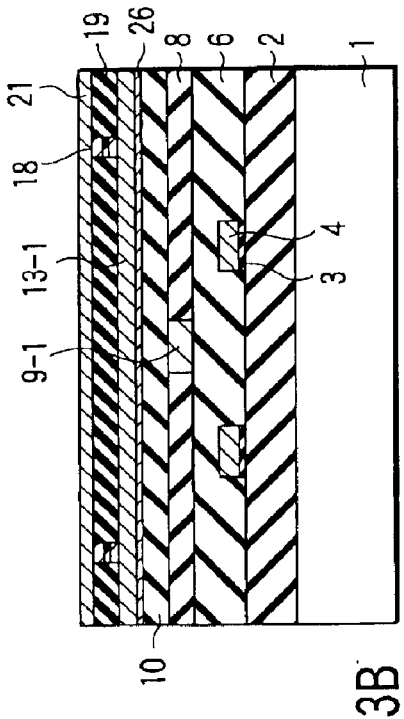
Figure 64A:
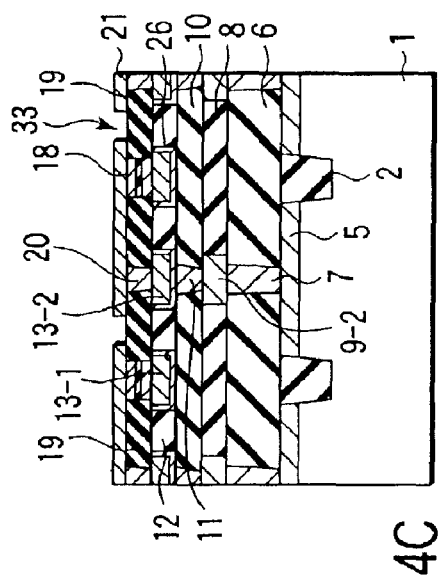
FIGS. 64A, 64B, 64C, and 64D are sectional views showing the method of manufacturing the magnetic random access memory according to the fifth embodiment of the present invention.
Figure 64B:
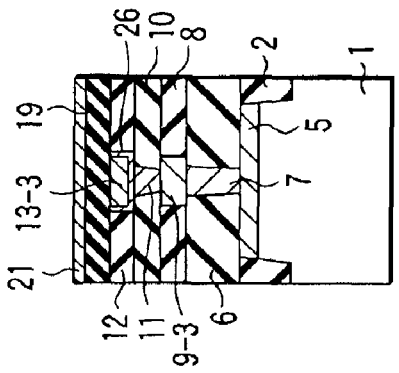
Figure 64C:
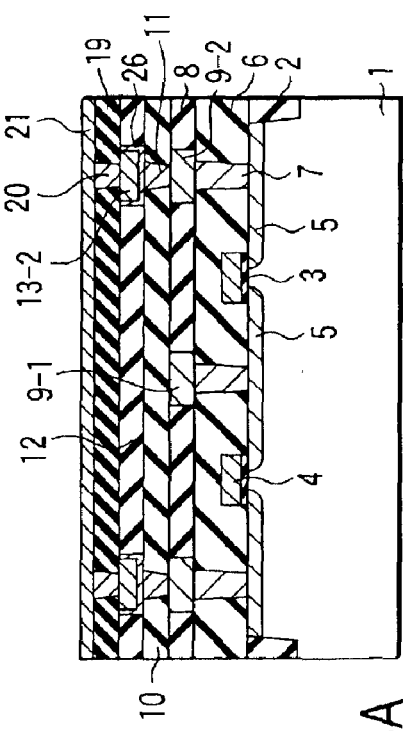
Figure 64D:
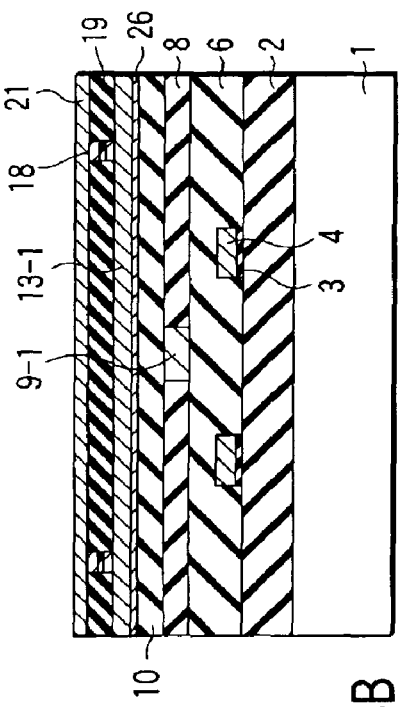
Figure 65C:
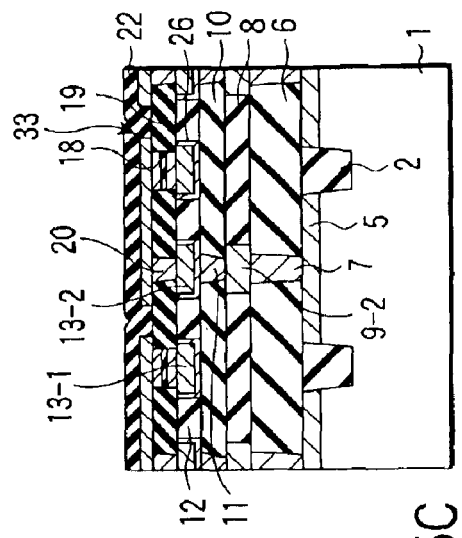
FIGS. 65A, 65B, 65C, and 65D are sectional views showing the method of manufacturing the magnetic random access memory according to the fifth embodiment of the present invention.
Figure 65D:
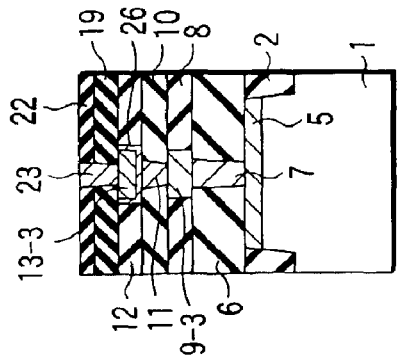
Figure 65A:
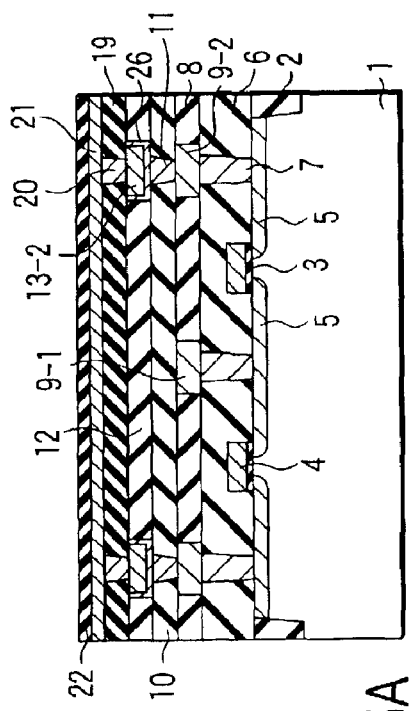
Figure 65B:
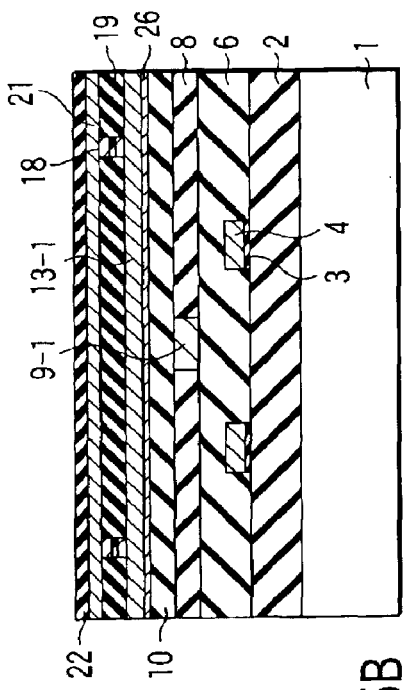
Figure 66A:
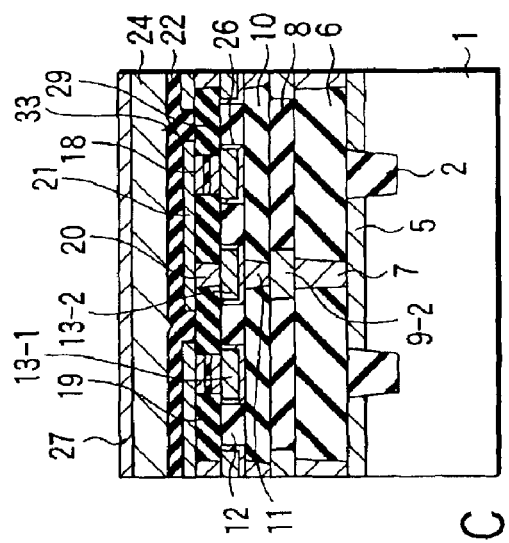
FIGS. 66A, 66B, 66C, and 66D are sectional views showing the method of manufacturing the magnetic random access memory according to the fifth embodiment of the present invention.
Figure 66C:
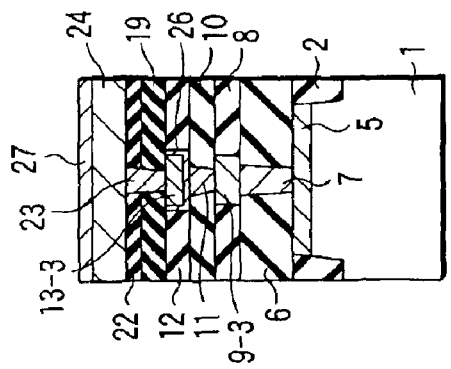
Figure 66B:
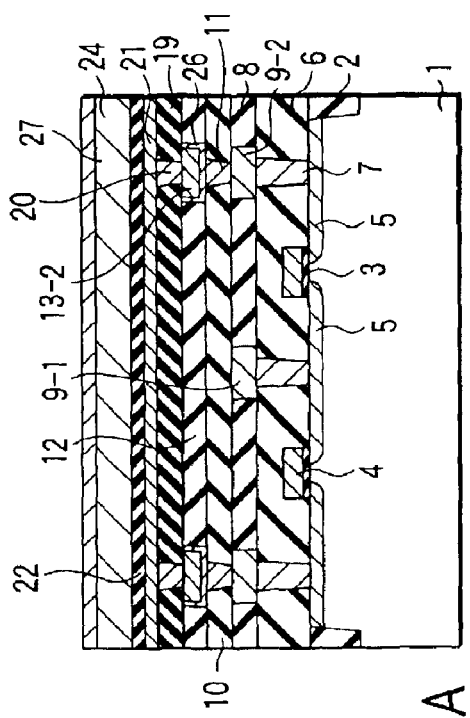
Figure 66D:
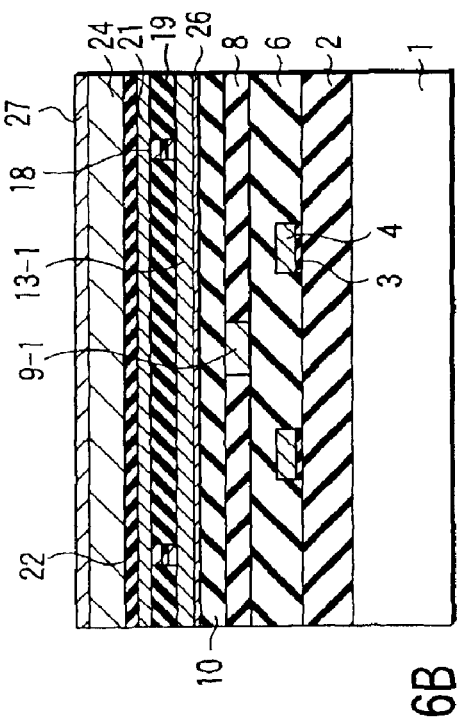
Figure 67A:
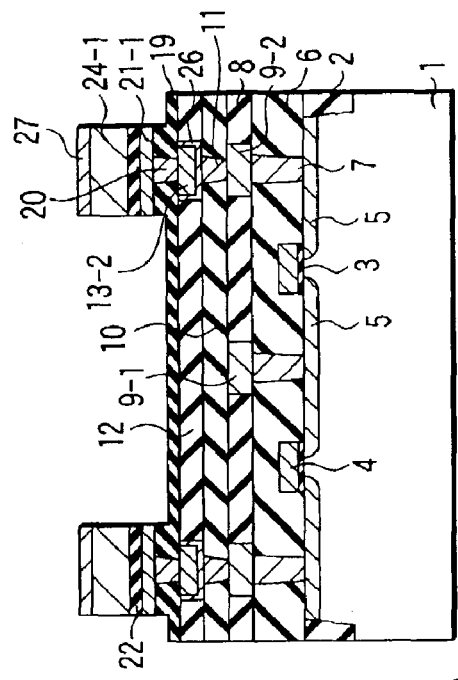
FIGS. 67A, 67B, 67C, and 67D are sectional views showing the method of manufacturing the magnetic random access memory according to the fifth embodiment of the present invention.
Figure 67B:
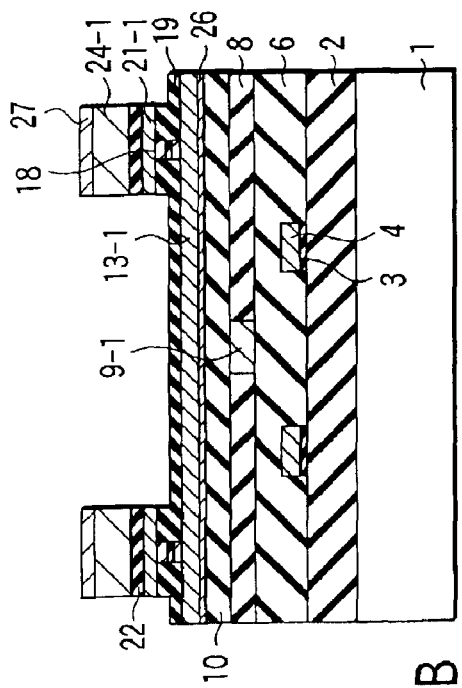
Figure 67C:
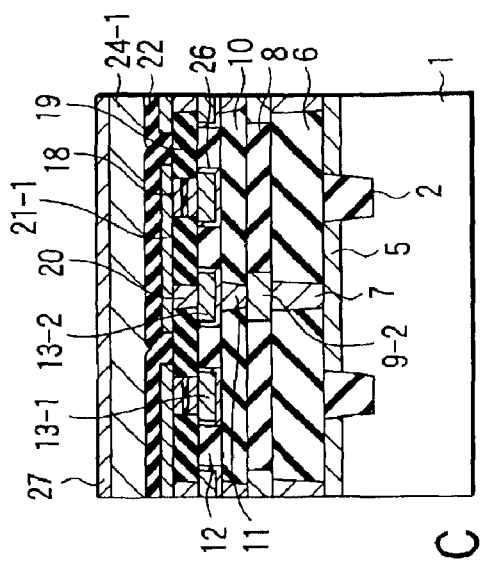
Figure 67D:
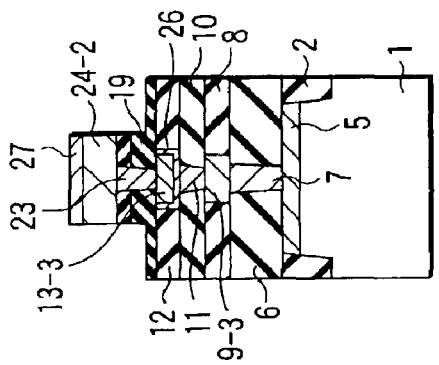
Figure 69A:
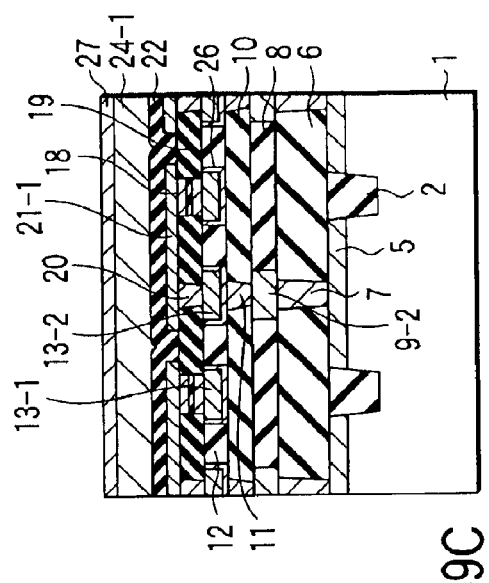
FIGS. 69A, 69B, 69C, and 69D are sectional views showing the method of manufacturing the magnetic random access memory according to the fifth embodiment of the present invention.
Figure 69B:
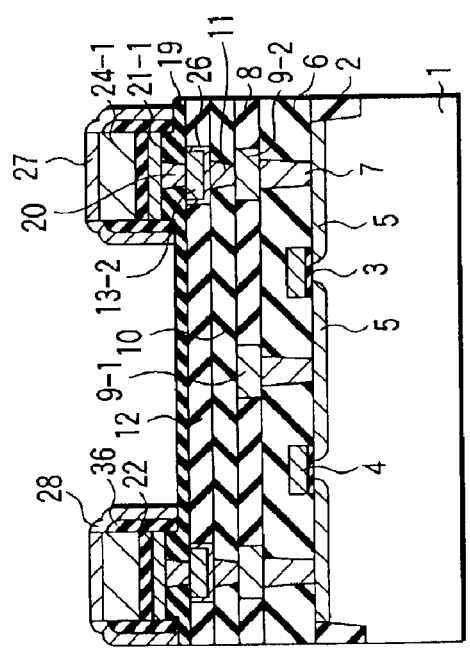
Figure 69C:
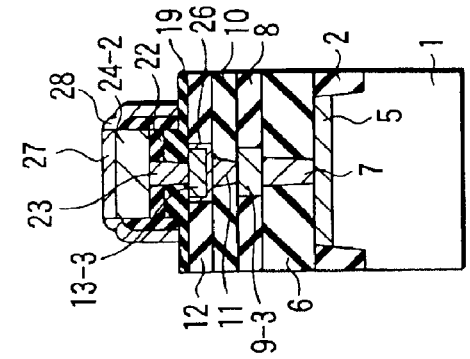
Figure 69D:
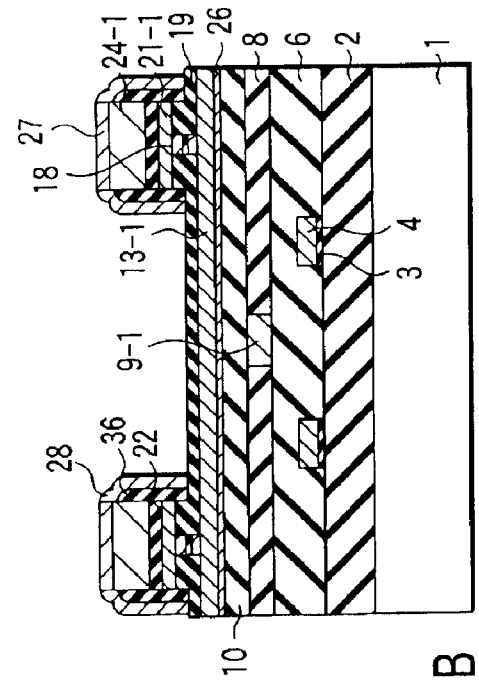

FIGS. 58A, 58B, 58C, and 58D are sectional views showing the second modification to the magnetic random access memory according to the third embodiment of the present invention. FIG. 58A corresponds to the section shown in FIG. 50A. FIG. 58B corresponds to the section shown in FIG. 50B. FIG. 58C corresponds to the section shown in FIG. 50C. FIG. 58D corresponds to the section shown in FIG. 50D.

As shown in FIGS. 58A to 58D, the side surfaces of the write word line 24-1 and MTJ element 18 may be covered with the insulating yoke layer 34, and the upper surface of the write word line 24-1 may be covered with a conductive yoke layer 27.

(Fourth Embodiment)

FIGS. 59A to 62D are sectional views showing a method of manufacturing a magnetic random access memory according to a fourth embodiment of the present invention. FIGS. 59A, 60A, 61A, and 62A correspond to the section shown in FIG. 17A. FIGS. 59B, 60B, 61B, and 62B correspond to the section shown in FIG. 17B. FIGS. 59C, 60C, 61C, and 62C correspond to the section shown in FIG. 17C. FIGS. 59D, 60D, 61D, and 62D correspond to the section shown in FIG. 17D.

First, the structure shown in FIGS. 59A to 59D is obtained by the manufacturing method described with reference to FIGS. 3A to 7D and FIGS. 19A to 28D.

As shown in FIGS. 60A to 60D, a conductive yoke layer 27 and third metal layer 24 are etched using a mask material (not shown) corresponding to the write word line pattern and intra-peripheral-circuit interconnection pattern as a mask. With this process, a write word line 24-1 and intra-peripheral-circuit interconnection 24-2 are formed.

As shown in FIGS. 61A to 61D, a mask layer 35 of, e.g., a photoresist is formed to cover the peripheral circuit portion. A sixth dielectric interlayer 22 and fifth dielectric interlayer 19 are etched halfway using the mask layer 35 and write word line 24-1, and particularly, the yoke layer 27 in this embodiment as a mask. With this process, a recess used to form the yoke layer is formed only, e.g., at the memory cell portion where memory cells are integrated. After that, the mask layer 35 is removed in this embodiment.

As shown in FIGS. 62A to 62D, a conductive yoke material is deposited on the exposed surface of the fifth dielectric interlayer 19, on the exposed surface of the write word line 24-1, on the exposed surface of the yoke layer 27, and on the sixth dielectric interlayer 22 to form a conductive yoke layer 28. Then, the conductive yoke layer 28 is left on the side surfaces of the conductive yoke layer 27, write word line 24-1 or intra-peripheral-circuit interconnection 24-2, sixth dielectric interlayer 22, and fifth dielectric interlayer 19.

In the magnetic random access memory formed in the above way, the recess used to form the yoke layer 28 can be formed only, e.g., at the memory cell array portion so that, e.g., the peripheral circuit portion can have satisfactory planarity.

If the peripheral circuit portion has satisfactory planarity, the interconnection process using the fourth metal layer, fifth metal layer, . . . above the third metal layer can easily be executed in, e.g., the peripheral circuit portion.

(Fifth Embodiment)

FIGS. 63A to 69D are sectional views showing a method of manufacturing a magnetic random access memory according to a fifth embodiment of the present invention. FIGS. 63A, 64A, 65A, 66A, 67A, 68A, and 69A correspond to the section shown in FIG. 17A. FIGS. 63B, 64B, 65B, 66B, 67B, 68B, and 69B correspond to the section shown in FIG. 17B. FIGS. 63C, 64C, 65C, 66C, 67C, 68C, and 69C correspond to the section shown in FIG. 17C. FIGS. 63D, 64D, 65D, 66D, 67D, 68D, and 69D correspond to the section shown in FIG. 17D.

First, the structure shown in FIGS. 63A to 63D is obtained by the manufacturing method described with reference to FIGS. 3A to 7D and FIGS. 19A to 25D.

Next, as shown in FIGS. 64A to 64D, an extra metal layer 21 is etched to form a slit 33 in the extra metal layer 21. The slit 33 is similar to the slit 33 shown in FIGS. 52A to 52D. The slit 33 extends in the same direction as that of, e.g., a bit line 13-1 and serves as an isolation region for sequentially isolating the intracell local interconnection 21-1 to be formed later along the direction in which, e.g., a read word line 4 extends.

As shown in FIGS. 65A to 65D, an insulating material, e.g., SiO$_2$ is deposited on the structure shown in FIGS. 64A to 64D to form a sixth dielectric interlayer 22. An opening that reaches an intra-peripheral-circuit via 13-3 is formed in the sixth dielectric interlayer 22 and fifth dielectric interlayer 19. The opening is filled with a conductive material, e.g., a metal such as tungsten to form a third metal layer—second metal layer contact 23.

As shown in FIGS. 66A to 66D, a conductive material, e.g., AlCu or Cu is deposited on the structure shown in FIGS. 65A to 65D to form a third metal layer 24. Next, a conductive yoke material is deposited on the third metal layer 24 to form a conductive yoke layer 27. As a material of the conductive yoke layer 27, for example, an Ni—Fe alloy, Co—Fe—Ni alloy, Co—(Zr, Hf, Nb, Ta, Ti) film, or (Co, Fe, Ni)—(Si, B)—(P, Al, Mo, Nb, Mn)-based amorphous material can be used.

As shown in FIGS. 67A to 67D, the conductive yoke layer 27, third metal layer 24, sixth dielectric interlayer 22, and extra metal layer 21 are etched using a mask material (not shown) corresponding to the write word line pattern and intra-peripheral-circuit interconnection pattern as a mask. In addition, the fifth dielectric interlayer 19 is etched halfway. With this process, the write word line 24-1, the intra-peripheral-circuit interconnection 24-2, and the intracell local interconnection 21-1 are formed.

As shown in FIGS. 68A to 68D, an insulating material, e.g., SiO$_2$ is deposited on the structure shown in FIGS. 67A to 67D to form an insulation layer 36. The insulation layer 36 is anisotropically etched using anisotropic etching, e.g., reactive ion etching (RIE) to leave the insulation layer 36 on the side surfaces of the write word line 24-1, intra-peripheral-circuit interconnection 24-2, sixth dielectric interlayer 22, intracell local interconnection 21-1, and fifth dielectric interlayer 19. A portion of the side surface of the conductive yoke layer 27 is exposed.

Next, as shown in FIGS. 69A to 69D, a conductive yoke material is deposited on the structure shown in FIGS. 68A to 68D to form the conductive yoke layer 28. As a material of the conductive yoke layer 28, for example, an Ni—Fe alloy, Co—Fe—Ni alloy, Co—(Zr, Hf, Nb, Ta, Ti) film, or (Co, Fe, Ni)—(Si, B)—(P, Al, Mo, Nb, Mn)-based amorphous material can be used, like the conductive yoke layer 27. The conductive yoke layer 28 is anisotropically etched using anisotropic etching, e.g., reactive ion etching (RIE) to leave the conductive yoke layer 28 on the side surfaces of the conductive yoke layer 27 and the insulation layer 36.

In the magnetic random access memory thus formed, even when the yoke layer formed on the side wall of the write word line 24-1 is formed using a conductive yoke material, the intracell local interconnection 21-1 can be patterned and formed simultaneously with the write word line 24-1. For this reason, the intracell local interconnection 21-1 can have the same width as that of the write word line 24-1, and the resistance value of the intracell local interconnection 21-1 can advantageously be decreased.

EXAMPLE OF MAGNETORESISTIVE ELEMENT

First Example

As described in the first to fifth embodiments, an MTJ element can be used as a magnetoresistive element. Several examples of an MTJ element will be described below.

Figure 70A:
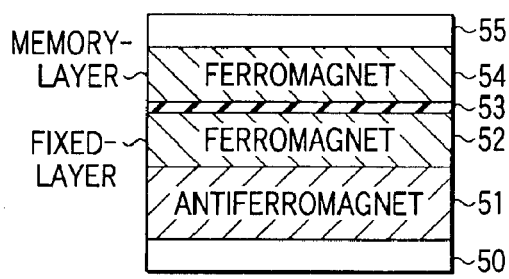
FIG. 70A is a sectional view showing a MTJ element according to a first example.

FIG. 70A is a sectional view showing the first example of an MTJ element.

As shown in FIG. 70A, an antiferromagnetic layer 51, ferromagnetic layer 52, tunnel barrier layer 53, ferromagnetic layer 54, and protective layer 55 are sequentially formed on an underlying layer 50.

In this example, the ferromagnetic layer 52 functions as a fixed-layer in which the direction of spin is fixed. The ferromagnetic layer 54 functions as a memory-layer in which the direction of spin can be changed. The antiferromagnetic layer 51 fixes the direction of spin in the ferromagnetic layer 52. The direction of spin in the ferromagnetic layer 52 which functions as a fixed-layer, as in this example, may be fixed using, e.g., the antiferromagnetic layer 51.

The underlying layer 50 makes it possible to easily form, e.g., the ferromagnetic layer or antiferromagnetic layer or protect the layer and is formed as needed. The protective layer 55 protects, e.g., the ferromagnetic layer or antiferromagnetic layer. The protective layer 55 is also formed, as needed, like the underlying layer 50. Matters about the underlying layer 50 and protective layer 55 also apply to the second to fourth examples to be described below.

Examples of the material of the ferromagnetic layer 52 or 54 are as follows.

Fe, Co, Ni, or an alloy thereof

Magnetite with high spin polarization ratio

An oxide such as $CrO_2$ or $RXMnO_3$-y (R: rare earth. X: Ca, Ba, Sr)

Heusler alloy such as NiMnSb or PtMnSb

The ferromagnetic material 52 or 54 may contain a nonmagnetic element within a range in which the ferromagnetism is not lost.

Examples of a nonmagnetic element are as follows.

Ag, Cu, Au, Al, Mg, Si, Bi, Ta, B, C, O, N, Pd, Pt, Zr, Ir, W, Mo, and Nb

The ferromagnetic layer 52 or 54 has such a thickness that the ferromagnetic layer 52 or 54 does not become superparamagnetic. More specifically, the ferromagnetic layer 52 or 54 is formed to a thickness of 0.4 nm or more. The thickness of the ferromagnetic layer 52 or 54 has no particular upper limit. However, the thickness of the ferromagnetic layer 52 or 54 is preferably, e.g., 100 nm or less from the viewpoint of formation of the MTJ element.

Examples of the material of the antiferromagnetic layer 51 are as follows.

Fe—Mn, Pt—Mn, Pt—Cr—Mn, Ni—Mn, Ir—Mn, NiO, and $Fe_2O_3$

Examples of the material of the tunnel barrier layer 53 are as follows.

$Al_2O_3$, $SiO_2$, MgO, AlN, $Bi_2O_3$, $MgF_2$, $CaF_2$, $SrTiO_2$, and $AlLaO_3$ The material of the tunnel barrier layer 53 may contain at least one of oxygen, nitrogen, and fluorine within a range in which the tunnel barrier layer 53 does not lose, e.g., the insulting properties. Alternatively, at least one of oxygen, nitrogen, and fluorine may be omitted within a range in which the tunnel barrier layer 53 does not lose, e.g., the insulting properties.

The thickness of the tunnel barrier layer 53 is preferably as much as small but is not particularly limited. For example, the thickness of the tunnel barrier layer 53 is set to 10 nm or less from the viewpoint of formation of the MTJ element.

Second Example

Figure 70B:
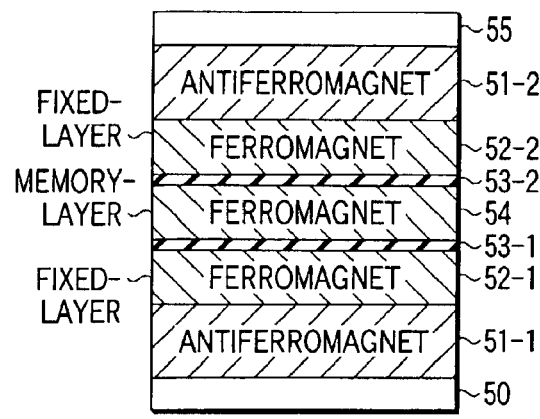
FIG. 70B is a sectional view showing a MTJ element according to a second example.

FIG. 70B is a sectional view showing the second example of an MTJ element.

The MTJ element of the second example is an MTJ element called a double-junction type.

As shown in FIG. 70B, an antiferromagnetic layer 51-1, ferromagnetic layer 52-1, tunnel barrier layer 53-1, ferromagnetic layer 54, tunnel barrier layer 53-2, ferromagnetic layer 52-2, antiferromagnetic layer 51-2, and protective layer 55 are sequentially formed on an underlying layer 50.

In this example, the ferromagnetic layers 52-1 and 52-2 function as fixed-layers. The ferromagnetic layer 54 functions as a memory-layer. The antiferromagnetic layer 51-1 fixes the direction of spin in the ferromagnetic layer 52-1. The antiferromagnetic layer 51-2 fixes the direction of spin in the ferromagnetic layer 52-2.

The double-junction-type MTJ element as in this example can increase the ratio of a resistance value in a low resistance mode to that in a high resistance mode, i.e., so-called MR ratio (Magneto-Resistance ratio) as compared to, e.g., the MTJ element (single-junction-type) shown in FIG. 70A.

Examples of the materials of the antiferromagnetic layers 51-1 and 51-2, ferromagnetic layers 52-1, 52-2, and 54, and tunnel barrier layers 53-1 and 53-2 are the same as described in the first example.

Examples of the thicknesses of the ferromagnetic layers 52-1, 52-2, and 54 are the same as described in the first example.

Examples of the materials and thicknesses of the tunnel barrier layers 53-1 and 53-2 are the same as described in the first example.

Third Example

Figure 70C:
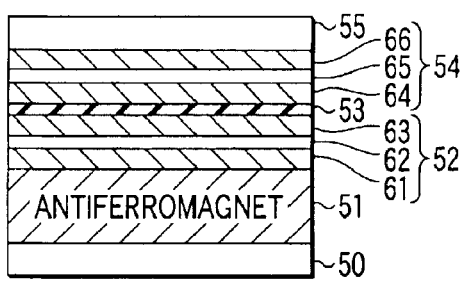
FIG. 70C is a sectional view showing a MTJ element according to a third example.

FIG. 70C is a sectional view showing the third example of an MTJ element.

As shown in FIG. 70C, in the MTJ element of the third example, each of ferromagnetic layers 52 and 54 in the MTJ element of the first example has a stack structure of a ferromagnetic layer and nonmagnetic layer. An example of the stack structure is a three-layered structure of ferromagnetic layer/nonmagnetic layer/ferromagnetic layer. In this example, the ferromagnetic layer 52 has a three-layered structure of ferromagnetic layer 61/nonmagnetic layer 62/ferromagnetic layer 63. The ferromagnetic layer 54 has a three-layered structure of ferromagnetic layer 64/nonmagnetic layer 65/ferromagnetic layer 66.

Examples of the material of the ferromagnetic layers 61, 63, 64, and 66 are the same as described in the first example.

Examples of the material of the nonmagnetic layers 62 and 65 are as follows.

Ru, Ir

Detailed examples of the three-layered structure of ferromagnetic layer/nonmagnetic layer/ferromagnetic layer are as follows.

Co/Ru/Co, Co/Ir/Co

Co—Fe/Ru/Co—Fe, Co—Fe/Ir/Co—Fe

When the ferromagnetic layer 52 that functions as a fixed-layer has a stack structure, e.g., a three-layered structure of ferromagnetic layer 61/nonmagnetic layer 62/ferromagnetic layer 63, antiferromagnetic bond is preferably generated between the ferromagnetic layer 61 and the ferromagnetic layer 63 through the nonmagnetic layer 62. In addition, an antiferromagnetic layer 51 is formed in contact with the three-layered structure. With this structure, the direction of spin in the ferromagnetic layer 52 and, more particularly, the ferromagnetic layer 63 functioning as a fixed-layer can be more firmly fixed. With this advantage, the ferromagnetic layer 52 and, more particularly, the ferromagnetic layer 63 is hardly affected by the current field. Hence, any unexpected reversal of the direction of spin in the ferromagnetic layer 52 that function as a fixed-layer can be suppressed.

Even when the ferromagnetic layer 54 that functions as a memory-layer has a stack structure, e.g., a three-layered structure of ferromagnetic layer 64/nonmagnetic layer 65/ferromagnetic layer 66, antiferromagnetic bond is preferably generated between the ferromagnetic layer 64 and the ferromagnetic layer 66 through the nonmagnetic layer 65. In this case, since the magnetic flux closes in the three-layered structure, any increase in switching field due to, e.g., the magnetic pole can be suppressed. As a result, even when the size of a memory cell or the size of an MTJ element is less than the submicron order, any increase in power consumption due to a current field by a diamagnetic field can advantageously be suppressed.

The ferromagnetic layer 54 that functions as a memory-layer may have a stack structure of a soft ferromagnetic layer and a ferromagnetic layer. A soft ferromagnetic layer means a layer whose direction of spin is more readily reversed as compared to, e.g., a ferromagnetic layer.

When the ferromagnetic layer 54 has a stack structure of a soft ferromagnetic layer and a ferromagnetic layer, the soft ferromagnetic layer is arranged on a side close to a current field line, e.g., a bit line.

This stack structure may also include a nonmagnetic layer. For example, as in this example, when a three-layered structure of ferromagnetic layer 64/nonmagnetic layer 65/ferromagnetic layer 66 is formed, e.g., the ferromagnetic layer 66 may be formed as a soft ferromagnetic layer.

In this example, the ferromagnetic layers 52 and 54 have stack structures, respectively. However, only the ferromagnetic layer 52 or ferromagnetic layer 54 may have a stack structure.

Fourth Example

Figure 70D:
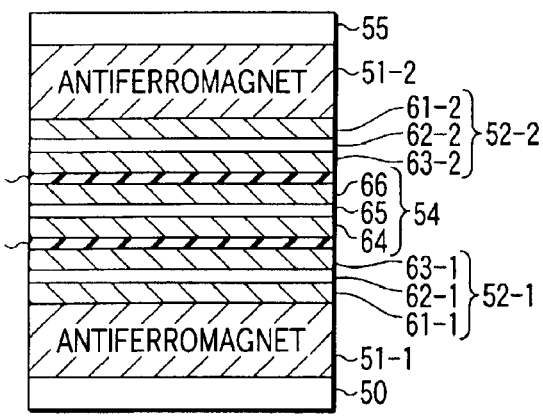
FIG. 70D is a sectional view showing a MTJ element according to a fourth example.

FIG. 70D is a sectional view showing the fourth example of an MTJ element.

As shown in FIG. 70D, in the MTJ element of the fourth example, each of ferromagnetic layers 52-1, 54, and 52-2 of the MTJ element of the second example has a stack structure described in the third example.

In this example, the ferromagnetic layer 52-1 has a three-layered structure of ferromagnetic layer 61-1/nonmagnetic layer 62-1/ferromagnetic layer 63-1. The ferromagnetic layer 54 has a three-layered structure of ferromagnetic layer 64/nonmagnetic layer 65/ferromagnetic layer 66. The ferromagnetic layer 52-2 has a three-layered structure of ferromagnetic layer 61-2/nonmagnetic layer 62-2/ferromagnetic layer 63-2.

Examples of the material of the ferromagnetic layers 61-1, 61-2, 63-1, 63-2, 64, and 66 are the same as described in the first example.

Examples of the material of the nonmagnetic layers 62-1, 62-2, and 65 are the same as described in the third example.

In this example, all the ferromagnetic layers 52-1, 54, and 52-2 have stack structures, respectively. However, only one of them may have a stack structure.

[Effects Obtained from Second to Fifth Embodiments]

In the second to fifth embodiments, a yoke layer that covers, e.g., at least the side surface of the write word line 24-1 and the side surface of the MTJ element 18 is arranged. Hence, as compared to a case wherein no yoke layer is formed, the magnetic field from the write word line 24-1 can be efficiently applied to the MTJ element 18.

In addition, an adjacent unselected MTJ element 18 is hard to be influenced by the magnetic field from the selected write word line 24-1. For this reason, the reliability related to, e.g., a data write can be improved.

Furthermore, according to the second to fifth embodiments, the following effects can be obtained as compared to a reference example.

Figure 71A:
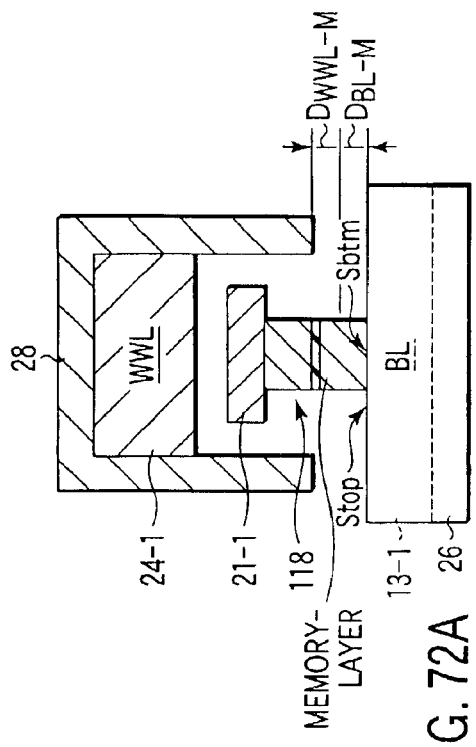
FIGS. 71A and 71B are side views showing a magnetic random access memory according to a reference embodiment of the present invention.
Figure 71B:
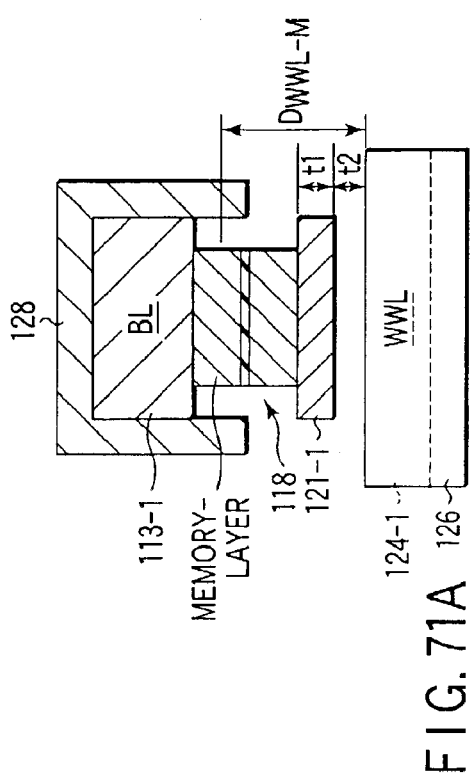

FIGS. 71A and 71B are side views of a magnetic random access memory of the reference example.

Figure 73:
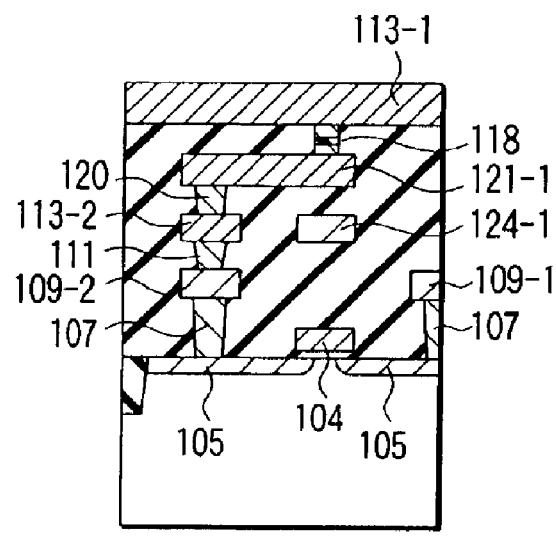
FIG. 73 is a sectional view showing a typical magnetic random access memory.
Figure 74:
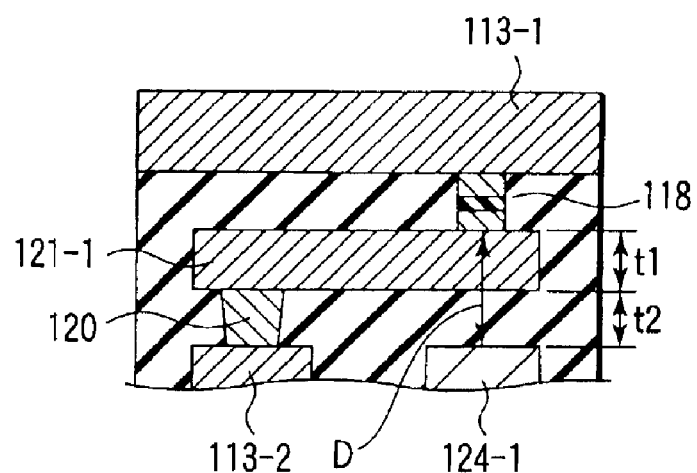
FIG. 74 is a sectional view for explaining the first problem of the typical magnetic random access memory.
Figure 75A:
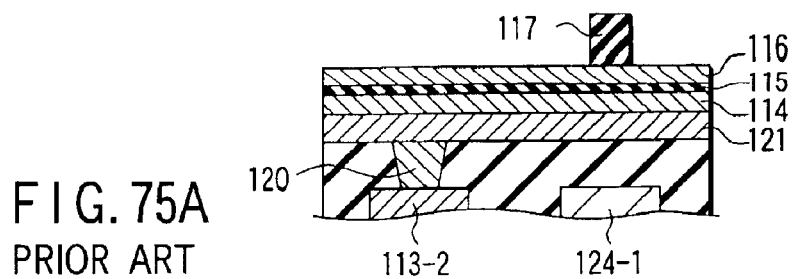
FIGS. 75A, 75B, and 75C are sectional views for explaining the second problem of the typical magnetic random access memory.
Figure 75B:
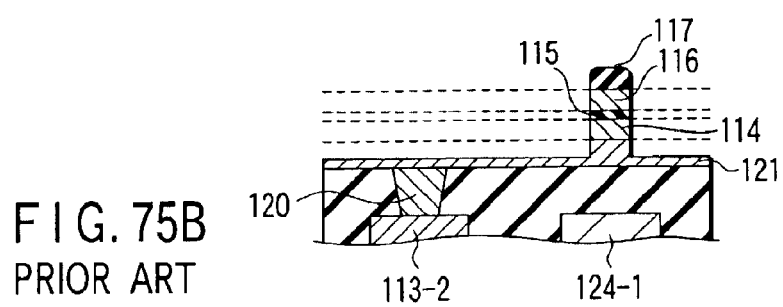
Figure 75C:
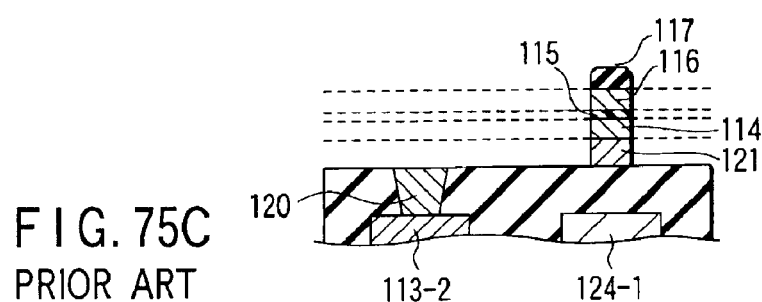
Figure 76:
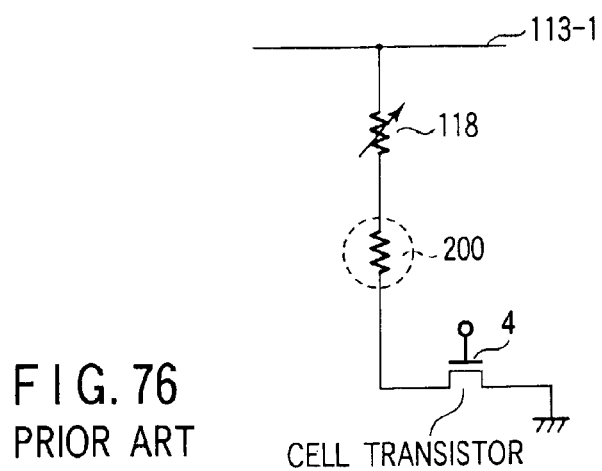
FIG. 76 is an equivalent circuit diagram for explaining the third problem of the typical magnetic random access memory.

In this reference example, yoke layers are formed in, e.g., the magnetic random access memory shown in FIG. 73, as shown in FIGS. 71A and 71B. In this reference example, the yoke layers include a conductive yoke layer 126 that covers the lower and side surfaces of a write word line 124-1 and a conductive yoke layer 128 that covers the upper and side surfaces of a bit line 113-1 and the side surface of an MTJ element 118.

In the magnetic random access memory shown in FIG. 73, an intracell local interconnection 121-1 is formed above the write word line 124-1. For this reason, a thickness t1 of the intracell local interconnection 121-1 and a thickness t2 of a dielectric interlayer which insulates the intracell local interconnection 121-1 from the write word line 124-1 are added between the MTJ element 118 and the write word line 124-1.

When the yoke layer 128 is formed for such a magnetic random access memory, the distance from the memory-layer of the MTJ element 118 to the yoke layer 128 decreases. However, a distance $D_{WWL-M}$ from the memory-layer of the MTJ element 118 to the yoke layer 126 increases.

Figure 72A:
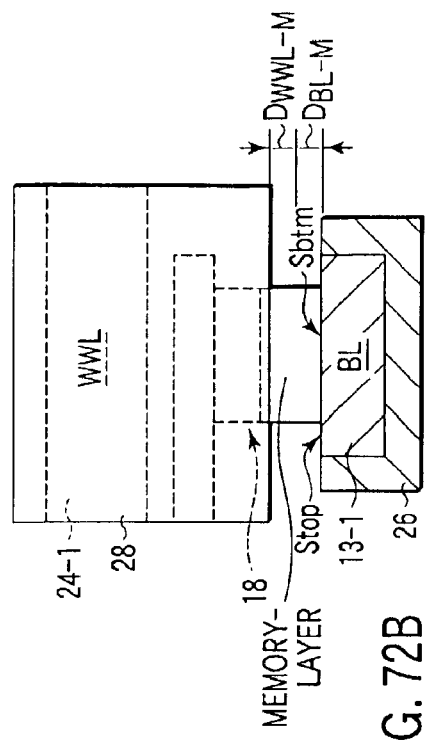
FIGS. 72A and 72B are side views showing a magnetic random access memory according to the second to fifth embodiment of the present invention.
Figure 72B:
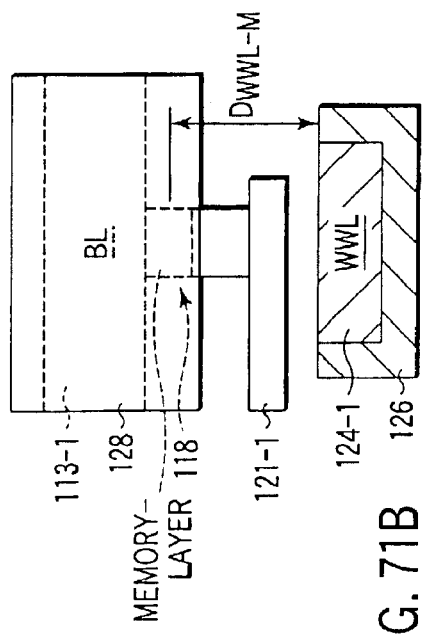

FIGS. 72A and 72B are side views of a magnetic random access memory according to the second to fifth embodiments.

As shown in FIGS. 72A and 72B, in the magnetic random access memory according to the second to fifth embodiments, an intracell local interconnection 21-1 is formed below a write word line 24-1. An MTJ element 18 is formed on a bit line 13-1. More specifically, the bit line 13-1 is arranged under the MTJ element 18. In addition, an upper surface Stop of the bit line 13-1 is flush with a lower surface Sbtm of the MTJ element 18. For this reason, it is only necessary to set an insulating distance Diso between a yoke layer 28 which covers the upper and side surfaces of the write word line 24-1 and the side surface of the MTJ element 18 and a conductive yoke layer 26 which covers the bottom and side surfaces of the bit line 13-1.

Hence, in the magnetic random access memory according to the second to fifth embodiments, the memory-layer of the MTJ element 18 can be made closer to the yoke layer 26, as compared to the reference example.

In addition, in the magnetic random access memory according to the second to fifth embodiments, the distance $D_{BL-M}$ from the memory-layer of the MTJ element 18 to the yoke layer 26 and the distance $D_{WWL-M}$ from the memory-layer of the MTJ element 18 to the yoke layer 28 can substantially equal. When the distances $D_{BL-M}$ and $D_{WWL-M}$ can substantially equal, the magnetic field generated from the yoke layer 26 and that generated from the yoke layer 28 can be uniformly applied to the memory-layer. For this reason, for example, the magnetic field from the write word line 24-1 and the magnetic field from the bit line 13-1 can be more efficiently applied to the MTJ element 18, as compared to the reference example.

In addition, as compared to the reference example, an adjacent unselected MTJ element 18 is hard to be influenced by the magnetic field from the selected write word line 24-1. For this reason, the reliability related to, e.g., a data write can be further improved.

The first to fifth embodiments of the present invention have been described above. However, the present invention is not limited to these embodiments, and various changes and modifications can be made without departing from the sprit and scope of the present invention.

The embodiments can be independently practiced but they may be appropriately combined.

The embodiments incorporate inventions of various phases, and the inventions of various phases can be extracted by appropriately combining a plurality of components disclosed in the embodiments.

In the above embodiments, the description has been done on the basis of examples in which present invention is applied to a magnetic random access memory. However, the present invention also incorporates a semiconductor integrated circuit device incorporating the above-described magnetic random access memory, e.g., a processor or system LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a cell transistor;
   a bit line provided above the cell transistor;
   a magnetoresistive element provided above the bit line, a first end portion of the magnetoresistive element being electrically connected to the bit line;
   an intracell local interconnection provided above the magnetoresistive element, the intracell local interconnection coupling one of source and drain regions of the cell transistor to a second end portion of the magnetoresistive element; and
   a write word line provided above the intracell local interconnection, a portion between the write word line and the intracell local interconnection being filled with an insulator alone.

2. The device according to claim 1, further comprising:
   a first via electrically connected to the intracell local interconnection and the one of source and drain regions of the cell transistor, the first via provided from a same conductive layer as that of the bit line.

3. The device according to claim 2, further comprising:
   a source line electrically connected to the other of source and drain regions of the cell transistor; and
   a second via electrically connected to the first via and the one of source and drain regions of the cell transistor, the second via provided from a same conductive layer as that of the source line.

4. The device according to claim 1, further comprising:
   a first yoke material that coven side surfaces of the write word line and extends below the write word line.

5. The device according to claim 4, wherein the first yoke material covers an upper surface of the write word line.

6. The device according to claim 5, wherein of the first yoke material, a portion coven the side surfaces of the write word line and extends below the word line is formed from an insulating material, and a portion that covers the upper surface of the write word line is formed from a conductive material.

7. The device according to claim 4, wherein the first yoke material is a conductor.

8. The device according to claim 7, further comprising:
   an insulation layer provided between the first yoke material and the intracell local interconnection.

9. The device according to claim 8, wherein a width of the intracell local interconnection is equal to a width of the write word line.

10. The device according to claim 4, wherein the first yoke material is an insulator.

11. The device according to claim 10, wherein the first yoke material is in contact with the intracell local interconnection.

12. The device according to claim 10, wherein a width of the intracell local interconnection is equal to a width of the write word line.

13. The device according to claim 4, further comprising:
    a second yoke material that covers bottom and side surfaces of the bit line.

14. The device according to claim 13, wherein the second yoke material is not in contact with the first yoke material.

15. The device according to claim 14, further comprising:
    a dielectric interlayer provided between the intracell local interconnection and the bit line, the dielectric interlayer having a portion sandwiched between the second yoke material and the first yoke material.

16. The device according to claim 15, wherein the dielectric interlayer includes a stopper layer containing an insulating material different from the dielectric interlayer, the stopper layer located on the bit line and sandwiched between the second yoke material and the first yoke material.

17. The device according to claim 1, wherein a bottom surface of the magnetoresistive element and an upper surface of the bit line are on the same level.

18. The device according to claim 1, wherein the magnetoresistive element is a tunneling magnetoresistive element.

19. A semiconductor integrated circuit device comprising:
    a cell transistor;
    a bit line provided above the cell transistor;
    a magnetoresistive element provided above the bit line, a first end portion of the magnetoresistive element being electrically connected to the bit line;
    an intracell local interconnection provided above the magnetoresistive element, the intracell local interconnection coupling one of source and drain regions of the cell transistor to a second end portion of the magnetoresistive element; and
    a write word line provided above the intracell local interconnection, the write word line entirely covering a top surface of the intracell local interconnection.

* * * * *